(12) United States Patent
Amano

(10) Patent No.: US 9,336,992 B2
(45) Date of Patent: May 10, 2016

(54) ION IMPLANTATION APPARATUS

(71) Applicant: Sumitomo Heavy Industries Ion Technology Co., Ltd., Tokyo (JP)

(72) Inventor: Yoshitaka Amano, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/746,277

(22) Filed: Jun. 22, 2015

(65) Prior Publication Data

US 2015/0371822 A1 Dec. 24, 2015

(30) Foreign Application Priority Data

Jun. 23, 2014 (JP) ................. 2014-128519

(51) Int. Cl.
| | |
|---|---|
| *H01J 37/00* | (2006.01) |
| *H01J 37/317* | (2006.01) |
| *H01J 37/10* | (2006.01) |
| *H01J 37/244* | (2006.01) |

(52) U.S. Cl.
CPC ............. *H01J 37/3171* (2013.01); *H01J 37/10* (2013.01); *H01J 37/244* (2013.01)

(58) Field of Classification Search
CPC ...... H01J 37/3171; H01J 37/244; H01J 37/10
USPC ................. 250/396 R, 492.1–492.3
See application file for complete search history.

(56) References Cited

U.S. PATENT DOCUMENTS

| | | | |
|---|---|---|---|
| 5,177,366 A | 1/1993 | King et al. | |
| 6,774,377 B1 * | 8/2004 | Rathmell | H01J 37/12 |
| | | | 250/396 R |
| 7,112,809 B2 | 9/2006 | Rathmell et al. | |
| 7,394,079 B2 * | 7/2008 | Saadatmand | H01J 37/3007 |
| | | | 250/492.21 |
| 7,759,658 B2 | 7/2010 | Nakashima | |
| 2006/0113493 A1 * | 6/2006 | Kabasawa | H01J 27/024 |
| | | | 250/492.21 |
| 2008/0258074 A1 * | 10/2008 | Tsukihara | H01J 37/1477 |
| | | | 250/396 R |

FOREIGN PATENT DOCUMENTS

| | | |
|---|---|---|
| JP | S62-122045 A | 6/1987 |
| JP | H01-149960 A | 6/1989 |
| JP | 3302436 B2 | 7/2002 |
| JP | 2008-507112 A | 3/2008 |
| JP | 2009-252697 A | 10/2009 |
| JP | 4747876 B2 | 8/2011 |
| WO | WO-2006/014633 A2 | 2/2006 |

\* cited by examiner

*Primary Examiner* — Michael Maskell
(74) *Attorney, Agent, or Firm* — Michael Best & Friedrich LLP

(57) ABSTRACT

An ion implantation apparatus includes: a lens electrode unit including a plurality of electrode sections for parallelizing an ion beam; and a vacuum unit that houses the lens electrode unit in a vacuum environment. The vacuum unit includes: a first vacuum container having a first conductive container wall; a second vacuum container having a second conductive container wall; and an insulating container wall that allows the first vacuum container and the second vacuum container to communicate with each other and that insulates the first conductive container wall from the second conductive container wall. An insulating member is provided that insulates at least one electrode section of the lens electrode unit from at least one of the first conductive container wall and the second conductive container wall, and the insulating member is housed in the vacuum environment together with the lens electrode unit.

22 Claims, 24 Drawing Sheets

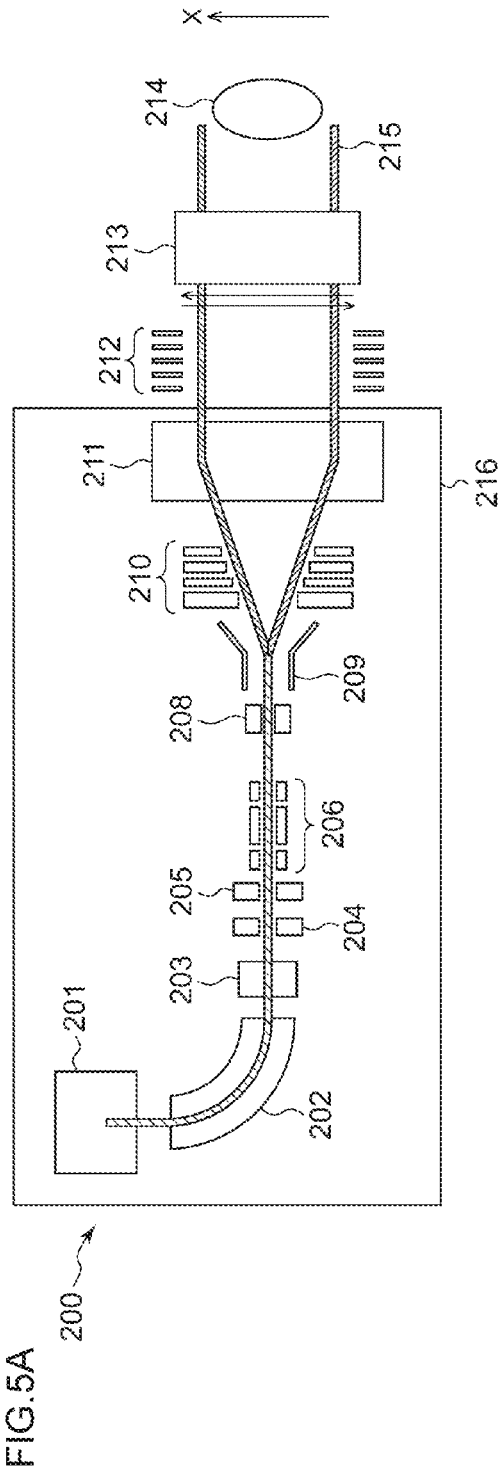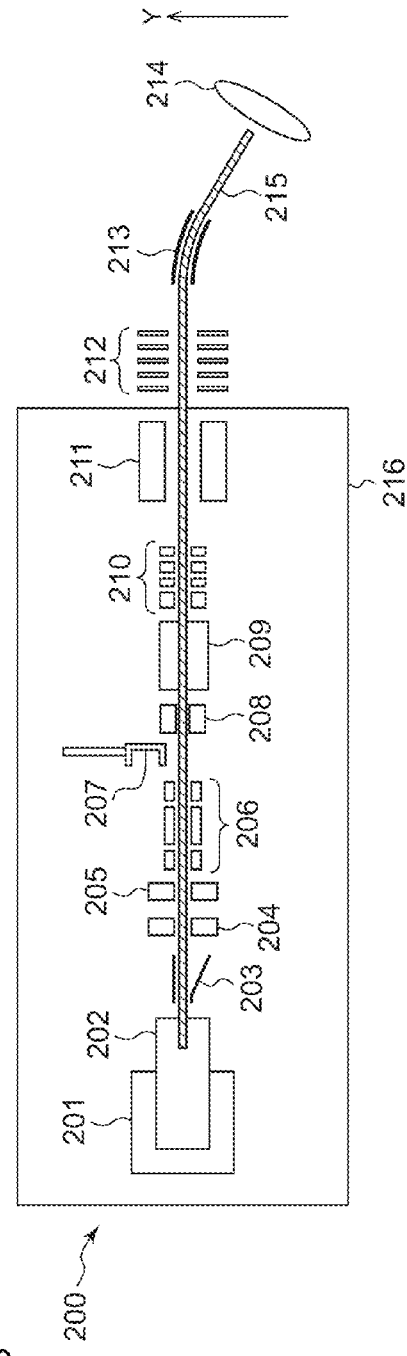

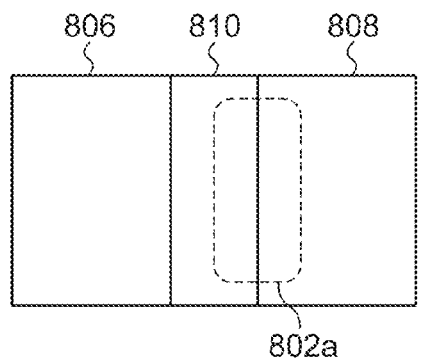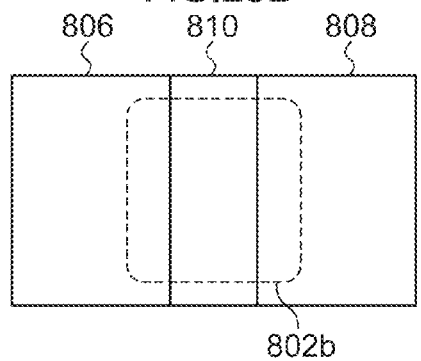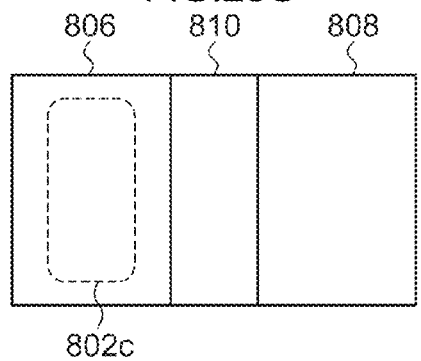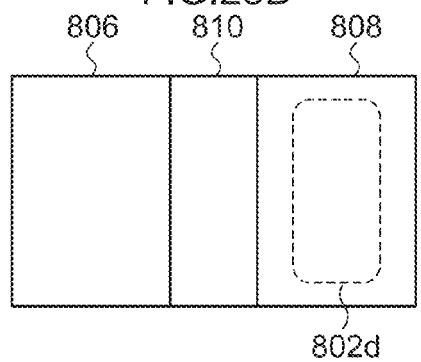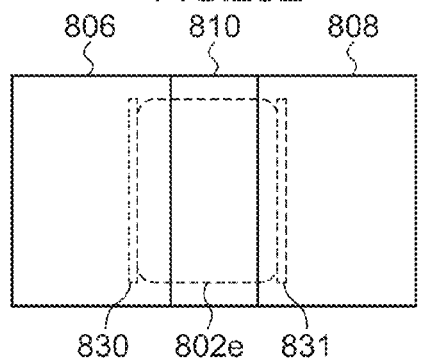

ION IMPLANTATION APPARATUS

RELATED APPLICATION

Priority is claimed to Japanese Patent Application No. 2014-128519, filed on Jun. 23, 2014, the entire content of which is incorporated herein by reference.

BACKGROUND OF THE INVENTION

1. Field of the Invention

The present invention relates to an ion implantation, and more particularly to an ion implantation apparatus and an ion implantation method.

2. Description of the Related Art

In a certain ion implantation apparatus, an ion source is connected to a power supply thereof such that anion beam having a small amount of beam current is extracted from the ion source. In this apparatus, the connection between the ion source and the power supply may be modified such that an ion beam having a large amount of beam current is extracted from the ion source.

Another ion implantation apparatus includes an ion source, an acceleration tube, and an electric circuit connecting power supplies thereof, so as to implant ions into a target at high ion energy. The electric circuit is provided with a selector switch for switching the connection so as to implant ions at low ion energy.

Attempts to extend the operating range of the ion implantation apparatus to some degree have been made as described above. However, a realistic proposal to the extension of the operating range beyond the existing categories is rare.

Generally, ion implantation apparatuses are classified into three categories: a high-current ion implantation apparatus, a medium-current ion implantation apparatus, and a high energy ion implantation apparatus. Since practical design requirements are different for each category, an apparatus of one category and an apparatus of another category may have significantly different configurations in, for example, beam-line. Therefore, in the use of the ion implantation apparatus (for example, in a semiconductor manufacturing process), it is considered that apparatuses of different categories have no compatibility. That is, for particular ion implantation processing, an apparatus of a particular category is selected and used. Therefore, for a variety of ion implantation processing, it is necessary to own various types of ion implantation apparatuses.

SUMMARY OF THE INVENTION

An exemplary object of an aspect of the present invention is to provide an ion implantation apparatus and an ion implantation method which can be used in a wide range, for example, an ion implantation apparatus which can serve as both a high-current ion implantation apparatus and a medium-current ion implantation apparatus, and an ion implantation method.

According to one embodiment of the present invention, an ion implantation apparatus is provided that includes: a lens electrode unit that includes a plurality of electrode sections for parallelizing an ion beam; and a vacuum unit that houses the lens electrode unit in a vacuum environment, wherein the vacuum unit includes: a first vacuum container having a first conductive container wall; a second vacuum container having a second conductive container wall; and an insulating container wall that connects the first vacuum container to the second vacuum container such that the first vacuum container and the second vacuum container communicate with each other and the first conductive container wall is insulated from the second conductive container wall, wherein the ion implantation apparatus further includes an insulating member that insulates at least one electrode section among the plurality of the electrode sections from at least one of the first conductive container wall and the second conductive container wall, and wherein the insulating member is housed in the vacuum environment together with the lens electrode unit.

Also, while arbitrary combinations of the above components or the components or representations of the present invention are mutually substituted among methods, apparatuses, systems, and programs, these are also effective as the aspects of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 5A is a plan view illustrating a schematic configuration of an ion implantation apparatus according to an embodiment of the present invention, and FIG. 5B is a side view illustrating a schematic configuration of an ion implantation apparatus according to an embodiment of the present invention;

FIG. 23A, FIG. 23B, FIG. 23C, and FIG. 23D are each a schematic top view of a beam parallelizing unit according to an embodiment of the present invention, and FIG. 23E is a schematic top view of one exemplary beam parallelizing unit;

DETAILED DESCRIPTION OF THE INVENTION

Figure 1:
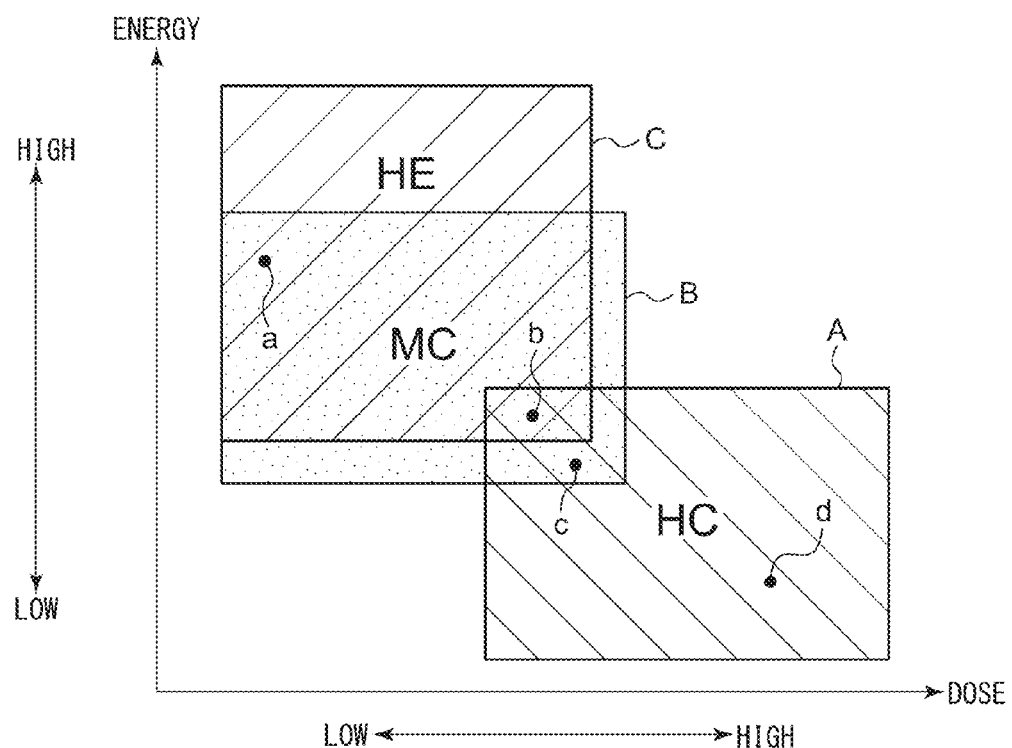
FIG. 1 is a diagram schematically illustrating ranges of an energy and a dose amount in several types of typical ion implantation apparatuses.

The invention will now be described by reference to the preferred embodiments. This does not intend to limit the scope of the present invention, but to exemplify the invention.

Hereinafter, embodiments of the present invention will be described in detail with reference to the drawings. Also, in the description of the drawings, the same reference numerals are assigned to the same components, and a redundant description thereof is appropriately omitted. Also, the configurations described below are exemplary, and do not limit the scope of the present invention. For example, in the following, a semiconductor wafer is described as an example of an object to which an ion implantation is performed, but other materials or members may also be used.

First, a description will be given of circumstances that led to an embodiment of the present invention to be described below. An ion implantation apparatus can select an ion species to be implanted and set an energy and a dose amount thereof, based on desired properties to be established within a workpiece. Generally, ion implantation apparatuses are classified into several categories according to the ranges of energy and dose amount of ions to be implanted. As representative categories, there are a high-dose high-current ion implantation apparatus (hereinafter, referred to as HC), a medium-dose medium-current ion implantation apparatus (hereinafter, referred to as MC), and a high energy ion implantation apparatus (hereinafter, referred to as HE).

FIG. 1 schematically illustrates the energy ranges and the dose ranges of a typical serial-type high-dose high-current ion implantation apparatus HC, a serial-type medium-dose medium-current ion implantation apparatus MC, and a serial-type high energy ion implantation apparatus HE. In FIG. 1, a horizontal axis represents the dose, and a vertical axis represents the energy. The dose is the number of ions (atoms) implanted per unit area (for example, $cm^2$), and the total amount of implanted material is provided by a time integral of ion current. The ion current provided by the ion implantation is generally expressed as mA or μA. The dose is also referred to as an implantation amount or a dose amount. In FIG. 1, the energy and dose ranges of the HC, the MC, and the HE are indicated by symbols A, B, and C, respectively. These are a set range of implantation conditions required according to implantation conditions (also called a recipe) for each implantation, and represent practically reasonable apparatus configuration categories matched with the implantation conditions (recipe), considering practically allowable productivity. Each of the illustrated ranges represents an implantation condition (recipe) range that can be processed by the apparatus of each category. The dose amount represents an approximate value when a realistic processing time is assumed.

The HC is used for ion implantation in a relatively low energy range of about 0.1 to 100 keV and in a high dose range of about $1 \times 10^{14}$ to $1 \times 10^{17}$ atoms/$cm^2$. The MC is used for ion implantation in a medium energy range of about 3 to 500 keV and in a medium dose range of about $1 \times 10^{11}$ to $1 \times 10^{14}$ atoms/$cm^2$. The HE is used for ion implantation in a relatively high energy range of about 100 keV to 5 MeV and in a relatively low dose range of about $1 \times 10^{10}$ to $1 \times 10^{13}$ atoms/$cm^2$. In this way, the broad ranges of the implantation conditions having about five digits for the energy range and about seven digits for the dose ranges are shared by the HC, the MC, and the HE. However, these energy ranges or dose ranges area representative example, and are not strict. Also, the way of providing the implantation conditions is not limited to the dose and the energy, but is various. The implantation conditions may be set by a beam current value (representing an area integral beam amount of a beam cross-sectional profile by a current), a throughput, implantation uniformity, and the like.

Since the implantation conditions for ion implantation processing include particular values of energy and dose, the implantation conditions can be expressed as individual points in FIG. 1. For example, an implantation condition a has values of a high energy and a low dose. The implantation condition a is in the operating range of the MC and is also in the operating range of the HE. The ion implantation can be processed accordingly using the MC or the HE. An implantation condition b is a medium energy/dose and the ion implantation can be processed by one of the HC, MC, and HE. An implantation condition c is a medium energy/dose and the ion implantation can be processed by the HC or the MC. An implantation condition d is a low energy/a high dose and can be processed by only the HC.

The ion implantation apparatus is an equipment essential to the production of semiconductor devices, and the improvement of performance and productivity thereof has an important meaning to a device maker. The device maker selects an apparatus, which is capable of realizing implantation characteristics necessary for a device to be manufactured, among a plurality of ion implantation apparatus categories. At this time, the device maker determines the number of apparatuses of the category, considering various circumstances such as the realization of the best manufacturing efficiency, the cost of ownership of the apparatus, and the like.

It is assumed that an apparatus of a certain category is used at a high operating rate and an apparatus of another category has a relatively sufficient processing capacity. At this time, if the former apparatus cannot be replaced with the latter apparatus in order to obtain a desired device because implantation characteristics are strictly different for each category, the failure of the former apparatus cause a bottleneck on production processes, and thus overall productivity is impaired. Such trouble may be avoided to some extent by assuming a failure rate and the like in advance and determining a number configuration based on that.

When a manufacturing device is changed due to a change in demand or a technical advance and the number configuration of necessary apparatuses is changed, apparatuses become lacking or a non-operating apparatus occurs and thus an operating efficiency of the apparatuses may be reduced. Such trouble may be avoided to some extent by predicting the trend of future products and reflecting the predicted trend to the number configuration.

Even though the apparatus can be replaced with an apparatus of another category, the failure of the apparatus or the change of the manufacturing device may reduce the production efficiency or lead to wasted investment for the device maker. For example, in some cases, a manufacturing process having been mainly processed till now by a medium-current ion implantation apparatus is processed by a high-current ion implantation apparatus due to the change of the manufacturing device. If doing so, the processing capacity of the high-current ion implantation apparatus becomes lacking, and the processing capacity of the medium-current ion implantation apparatus becomes surplus. If it is expected that the state after the change will not change for a long period of time, the operating efficiency of the apparatus can be improved by taking measures of purchasing a new high-current ion implantation apparatus and selling the medium-current ion implantation apparatus having been owned. However, when a process is frequently changed, or such a change is difficult to predict, a trouble may be caused in production.

In practice, a process having already been performed in an ion implantation apparatus of a certain category in order to manufacture a certain device cannot be immediately used in an ion implantation apparatus of another category. This is because a process of matching device characteristics on the ion implantation apparatus is required. That is, device characteristics obtained by performing a process with the same ion species, energy, and dose amount in the new ion implantation apparatus may be significantly different from device characteristics obtained in the previous ion implantation apparatus. Various conditions other than the ion species, the energy, and the dose amount, for example, a beam current density (that is, a dose rate), an implantation angle, or an overspray method of an implantation region, also affect the device characteristics. Generally, when the categories are different, apparatus configurations also are different. Therefore, even though the ion species, the energy, and the dose amount are specified, it is impossible to automatically match the other conditions affecting the device characteristics. These conditions depend on implantation methods. Examples of the implantation methods include a method of relative movement between a beam and a workpiece (for example, a scanning beam, a ribbon beam, a two-dimensional wafer scanning, or the like), a batch type and a serial type to be described below.

In addition, rough classification of the high-dose high-current ion implantation apparatus and the high energy ion implantation apparatus into a batch type and the medium-dose medium-current ion implantation apparatus into a serial type also increases a difference between the apparatuses. The batch type is a method of processing a plurality of wafers at one time, and these wafers are disposed on, for example, the circumference. The serial type is a method of processing wafers one by one and is also called a single wafer type. Also, in some cases, the high-dose high-current ion implantation apparatus and the high energy ion implantation apparatus are configured as the serial type.

Also, a beamline of the batch-type high-dose high-current ion implantation apparatus is typically made shorter than that of the serial-type medium-dose medium-current ion implantation apparatus by a request on beamline design according to high-dose high-current beam characteristics. This is done for suppressing beam loss caused by divergence of ion beams in a low energy/high beam current condition in the design of the high-dose high-current beamline. In particular, this is done for reducing a tendency to expand outward in a radial direction, so-called a beam blow-up, because ions forming the beam include charged particles repelling each other. The necessity for such design is more remarkable when the high-dose high-current ion implantation apparatus is the batch type than when that is the serial type.

The beamline of the serial-type medium-dose medium-current ion implantation apparatus is made relatively long for ion beam acceleration or beam forming. In the serial-type medium-dose medium-current ion implantation apparatus, ions having considerable momentum are moving at high speed. The momentum of the ions increases while the ions pass through one or several of acceleration gaps added to the beamline. Also, in order to modify a trajectory of particles having considerable momentum, a focusing portion needs to be relatively long enough to fully apply a focusing power.

Since the high energy ion implantation apparatus adopts a linear acceleration method or a tandem acceleration method, it is essentially different from an acceleration method of the high-dose high-current ion implantation apparatus or the medium-dose medium-current ion implantation apparatus. This essential difference is equally applied when the high energy ion implantation apparatus is the serial type or the batch type.

As such, the ion implantation apparatuses HC, MC and HE are recognized as completely different apparatuses because the beamline types or the implantation methods are different according to categories. A difference in configuration between apparatuses of different categories is recognized as inevitable. Among the different types of apparatuses such as HC, MC and HE, process compatibility considering the influence on the device characteristics is not guaranteed.

Therefore, it is preferable that the ion implantation apparatus has a broader energy range and/or dose range than the apparatus of the existing category. In particular, it is desirable to provide an ion implantation apparatus capable of implantation in a broad range of energy and dose amount including at least two existing categories, without changing the type of the implantation apparatus.

Also, in recent years, the mainstream is that all implantation apparatuses adopt the serial type. It is therefore desirable to provide an ion implantation apparatus that has a serial-type configuration and also has a broad energy range and/or dose range.

Also, the HE uses an essentially different acceleration method, and the HC and the MC are common in that ion beams are accelerated or decelerated by a DC voltage. Therefore, there is a probability that the HC and the MC can share the beamline. It is therefore desirable to provide an ion implantation apparatus that can serve as both the HC and the MC.

The apparatus capable of operating at a broad range helps to improve productivity or operating efficiency in view of device makers.

Also, the medium-current ion implantation apparatus MC can operate in a high energy range and a low dose range as compared with the high-current ion implantation apparatus HC. Therefore, in this application, the medium-current ion implantation apparatus MC is also referred to as a low-current ion implantation apparatus. Likewise, regarding the medium-current ion implantation apparatus MC, the energy and the dose are also referred to as high energy and low dose, respectively. Alternatively, regarding the high-current ion implantation apparatus HC, the energy and the dose are also referred to as low energy and high dose, respectively. However, these expressions in this application are not intended to restrictively indicate only the energy range and the dose range of the medium-current ion implantation apparatus MC, but may mean "a high (or low) energy (or dose) range" literally according to the context.

Figure 2:
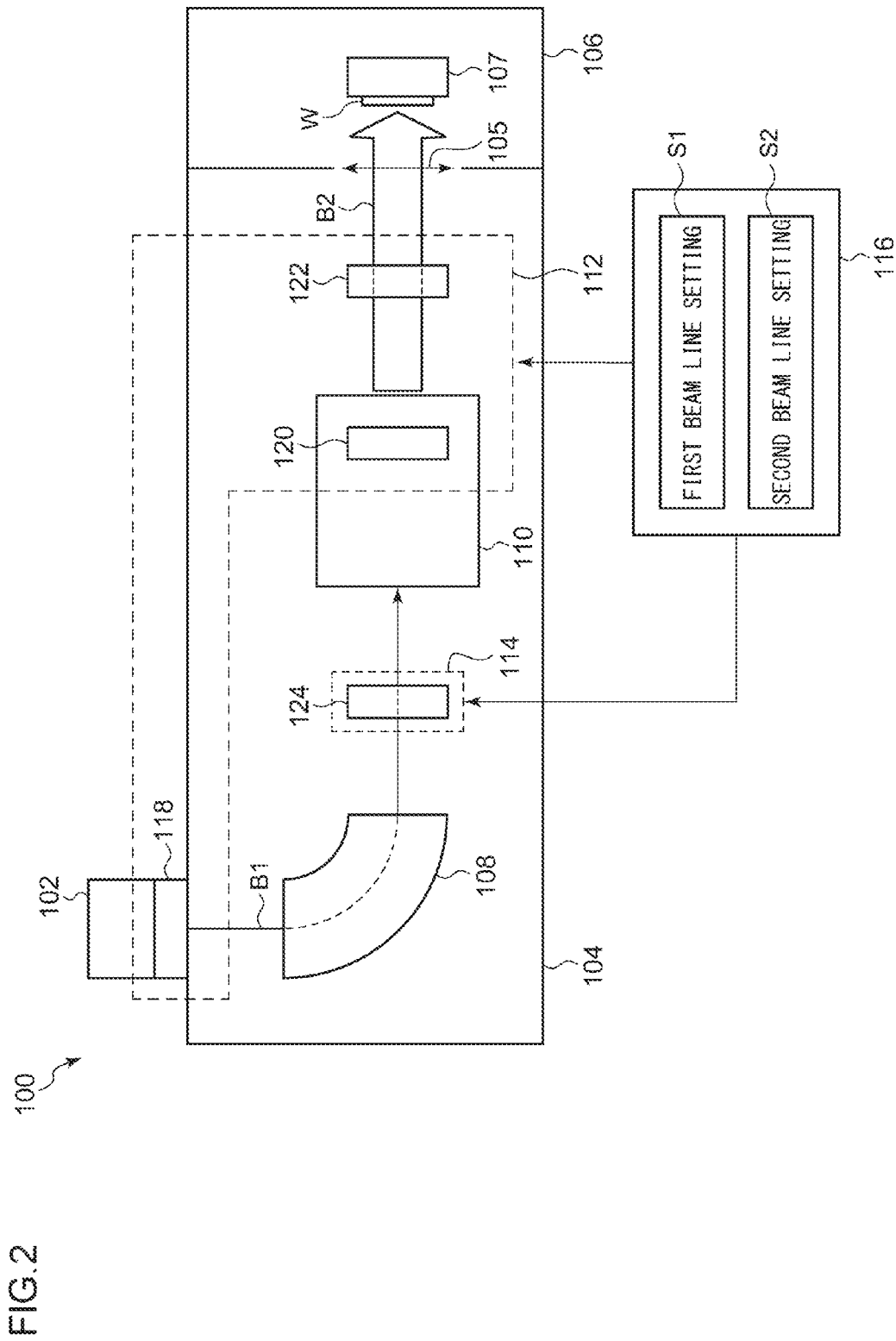
FIG. 2 is a diagram schematically illustrating an ion implantation apparatus according to an embodiment of the present invention.

FIG. 2 is a diagram schematically illustrating an ion implantation apparatus 100 according to an embodiment of the present invention. The ion implantation apparatus 100 is configured to perform ion implantation processing on a surface of a workpiece W according to given ion implantation conditions. The ion implantation conditions include, for example, an ion species to be implanted into the workpiece W, an ion dose amount, and ion energy. The workpiece W is, for example, a substrate, or, for example, a wafer. Therefore, in the following, the workpiece W is also referred to as a substrate W for convenience of description. This is not intended to limit a target of the implantation processing to a particular object.

The ion implantation apparatus 100 includes an ion source 102, a beamline device 104, and an implantation processing chamber 106. Also, the ion implantation apparatus 100 includes a vacuum exhaust system (not illustrated) for providing desired vacuum environments to the ion source 102, the beamline device 104, and the implantation processing chamber 106.

The ion source 102 is configured to generate ions to be implanted into the substrate W. The ion source 102 provides the beamline device 104 with an ion beam B1 accelerated and extracted from the ion source 102 by an extraction electrode unit 118 that is an example of a component for adjusting a beam current. Hereinafter, this may be also referred to as an initial ion beam B1.

The beamline device 104 is configured to transport ions from the ion source 102 to the implantation processing chamber 106. The beamline device 104 provides a beamline for transporting the ion beam. The beamline is a passage of the ion beam and may be also said as a path of beam trajectory. The beamline device 104 performs operations including deflection, acceleration, deceleration, shaping, and scanning, with respect to the initial ion beam B1, thereby forming an ion beam B2. Hereinafter, this may be also referred to as an implantation ion beam B2. The beamline device 104 includes a plurality of beamline components arranged for such beam operations. In this manner, the beamline device 104 provides the implantation processing chamber 106 with the implantation ion beam B2.

The implantation ion beam B2 has a beam irradiation region 105 in the plane perpendicular to a beam transportation direction (or a direction along a beam trajectory) of the beamline device 104. Generally, the beam irradiation region 105 has a width including the width of the substrate W. For example, when the beamline device 104 includes a beam scanning device scanning a spot-shaped ion beam, the beam irradiation region 105 is an elongated irradiation region extending over a scanning range along a longitudinal direction perpendicular to the beam transportation direction. Also, likewise, when the beamline device 104 includes a ribbon beam generator, the beam irradiation region 105 is an elongated irradiation region extending in a longitudinal direction perpendicular to the beam transportation direction. However, the elongated irradiation region is a cross-section of a corresponding ribbon beam. The elongated irradiation region is longer than the width (diameter when the substrate W is circular) of the substrate W in a longitudinal direction.

The implantation processing chamber 106 includes a workpiece holder 107 holding the substrate W such that the substrate W receives the implantation ion beam B2. The workpiece holder 107 is configured to move the substrate W in a direction perpendicular to the beam transportation direction of the beamline device 104 and the longitudinal direction of the beam irradiation region 105. That is, the workpiece holder 107 provides a mechanical scan of the substrate W. In this application, the mechanical scan is the same as reciprocating motion. Also, the "perpendicular direction" is not limited to only a strict right angle. For example, when the implantation is performed in a state in which the substrate W is inclined in a vertical direction, the "perpendicular direction" may include such an inclined angle.

The implantation processing chamber 106 is configured as a serial-type implantation processing chamber. Therefore, the workpiece holder 107 typically holds one sheet of the substrate W. However, like the batch type, the workpiece holder 107 may include a support holding a plurality of (for example, small) substrates, and may be configured to mechanically scan the plurality of substrates by linearly reciprocating the support. In another embodiment, the implantation processing chamber 106 may be configured as a batch-type implantation processing chamber. In this case, for example, the workpiece holder 107 may include a rotating disk that rotatably holds a plurality of substrates W on the circumference of the disk. The rotating disk may be configured to provide a mechanical scanning.

Figure 3:
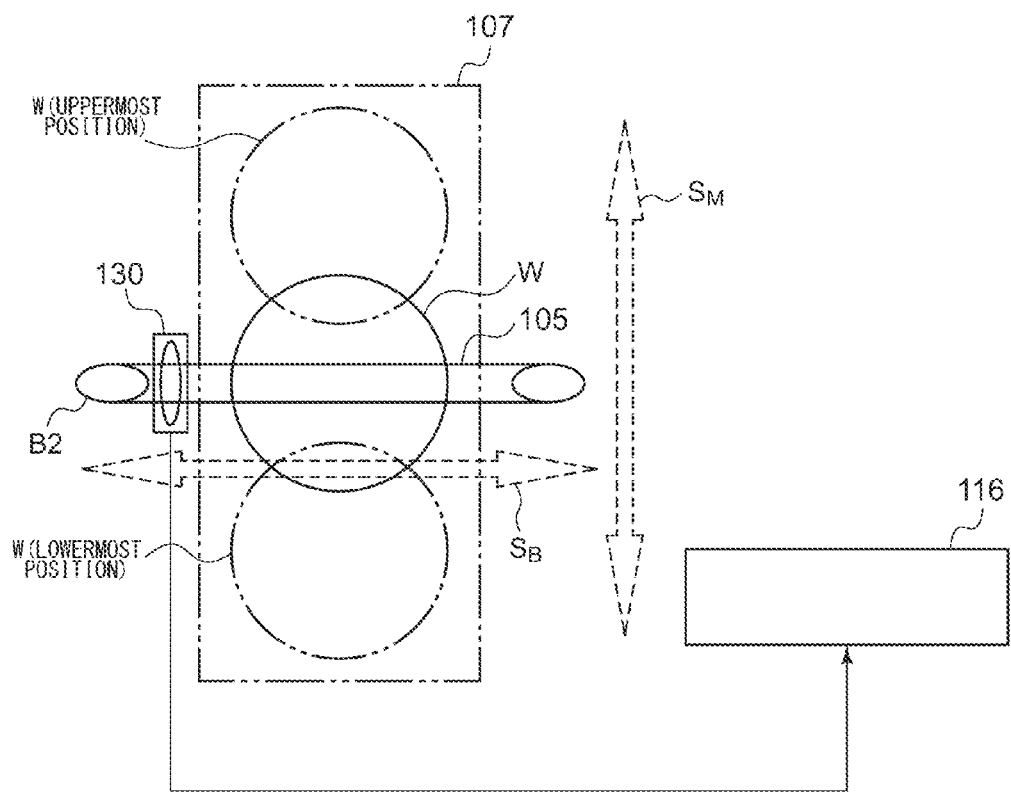
FIG. 3 is a diagram schematically illustrating an ion implantation apparatus according to an embodiment of the present invention.

FIG. 3 illustrates an example of the beam irradiation region 105 and the relevant mechanical scanning. The ion implantation apparatus 100 is configured to perform ion implantation by a hybrid scanning method using both one-dimensional beam scanning $S_B$ of the spot-shaped ion beam B2 and one-dimensional mechanical scanning $S_M$ of the substrate W. On the side of the workpiece holder 107, a beam measurement device 130 (for example, Faraday cup) is provided to overlap the beam irradiation region 105, and the measurement result may be provided to a control unit 116.

In this manner, the beamline device 104 is configured to supply the implantation processing chamber 106 with the implantation ion beam B2 having the beam irradiation region 105. The beam irradiation region 105 is formed to irradiate the implantation ion beam B2 across the substrate W in cooperation with the mechanical scanning of the substrate W. Therefore, ions can be implanted into the substrate W by the relative movement of the substrate W and the ion beam.

In another embodiment, the ion implantation apparatus 100 is configured to perform ion implantation by a ribbon beam+wafer scanning method using both the ribbon-shaped ion beam B2 and the one-dimensional mechanical scanning of the substrate W. The horizontal width of the ribbon beam is expanded while maintaining uniformity, and the substrate W is scanned so as to intersect with the ribbon beam. In a further embodiment, the ion implantation apparatus 100 may be configured to perform ion implantation by a method of two-dimensionally mechanically scanning the substrate W in a state in which the beam trajectory of the spot-shaped ion beam B2 is fixed.

Also, the ion implantation apparatus 100 is not limited to a particular implantation method for implanting ions across a broad region on the substrate W. An implantation method using no mechanical scanning is also possible. For example, the ion implantation apparatus 100 may be configured to perform ion implantation by a two-dimensional beam scanning method of two-dimensionally scanning the substrate W with the spot-shaped ion beam B2. Alternatively, the ion implantation apparatus 100 may be configured to perform ion implantation by a large-size beam method using the two-dimensionally expanded ion beam B2. The large-size beam is expanded to make a beam size equal to or larger than a substrate size while maintaining uniformity, and can process the entire substrate at one time.

Although details will be described below, the ion implantation apparatus 100 may be operated under a first beamline setting S1 for high-dose implantation or a second beamline setting S2 for low-dose implantation. Therefore, the beamline device 104 has the first beamline setting S1 or the second beamline setting S2 during operations. The two settings are determined to generate the ion beams for different ion implantation conditions under the common implantation method. Thus, in the first beamline setting S1 and the second beamline setting S2, the beam center trajectories being the reference of the ion beams B1 and B2 are identical to each other. The beam irradiation regions 105 are also identical to each other in the first beamline setting S1 and the second beamline setting S2.

The beam center trajectory being the reference refers to a beam trajectory when beam is not scanned in the beam scanning method. Also, in the case of the ribbon beam, the beam center trajectory being the reference corresponds to a locus of a geometric center of a beam cross-section.

The beamline device 104 may be divided into a beamline upstream part on the ion source 102 side and a beamline downstream part on the implantation processing chamber 106 side. In the beamline upstream part, for example, a mass spectrometer 108 including a mass analysis magnet and a mass analysis slit is provided. The mass spectrometer 108 performs mass spectrometry on the initial ion beam B1 and provides only necessary ion species to the beamline downstream part. In the beamline downstream part, for example, a beam irradiation region determination unit 110 is provided to determine the beam irradiation region 105 of the implantation ion beam B2.

The beam irradiation region determination unit 110 is configured to emit the ion beam having the beam irradiation region 105 (for example, the implantation ion beam B2) by applying either (or both) of an electric field and a magnetic field to the incident ion beam (for example, the initial ion beam B1). In an embodiment, the beam irradiation region determination unit 110 includes a beam scanning device and a beam parallelizing device. Examples of the beamline components will be described below with reference to FIG. 5.

Also, it should be understood that the division into the upstream part and the downstream part, as above-described, is mentioned for conveniently describing a relative position relationship of the components in the beamline device 104. Therefore, for example, a component in the beamline downstream part may be disposed at a place closer to the ion source 102 away from the implantation processing chamber 106. The opposite holds true as well. Therefore, in an embodiment, the beam irradiation region determination unit 110 may include a ribbon beam generator and a beam parallelizing device, and the ribbon beam generator may include the mass spectrometer 108.

The beamline device 104 includes an energy adjustment system 112 and a beam current adjustment system 114. The energy adjustment system 112 is configured to adjust implantation energy to the substrate W. The beam current adjustment system 114 is configured to adjust the beam current in a broad range so as to change a dose amount implanted into the substrate W in a broad range. The beam current adjustment system 114 is provided to adjust the beam current of the ion beam quantitatively (rather than qualitatively). In an embodiment, the adjustment of the ion source 102 can be also used to adjust the beam current. In this case, the beam current adjustment system 114 may be considered to include the ion source 102. Details of the energy adjustment system 112 and the beam current adjustment system 114 will be described below.

Also, the ion implantation apparatus 100 includes a control unit 116 for controlling all or part of the ion implantation apparatus 100 (for example, all or part of the beamline device 104). The control unit 116 is configured to select any one from a plurality of beamline settings including the first beamline setting S1 and the second beamline setting S2, and operate the beamline device 104 under the selected beamline setting. Specifically, the control unit 116 sets the energy adjustment system 112 and the beam current adjustment system 114 according to the selected beamline setting, and controls the energy adjustment system 112 and the beam current adjustment system 114. Also, the control unit 116 may be a dedicated controller for controlling the energy adjustment system 112 and the beam current adjustment system 114.

The control unit 116 is configured to select a beamline setting suitable for given ion implantation conditions among the plurality of beamline settings including the first beamline setting S1 and the second beamline setting S2. The first beamline setting S1 is suitable for transport of a high-current beam for high-dose implantation into the substrate W. Therefore, for example, the control unit 116 selects the first beamline setting S1 when a desired ion dose amount implanted into the substrate W is in the range of about $1 \times 10^{14}$ to $1 \times 10^{17}$ atoms/cm$^2$. Also, the second beamline setting S2 is suitable for transport of a low-current beam for low-dose implantation into the substrate. Therefore, for example, the control unit 116 selects the second beamline setting S2 when a desired ion dose amount implanted into the substrate W is in the range of about $1 \times 10^{11}$ to $1 \times 10^{14}$ atoms/cm$^2$. Details of the beamline settings will be described below.

The energy adjustment system 112 includes a plurality of energy adjustment elements arranged along the beamline device 104. The plurality of energy adjustment elements is disposed at fixed positions on the beamline device 104. As illustrated in FIG. 2, the energy adjustment system 112 includes, for example, three adjustment elements, specifically, an upstream adjustment element 118, an intermediate adjustment element 120, and a downstream adjustment element 122. Each of these adjustment elements includes one or more electrodes configured to exert an electric field for accelerating or decelerating the initial ion beam B1 and/or the implantation ion beam B2.

The upstream adjustment element 118 is provided in the upstream part of the beamline device 104, for example, the most upstream part of the beamline device 104. The upstream adjustment element 118 includes, for example, an extraction electrode system for extracting the initial ion beam B1 from the ion source 102 to the beamline device 104. The intermediate adjustment element 120 is installed in the middle portion of the beamline device 104 and includes, for example, an electrostatic beam parallelizing device. The downstream adjustment element 122 is provided in the downstream part of the beamline device 104 and includes, for example, an acceleration/deceleration column. The downstream adjustment element 122 may include an angular energy filter (AEF) disposed in the downstream of the acceleration/deceleration column.

Also, the energy adjustment system 112 includes a power supply system for the above-described energy adjustment elements. This will be described below with reference to FIGS. 6 and 7. Also, the plurality of energy adjustment elements may be provided in any number anywhere on the beamline device 104, which is not limited to the illustrated arrangement. Also, the energy adjustment system 112 may include only one energy adjustment element.

The beam current adjustment system 114 is provided in the upstream part of the beamline device 104, and includes a beam current adjustment element 124 for adjusting the beam current of the initial ion beam B1. The beam current adjustment element 124 is configured to block at least a portion of the initial ion beam B1 when the initial ion beam B1 passes through the beam current adjustment element 124. In an embodiment, the beam current adjustment system 114 may include a plurality of beam current adjustment elements 124 arranged along the beamline device 104. Also, the beam current adjustment system 114 may be provided in the downstream part of the beamline device 104.

The beam current adjustment element 124 includes a movable portion for adjusting a passage region of the ion beam cross-section perpendicular to the beam transportation direction of the beamline device 104. According to the movable portion, the beam current adjustment element 124 constitutes a beam limiting device having a variable-width slit or a variable-shape opening for limiting a portion of the initial ion beam. B1. Also, the beam current adjustment system 114 includes a driving device for continuously or discontinuously adjusting the movable portion of the beam current adjustment element 124.

Additionally or alternatively, the beam current adjustment element 124 may include a plurality of adjustment members (for example, adjustment aperture) each having a plurality of beam passage regions having different areas and/or shapes. The beam current adjustment element 124 may be configured to switch the adjustment member disposed on the beam trajectory among the plurality of adjustment members. In this manner, the beam current adjustment element 124 may be configured to adjust the beam current stepwise.

As illustrated, the beam current adjustment element 124 is a beamline component separate from the plurality of energy adjustment elements of the energy adjustment system 112. By separately installing the beam current adjustment element and the energy adjustment element, the beam current adjustment and the energy adjustment may be individually performed. This may increase the degree of freedom in the setting of the beam current range and the energy range in the individual beamline settings.

The first beamline setting S1 includes a first energy setting for the energy adjustment system 112 and a first beam current setting for the beam current adjustment system 114. The second beamline setting S2 includes a second energy setting for the energy adjustment system 112 and a second beam current setting for the beam current adjustment system 114.

The first beamline setting S1 is directed to the low energy and high-dose ion implantation, and the second beamline setting S2 is directed to the high energy and low-dose ion implantation.

Therefore, the first energy setting is determined to be suitable for the transport of the low energy beam as compared with the second energy setting. Also, the second beam current setting is determined to reduce the beam current of the ion beam as compared with the first beam current setting. By combining the beam current adjustment and the irradiation time adjustment of the implantation ion beam B2, a desired dose amount can be implanted into the substrate W.

The first energy setting includes a first power supply connection setting that determines the connection between the energy adjustment system 112 and the power supply system thereof. The second energy setting includes a second power supply connection setting that determines the connection between the energy adjustment system 112 and the power supply system thereof. The power supply connection settings are determined such that the intermediate adjustment element 120 and/or the downstream adjustment element 122 generate an electric field for helping the beam transport. For example, the beam parallelizing device and/or the acceleration/deceleration column, as a whole, are configured to decelerate the implantation ion beam B2 under the first energy setting and accelerate the implantation ion beam B2 under the second energy setting. Due to the power supply connection settings, a voltage adjustment range of each adjustment element of the energy adjustment system 112 is determined. In the adjustment range, a voltage of the power supply corresponding to each adjustment element can be adjusted to provide a desired implantation energy to the implantation ion beam B2.

The first beam current setting includes a first opening setting that determines the ion beam passage region of the beam current adjustment element 124. The second beam current setting includes a second opening setting that determines the ion beam passage region of the beam current adjustment element 124. The second opening setting is determined such that the ion beam passage region is small as compared with the first opening setting. The opening settings determine, for example, the movable range of the movable portion of the beam current adjustment element 124. Alternatively, the opening settings may determine the adjustment member to be used. In this manner, the ion beam passage region corresponding to the desired beam current within the adjustment range determined by the opening settings may be set to the beam current adjustment element 124. The ion beam passage region can be adjusted such that a desired dose amount is implanted into the substrate W within a processing time permitted to the ion implantation processing.

Thus, the beamline device 104 has a first energy adjustment range under the first beamline setting S1 and has a second energy adjustment range under the second beamline setting S2. In order to enable a broad range of the adjustment, the first energy adjustment range has a portion overlapping the second energy adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first energy adjustment range may be separated from the second energy adjustment range.

Likewise, the beamline device 104 has a first dose adjustment range under the first beamline setting S1 and has a second dose adjustment range under the second beamline setting S2. The first dose adjustment range has a portion overlapping the second dose adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first dose adjustment range may be separated from the second dose adjustment range.

In this manner, the beamline device 104 is operated in a first operation mode under the first beamline setting S1. The first operation mode may be referred to as a low energy mode (or a high-dose mode). Also, the beamline device 104 is operated in a second operation mode under the second beamline setting S2. The second operation mode may be referred to as a high energy mode (or a low-dose mode). The first beamline setting S1 can be also referred to as a first implantation setting configuration suitable for the transport of a low energy/high-current beam for the high-dose implantation into the workpiece W. The second beamline setting S2 can be also referred to as a second implantation setting configuration suitable for the transport of a high energy/low-current beam for the low-dose implantation into the workpiece W.

An operator of the ion implantation apparatus 100 can switch the beamline settings before a certain ion implantation processing is performed, depending on the implantation conditions of the processing. Therefore, the broad range from the low energy (or high-dose) to the high energy (or low-dose) can be processed by one ion implantation apparatus.

Also, the ion implantation apparatus 100 corresponds to the broad range of the implantation conditions in the same implantation method. That is, the ion implantation apparatus 100 processes abroad range with substantially the same beamline device 104. Also, the ion implantation apparatus 100 has the serial-type configuration that is recently becoming the mainstream. Therefore, although details will be described below, the ion implantation apparatus 100 is suitable for use as a shared unit of the existing ion implantation apparatuses (for example, HC and MC).

The beamline device 104 can also be considered to include a beam control device for controlling the ion beam, a beam conditioning device for conditioning the ion beam, and a beam shaping device for shaping the ion beam. The beamline device 104 supplies the ion beam having the beam irradiation region 105 exceeding the width of the workpiece W in the implantation processing chamber 106 by using the beam control device, the beam conditioning device, and the beam shaping device. In the ion implantation apparatus 100, the beam control device, the beam conditioning device, and the beam shaping device may have the same hardware configuration in the first beamline setting S1 and the second beamline setting S2. In this case, the beam control device, the beam conditioning device, and the beam shaping device may be disposed with the same layout in the first beamline setting S1 and the second beamline setting S2. Therefore, the ion implantation apparatus 100 may have the same installation floor area (so-called footprint) in the first beamline setting S1 and the second beamline setting S2.

The beam center trajectory being the reference is a beam trajectory that is a locus of geometric center of the beam cross-section without beam scanning in the beam scanning method. Also, in the case of the ribbon beam that is a stationary beam, the beam center trajectory being the reference corresponds to a locus of a geometric center of the beam cross-section, regardless of a change in the beam cross-sectional shape in the implantation ion beam B2 of the downstream part.

The beam control device may include the control unit 116. The beam conditioning device may include the beam irradiation region determination unit 110. The beam conditioning device may include an energy filter or a deflection element. The beam shaping device may include a first XY convergence lens 206, a second XY convergence lens 208, and a Y convergence lens 210, which are to be described below.

It can be considered that, in the case of the beam scanning method, the initial ion beam B1 takes a single beam trajectory in the upstream part of the beamline device 104, and in the downstream part the implantation ion beam B2 takes a plurality of beam trajectories due to the beam scanning and parallelizing with reference to the beam center trajectory being the reference. However, in the case of the ribbon beam, it becomes a beam irradiation zone because the beam cross-sectional shape of the single beam trajectory is changed and the beam width is widened. Thus, the beam trajectory is also single. According to this view, the beam irradiation region 105 may be also referred to as an ion beam trajectory zone. Therefore, in the ion implantation apparatus 100, the implantation ion beam B2 has the same ion beam trajectory zone in the first beamline setting S1 and the second beamline setting S2.

Figure 4:
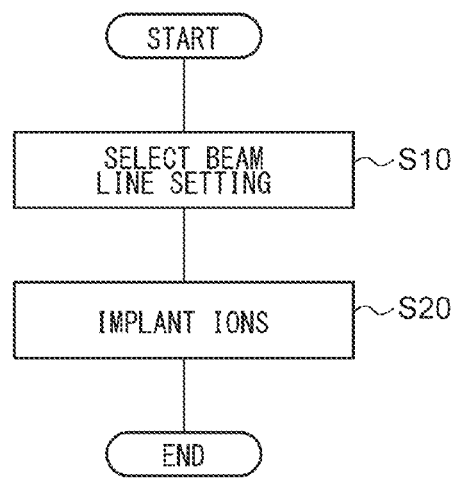
FIG. 4 is a flowchart illustrating an ion implantation method according to an embodiment of the present invention.

FIG. 4 is a flowchart illustrating an ion implantation method according to an embodiment of the present invention. This ion implantation method is suitable for use in the ion implantation apparatus 100. This method is performed by the control unit 116. As illustrated in FIG. 4, this method includes a beamline setting selecting step (S10) and an ion implantation step (S20).

The control unit 116 selects a beamline setting suitable for given ion implantation conditions among a plurality of beamline settings (S10). As described above, the plurality of beamline settings includes a first beamline setting S1 suitable for transport of a high-current beam for high-dose implantation into a workpiece, and a second beamline setting S2 suitable for transport of a low-current beam for low-dose implantation into a workpiece. For example, the control unit 116 selects the first beamline setting S1 when a desired ion dose amount implanted into a substrate W exceeds a threshold value, and selects the second beamline setting S2 when the desired ion dose amount is smaller than the threshold value. Also, as described below, the plurality of beamline settings (or implantation setting configurations) may include a third beamline setting (or third implantation setting configuration) and/or a fourth beamline setting (or fourth implantation setting configuration).

When the first beamline setting S1 is selected, the control unit 116 sets the energy adjustment system 112 by using the first energy setting. The energy adjustment system 112 and the power supply thereof are connected according to a first power supply connection setting. Also, the control unit 116 sets the beam current adjustment system 114 by using the first beam current setting. Therefore, the ion beam passage region (or adjustment range thereof) is set according to the first opening setting. Likewise, when the second beamline setting S2 is selected, the control unit 116 sets the energy adjustment system 112 by using the second energy setting, and sets the beam current adjustment system 114 by using the second beam current setting.

The selecting process step may include a process step of adjusting the beamline device 104 in the adjustment range according to the selected beamline setting. In the adjusting process step, each adjustment element of the beamline device 104 is adjusted within a corresponding adjustment range so as to generate the ion beam of a desired implantation condition. For example, the control unit 116 determines a voltage of a power supply corresponding to each adjustment element of the energy adjustment system 112 so as to obtain a desired implantation energy. Also, the control unit 116 determines the ion beam passage region of the beam current adjustment element 124 so as to obtain a desired implantation dose amount.

In this manner, the control unit 116 operates the ion implantation apparatus 100 under the selected beamline setting (S20). The implantation ion beam B2 having the beam irradiation region 105 is generated and supplied to the substrate W. The implantation ion beam B2 scans the entire substrate W in cooperation with the mechanical scanning of the substrate W (or with the beam alone). As a result, ions are implanted into the substrate W at the energy and dose amount of the desired ion implantation conditions.

The serial-type high-dose high-current ion implantation apparatus, which is being used in device production, currently adopts a hybrid scanning method, a two-dimensional mechanical scanning method, and a ribbon beam+wafer scanning method. However, the two-dimensional mechanical scanning method has a limitation in increase of a scanning speed due to a load of mechanical driving mechanism of the mechanical scanning, and thus, the two-dimensional mechanical scanning method disadvantageously cannot suppress implantation non-uniformity sufficiently. Also, in the ribbon beam+wafer scanning method, uniformity is easily degraded when the beam size is expanded in a horizontal direction. Therefore, in particular, there are problems in the uniformity and the identity of beam angle in the low-dose condition (low beam current condition). However, when the obtained implantation result is within an allowable range, the ion implantation apparatus of the present invention may be configured by the two-dimensional mechanical scanning method or the ribbon beam+wafer scanning method.

On the other hand, the hybrid scanning method can achieve excellent uniformity in the beam scanning direction by adjusting the bean scanning speed at high accuracy. Also, by performing the beam scanning at a sufficient high speed, implantation non-uniformity in the wafer scanning direction can be sufficiently suppressed. Therefore, the hybrid scanning method is considered as optimal over a broad range of the dose condition.

FIG. 5A is a plan view illustrating a schematic configuration of an ion implantation apparatus 200 according to an embodiment of the present invention, and FIG. 5B is a side view illustrating a schematic configuration of an ion implantation apparatus 200 according to an embodiment of the present invention. The ion implantation apparatus 200 is an embodiment when the hybrid scanning method is applied to the ion implantation apparatus 100 illustrated in FIG. 2. Also, like the ion implantation apparatus 100 illustrated in FIG. 2, the ion implantation apparatus 200 is a serial-type apparatus.

As illustrated, the ion implantation apparatus 200 includes a plurality of beamline components. The beamline upstream part of the ion implantation apparatus 200 includes, in order from the upstream side, an ion source 201, a mass analysis magnet 202, a beam dump 203, a resolving aperture 204, a current suppression mechanism 205, a first XY convergence lens 206, a beam current measurement device 207, and a second XY convergence lens 208. An extraction electrode 218 (see FIGS. 6 and 7) for extracting ions from the ion source 201 is provided between the ion source 201 and the mass analysis magnet 202.

A scanner 209 is provided between the beamline upstream part and the beamline downstream part. The beamline downstream part includes, in order from the upstream side, a Y convergence lens 210, a beam parallelizing mechanism 211, an AD (Accel/Decel) column 212, and an energy filter 213. A wafer 214 is disposed in the most downstream part of the beamline downstream part. The beamline components from the ion source 201 to the beam parallelizing mechanism 211 are accommodated in a terminal 216.

The current suppression mechanism 205 is an example of the above-described beam current adjustment system 114. The current suppression mechanism 205 is provided for switching a low-dose mode and a high-dose mode. The current suppression mechanism 205 includes, for example, a continuously variable aperture (CVA). The CVA is an aperture capable of adjusting an opening size by a driving mechanism. Therefore, the current suppression mechanism 205 is configured to operate in a relatively small opening size adjustment range in the low-dose mode, and operate in a relatively large opening size adjustment range in the high-dose mode. In an embodiment, in addition or alternative to the current suppression mechanism 205, a plurality of resolving apertures 204 having different opening widths may be configured to operate with different settings in the low-dose mode and the high-dose mode.

The current suppression mechanism 205 serves to help beam adjustment under the low beam current condition by limiting an ion beam amount arriving at the downstream. The current suppression mechanism 205 is provided in the beamline upstream part (that is, from the ion extraction from the ion source 201 to the upstream side of the scanner 209). Therefore, the beam current adjustment range can be increased. Also, the current suppression mechanism 205 may be provided in the beamline downstream part.

The beam current measurement device 207 is, for example, a movable flag Faraday.

The first XY convergence lens 206, the second XY convergence lens 208, and the Y convergence lens 210 constitute the beam shaping device for adjusting the beam shape in the vertical and horizontal directions (beam cross-section in an XY plane). As such, the beam shaping device includes a plurality of lenses arranged along the beamline between the mass analysis magnet 202 and the beam parallelizing mechanism 211. The beam shaping device can use the convergence/divergence effect of these lenses in order to appropriately transport the ion beam up to the downstream in a broad range of energy/beam current condition. That is, the ion beam can be appropriately transported to the wafer 214 in any condition of low energy/low beam current, low energy/high beam current, high energy/low beam current, and high energy/high beam current.

The first XY convergence lens 206 is, for example, a Q lens. The second XY convergence lens 208 is, for example, an XY-direction einzel lens. The Y convergence lens 210 is, for example, a Y-direction einzel lens or Q lens. Each of the first XY convergence lens 206, the second XY convergence lens 208, and the Y convergence lens 210 may be a single lens or a group of lenses. In this manner, the beam shaping device is designed to appropriately control the ion beam from the low energy/high beam current condition having a beam self-divergence problem caused by a large beam potential to the high energy/low beam current having a beam cross-sectional shape control problem caused by a small beam potential.

The energy filter 213 is, for example, an angular energy filter (AEF) having a deflection electrode or a deflection electromagnet, or both of the defection electrode and the deflection electromagnet.

The ions generated in the ion source 201 are accelerated with an extraction electric field (not illustrated). The accelerated ions are deflected in the mass analysis magnet 202. In this manner, only ions having a predetermined energy and a mass-to-charge ratio pass through the resolving aperture 204. Subsequently, the ions are guided to the scanner 209 through the current suppression mechanism (CVA) 205, the first XY convergence lens 206, and the second XY convergence lens 208.

The scanner 209 reciprocally scans the ion beam in a horizontal direction (which may be a vertical direction or an oblique direction) by applying either (or both) of a periodic electric field and a periodic magnetic field. Due to the scanner 209, the ion beam is adjusted such that the ion beam is uniformly implanted in a horizontal direction on the wafer 214. The traveling direction of the ion beam 215 with which the scanner 209 scans can be parallelized by the beam parallelizing mechanism 211 using the application of either (or both) of the electric field and the magnetic field. Thereafter, the ion beam 215 is accelerated or decelerated to have a predetermined energy in the AD column 212 by applying the electric field. The ion beam 215 exiting the AD column 212 reaches the final implantation energy (in the low energy mode, the energy may be adjusted to be higher than the implantation energy, and the ion beam may be deflected while decelerating in the energy filter). The energy filter 213 in the downstream of the AD column 212 deflects the ion beam 215 to the wafer 214 by the application of either (or both) of the electric field and the magnetic field with the deflection electrode or the deflection electromagnet. Thus, a contamination with energy other than target energy is eliminated. In this manner, the purified ion beam 215 is implanted into the wafer 214.

Also, the beam dump 203 is disposed between the mass analysis magnet 202 and the resolving aperture 204. The beam dump 203 deflects the ion beam by applying the electric field when necessary. Therefore, the beam dump 203 can control the arrival of the ion beam at the downstream at high speed.

Figure 6:
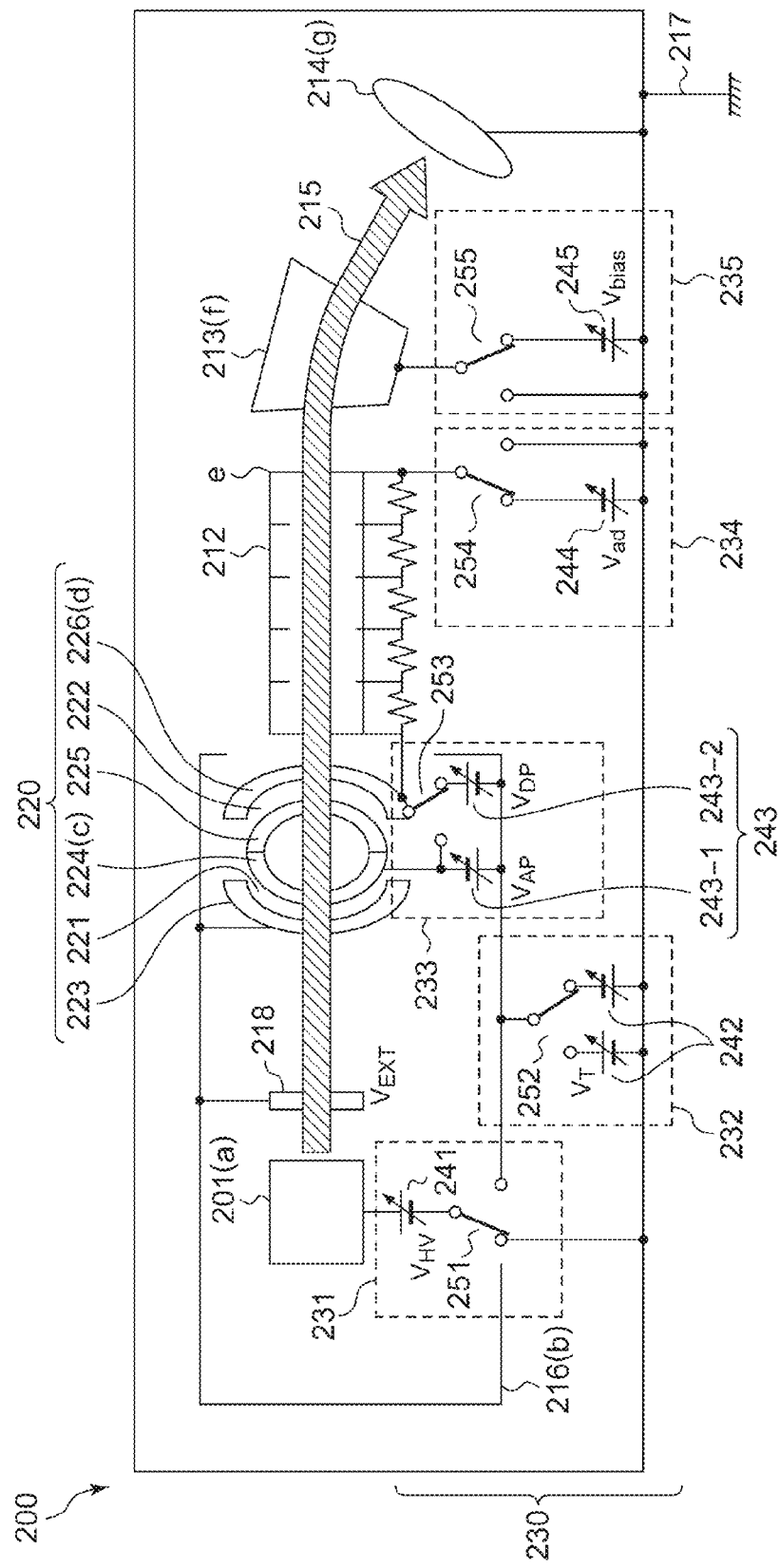
FIG. 6 is a diagram schematically illustrating a configuration of a power supply of an ion implantation apparatus according to an embodiment of the present invention.
Figure 7:
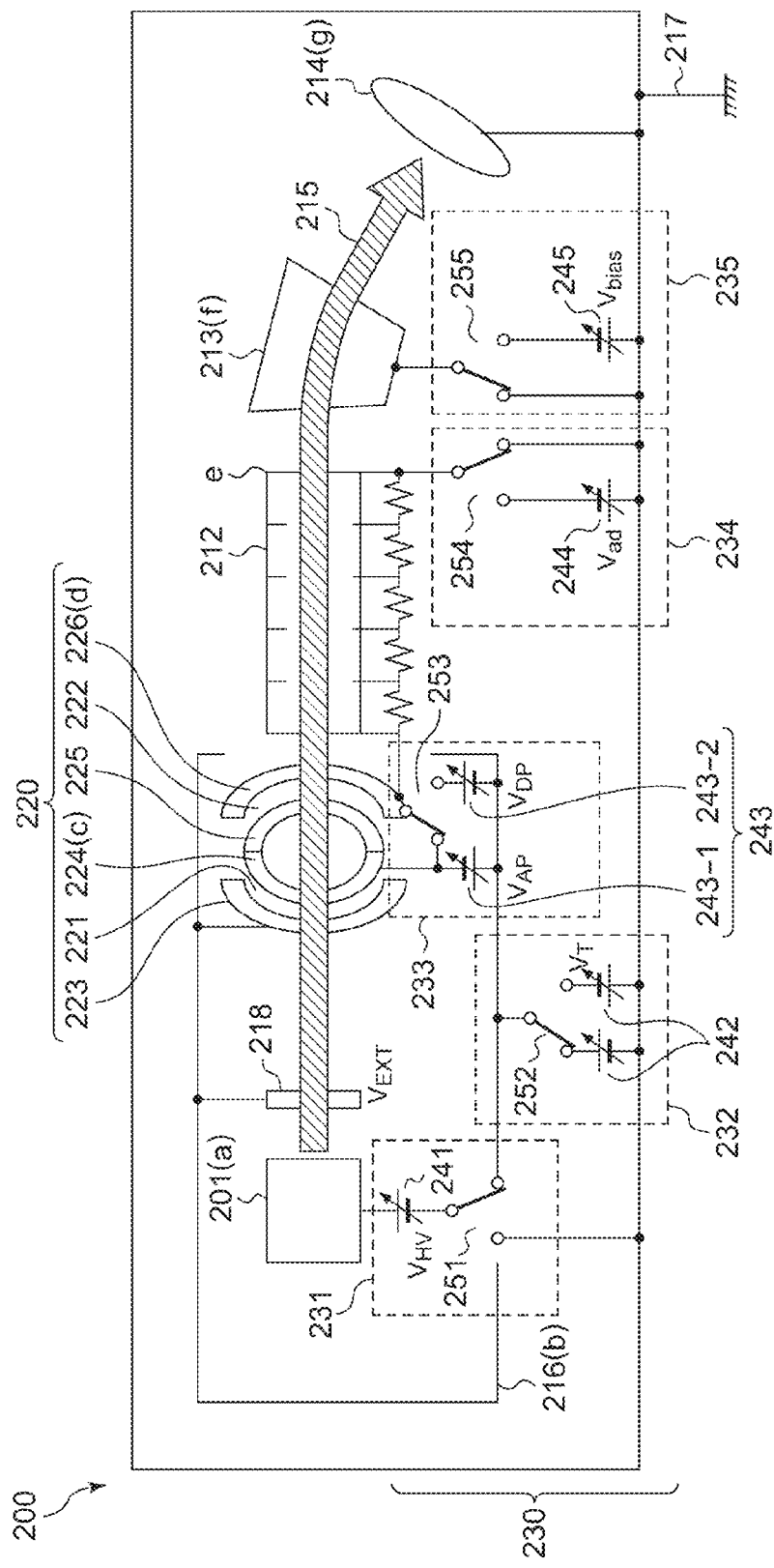
FIG. 7 is a diagram schematically illustrating a configuration of a power supply of an ion implantation apparatus according to an embodiment of the present invention.

Next, the low energy mode and the high energy mode in the ion implantation apparatus 200 illustrated in FIG. 5 will be described with reference to the configuration system diagram of the high-voltage power supply system 230 illustrated in FIGS. 6 and 7. FIG. 6 illustrates a power supply switching state of the low energy mode, and FIG. 7 illustrates a power supply switching state of the high energy mode. FIGS. 6 and 7 illustrate main components related to the energy adjustment of the ion beam among the beamline components illustrated in FIG. 5. In FIGS. 6 and 7, the ion beam 215 is indicated by an arrow.

As illustrated in FIGS. 6 and 7, the beam parallelizing mechanism 211 (see FIG. 5) includes a double P lens 220. The double P lens 220 includes a first voltage gap 221 and a second voltage gap 222 disposed spaced apart from each other along the ion movement direction. The first voltage gap 221 is disposed in the upstream, and the second voltage gap 222 is disposed in the downstream.

The first voltage gap 221 is formed between a pair of electrodes 223 and 224. The second voltage gap 222 is formed between another pair of electrodes 225 and 226 disposed in the downstream of the electrodes 223 and 224. The first voltage gap 221 and the electrodes 223 and 224 forming the gap 221 have a convex shape toward the upstream side. Conversely, the second voltage gap 222 and the electrodes 225 and 226 forming the gap 222 have a convex shape toward the downstream side. Also, for convenience of description, these electrodes may be also referred to as a first P lens upstream electrode 223, a first P lens downstream electrode 224, a second P lens upstream electrode 225, and a second P lens downstream electrode 226 below.

The double P lens 220 parallelizes the incident ion beam before emission and adjusts the energy of the ion beam by a combination of the electric fields applied to the first voltage gap 221 and the second voltage gap 222. That is, the double P lens 220 accelerates or decelerates the ion beam by the electric fields of the first voltage gap 221 and the second voltage gap 222.

Also, the ion implantation apparatus 200 includes a high-voltage power supply system 230 including a power supply for the beamline components. The high-voltage power supply system 230 includes a first power supply unit 231, a second power supply unit 232, a third power supply unit 233, a fourth power supply unit 234, and a fifth power supply unit 235. As illustrated, the high-voltage power supply system 230 includes a connection circuit for connecting the first to fifth power supply units 231 to 235 to the ion implantation apparatus 200.

The first power supply unit 231 includes a first power supply 241 and a first switch 251. The first power supply 241 is provided between the ion source 201 and the first switch 251, and is a DC power supply that provides the ion source 201 with a positive voltage. The first switch 251 connects the first power supply 241 to a ground 217 in the low energy mode (see FIG. 6), and connects the first power supply 241 to a terminal 216 in the high energy mode (see FIG. 7). Therefore, the first power supply 241 provides a voltage $V_{HV}$ to the ion source 201 in the low energy mode on the basis of a ground potential. This provides the total ion energy as it is. On the other hand, the first power supply 241 provides a voltage $V_{HV}$ to the ion source 201 in the high energy mode on the basis of a terminal potential.

The second power supply unit 232 includes a second power supply 242 and a second switch 252. The second power supply 242 is provided between the terminal 216 and the ground 217, and is a DC power supply that provides the terminal 216 with one of positive and negative voltages by the switching of the second switch 252. The second switch 252 connects a negative electrode of the second power supply 242 to the terminal 216 in the low energy mode (see FIG. 6), and connects a positive electrode of the second power supply 242 to the terminal 216 in the high energy mode (see FIG. 7). Therefore, the second power supply 242 provides a voltage $V_T$ ($V_T<0$) to the terminal 216 in the low energy mode on the basis of the ground potential. On the other hand, the second power supply 242 provides a voltage $V_T$ ($V_T>0$) to the terminal 216 in the high energy mode on the basis of the ground potential.

Therefore, an extraction voltage $V_{EXT}$ of the extraction electrode 218 is $V_{EXT}=V_{HV}-V_T$ in the low energy mode, and is $V_{EXT}=V_{HV}$ in the high energy mode. When a charge of an ion is q, the final energy is $qV_{HV}$ in the low energy mode, and is $q(V_{HV}+V_T)$ in the high energy mode.

The third power supply unit 233 includes a third power supply 243 and a third switch 253. The third power supply 243 is provided between the terminal 216 and the double P lens 220. The third power supply 243 includes a first P lens power supply 243-1 and a second P lens power supply 243-2. The first P lens power supply 243-1 is a DC power supply that provides a voltage $V_{AP}$ to the first P lens downstream electrode 224 and the second P lens upstream electrode 225 on the basis of the terminal potential. The second P lens power supply 243-2 is a DC power supply that provides a voltage $V_{DP}$ to a destination through the third switch 253 on the basis of the terminal potential. The third switch 253 is provided between the terminal 216 and the double P lens 220 to connect one of the first P lens power supply 243-1 and the second P lens power supply 243-2 to the second P lens downstream electrode 226 by the switching. Also, the first P lens upstream electrode 223 is connected to the terminal 216.

The third switch 253 connects the second P lens power supply 243-2 to the second P lens downstream electrode 226 in the low energy mode (see FIG. 6), and connects the first P lens power supply 243-1 to the second P lens downstream electrode 226 in the high energy mode (see FIG. 7). Therefore, the third power supply 243 provides a voltage $V_{DP}$ to the second P lens downstream electrode 226 in the low energy mode on the basis of the terminal potential. On the other hand, the third power supply 243 provides a voltage $V_{AP}$ to the second P lens downstream electrode 226 in the high energy mode on the basis of the terminal potential.

The fourth power supply unit 234 includes a fourth power supply 244 and a fourth switch 254. The fourth power supply 244 is provided between the fourth switch 254 and the ground 217 and is a DC power supply that provides a negative voltage to an exit (that is, the downstream end) of the AD column 212. The fourth switch 254 connects the fourth power supply 244 to the exit of the AD column 212 in the low energy mode (see FIG. 6), and connects the exit of the AD column 212 to the ground 217 in the high energy mode (see FIG. 7). Therefore, the fourth power supply 244 provides a voltage $V_{ad}$ to the exit of the AD column 212 in the low energy mode on the basis of the ground potential. On the other hand, the fourth power supply 244 is not used in the high energy mode.

The fifth power supply unit 235 includes a fifth power supply 245 and a fifth switch 255. The fifth power supply 245 is provided between the fifth switch 255 and the ground 217. The fifth power supply 245 is provided for the energy filter (AEF) 213. The fifth switch 255 is provided for switching the operation modes of the energy filter 213. The energy filter 213 is operated in a so-called offset mode in the low energy mode, and is operated in a normal mode in the high energy mode. The offset mode is an operation mode of the AEF in which an average value of the positive electrode and the negative electrode is a negative potential. The beam convergence effect of the offset mode can prevent beam loss caused by the beam divergence in the AEF. The normal mode is an operation mode of the AEF in which an average value of the positive electrode and the negative electrode is the ground potential.

The ground potential is provided to the wafer 214.

Figure 8A:
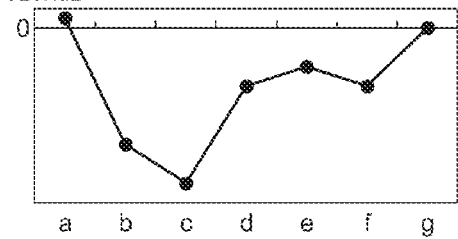
FIG. 8A is a diagram illustrating a voltage in an ion implantation apparatus according to an embodiment of the present invention.
Figure 8B:
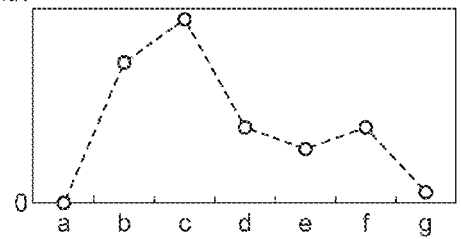
FIG. 8B is a diagram illustrating an energy in an ion implantation apparatus according to an embodiment of the present invention.
Figure 9A:
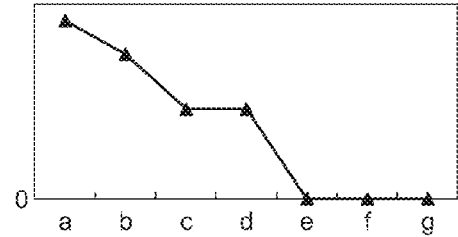
FIG. 9A is a diagram illustrating a voltage in an ion implantation apparatus according to an embodiment of the present invention.
Figure 9B:
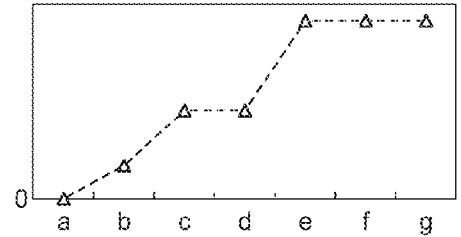
FIG. 9B is a diagram illustrating an energy in an ion implantation apparatus according to an embodiment of the present invention.

FIG. 8A illustrates an example of a voltage applied to each portion of the ion implantation apparatus 200 in the low energy mode, and FIG. 8B illustrates an example of energy of the ion in each portion of the ion implantation apparatus 200 in the low energy mode. FIG. 9A illustrates an example of a voltage applied to each portion of the ion implantation apparatus 200 in the high energy mode, and FIG. 9B illustrates an example of energy of the ion in each portion of the ion implantation apparatus 200 in the high energy mode. The vertical axes in FIGS. 8A and 9A represent the voltage, and the vertical axes in FIGS. 8B and 9B represent the energy. In the horizontal axes of the respective drawings, locations in the ion implantation apparatus 200 are represented by symbols a to g. The symbols a, b, c, d, e, f, and g represent the ion source 201, the terminal 216, the acceleration P lens (first P lens downstream electrode 224), the deceleration P lens (second P lens downstream electrode 226), the exit of the AD column 212, the energy filter 213, and the wafer 214, respectively.

The double P lens 220 has a configuration that uses the acceleration P lens c alone, or uses the deceleration P lens d alone, or uses both of the acceleration P lens c and the deceleration P lens d, when necessary according to the implantation condition. In the configuration that uses both of the acceleration P lens c and the deceleration P lens d, the double P lens 220 can be configured to change the distribution of the acceleration and deceleration effects by using both of the acceleration effect and the deceleration effect. In this case, the double P lens 220 can be configured such that a difference between the incident beam energy to the double P lens 220 and the exit beam energy from the double P lens 220 is used to accelerate or decelerate the beam. Alternatively, the double P lens 220 can be configured such that the difference between the incident beam energy and the exit beam energy becomes zero, and thus, the beam is neither accelerated nor decelerated.

As an example, as illustrated, in the low energy mode, the double P lens 220 is configured to decelerate the ion beam in the deceleration P lens d, accelerate the ion beam in the acceleration P lens c to some extent when necessary, and thereby the ion beam is decelerated as a whole. On the other hand, in the high energy mode, the double P lens 220 is configured to accelerate the ion beam only in the acceleration P lens c. Also, in the high energy mode, the double P lens 220 may be configured to decelerate the ion beam in the deceleration P lens d to some extent when necessary, as long as the ion beam is accelerated as a whole.

Since the high-voltage power supply system 230 is configured as above, the voltages applied to several regions on the beamline can be changed by the switching of the power supply. Also, the voltage application paths in some regions can also be changed. By using these, it is possible to switch the low energy mode and the high energy mode in the same beamline.

In the low energy mode, the potential $V_{HV}$ of the ion source 201 is directly applied on the basis of the ground potential. Therefore, a high-accuracy voltage application to the source unit is possible, and the accuracy of energy setting can be increased during the ion implantation at low energy. Also, by setting the terminal voltage $V_T$, the P lens voltage $V_{DP}$, the AD column exit voltage $V_{ad}$, and the energy filter voltage $V_{bias}$ to negative, it is possible to transport the ions to the energy filter at a relatively high energy. Therefore, the transport efficiency of the ion beam can be improved, and the high current can be obtained.

Also, in the low energy mode, the deceleration P lens is employed to facilitate the ion beam transport in the high energy state. This helps the low energy mode coexist with the high energy mode in the same beamline. Also, in the low energy mode, an expanded beam by design is generated by adjusting the convergence/divergence elements of the beamline in order to transport the beam such that the self-divergence of the beam is minimized. This also helps the low energy mode coexist with the high energy mode in the same beamline.

In the high energy mode, the potential of the ion source 201 is the sum of the acceleration extraction voltage $V_{HV}$ and the terminal potential $V_T$. This can enable the application of the high voltage to the source unit, and accelerate ions at high energy.

Figure 10:
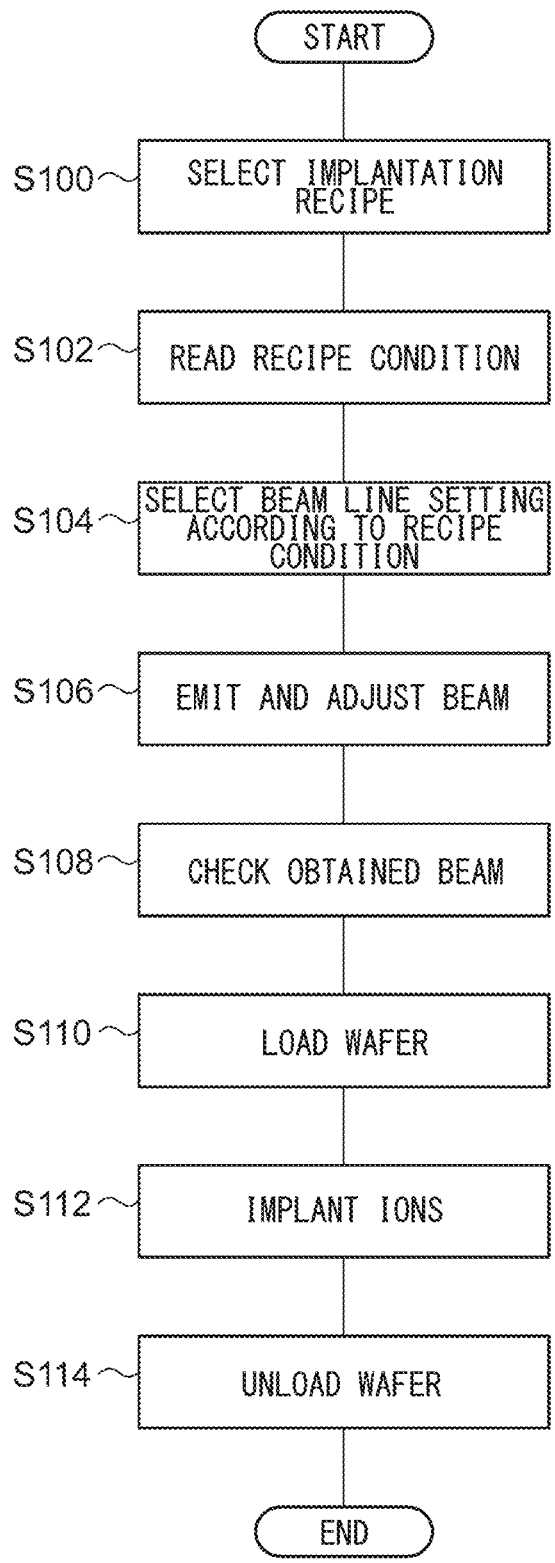
FIG. 10 is a flowchart illustrating an ion implantation method according to an embodiment of the present invention.

FIG. 10 is a flowchart illustrating an ion implantation method according to an embodiment of the present invention. This method may be performed by, for example, the beam control device for the ion implantation apparatus. As illustrated in FIG. 10, first, the implantation recipe is selected (S100). The control device reads the recipe condition (S102), and selects the beamline setting according to the recipe condition (S104). The ion beam adjusting process is performed under the selected beamline setting. The adjusting process includes a beam emission and adjustment (S106) and an obtained beam checking (S108). In this manner, the preparing process for the ion implantation is ended. Next, the wafer is loaded (S110), the ion implantation is performed (S112), and the wafer is unloaded (S114). Steps 110 to 114 may be repeated until the desired number of wafers are processed.

Figure 11:
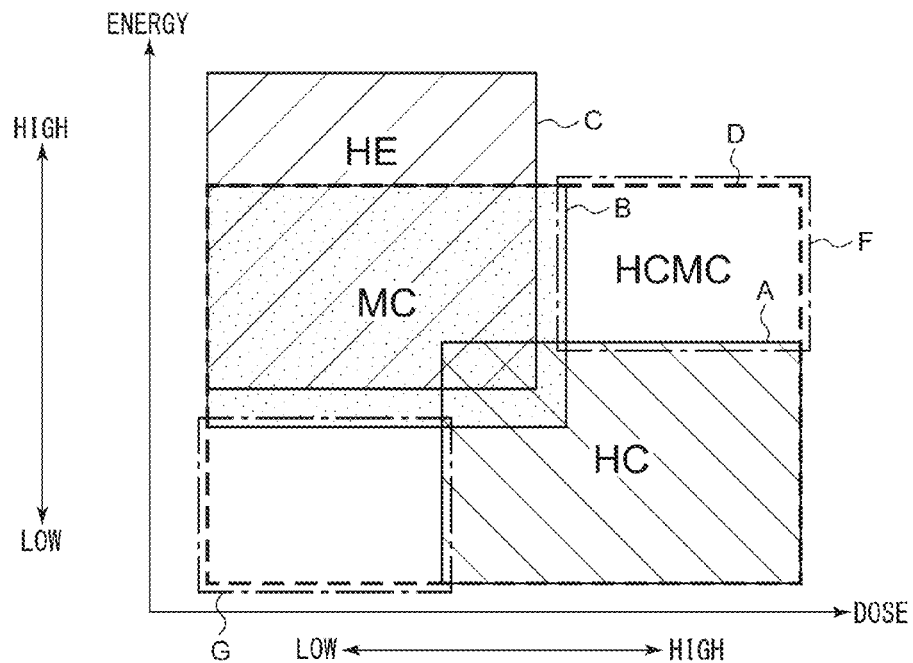
FIG. 11 is a diagram schematically illustrating ranges of an energy and a dose amount in an ion implantation apparatuses according to an embodiment of the present invention.

FIG. 11 schematically illustrates a range D of energy and dose amount that is realized by the ion implantation apparatus 200. Like in FIG. 1, FIG. 11 illustrates the range of energy and dose amount that can be processed in the actually allowable productivity. For comparison, ranges A, B and C of energy and dose amount of the HC, the MC, and the HE illustrated in FIG. 1 are illustrated in FIG. 11.

As illustrated in FIG. 11, it can be seen that the ion implantation apparatus 200 includes all the operation ranges of the existing apparatuses HC and MC. Therefore, the ion implantation apparatus 200 is a novel apparatus beyond the existing framework. Even one novel ion implantation apparatus can serve as the two existing types of categories HC and MC while maintaining the same beamline and the implantation method. Therefore, this apparatus may be referred to as HCMC.

Therefore, according to the present embodiment, it is possible to provide the HCMC in which the serial-type high-dose high-current ion implantation apparatus and the serial-type medium-dose medium-current ion implantation apparatus are configured as a single apparatus. The HCMC can perform the implantation in a broad range of energy condition and dose condition by changing the voltage applying method in the low energy condition and the high energy condition and changing the beam current from high current to low current in the CVA.

Figure 12:
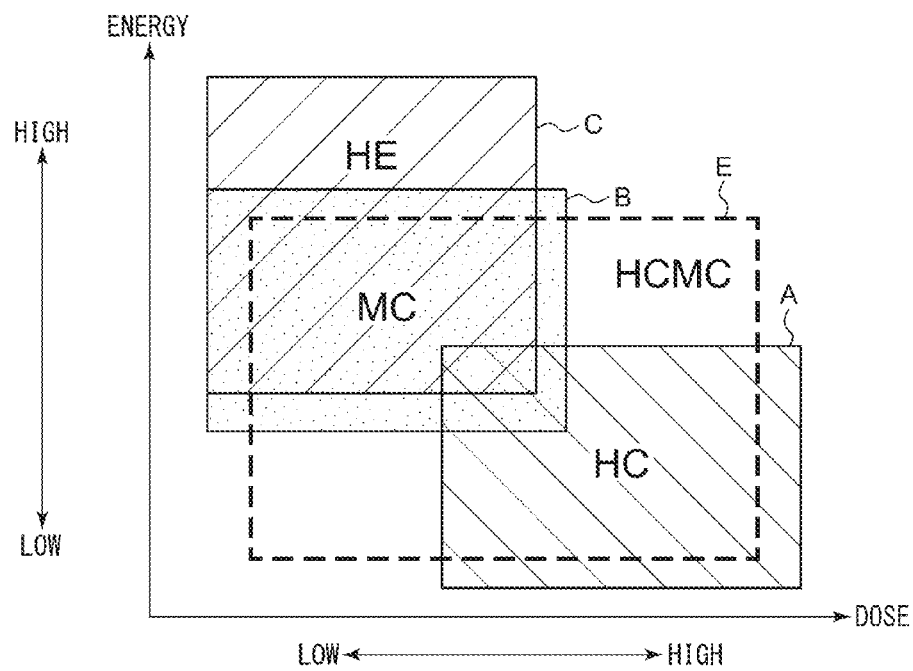
FIG. 12 is a diagram schematically illustrating ranges of an energy and a dose amount in an ion implantation apparatuses according to an embodiment of the present invention.

Also, the HCMC-type ion implantation apparatus may not include all the implantation condition ranges of the existing HC and MC. Considering the tradeoff of the device manufacturing cost and the implantation performance, it may be thought to provide an apparatus having a range E (see FIG. 12) narrower than the range D illustrated in FIG. 11. In this case, the ion implantation apparatus having excellent practicality can be provided as long as it covers the ion implantation conditions required for the device maker.

Figure 13:
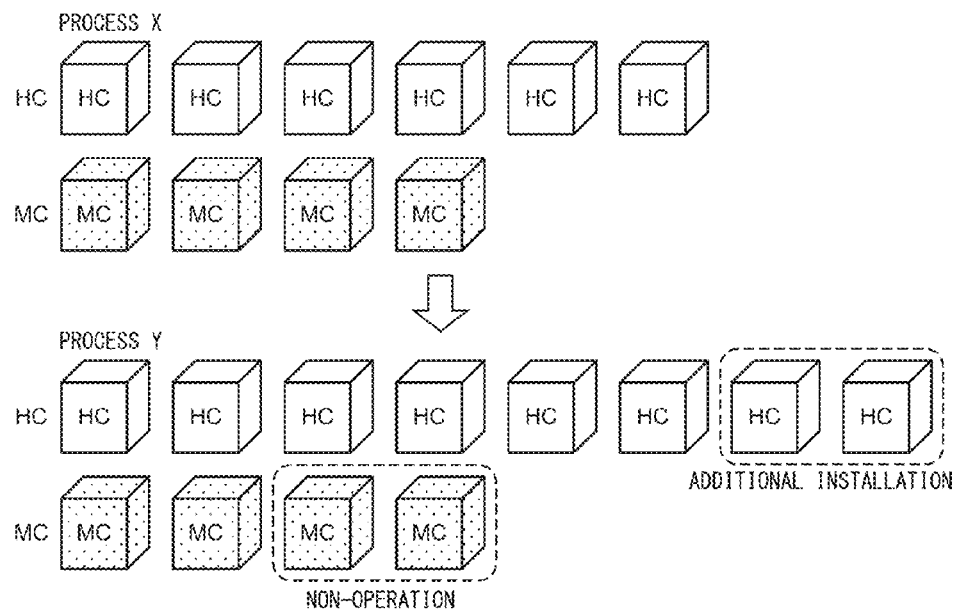
FIG. 13 is a diagram describing the use of a typical ion implantation apparatus.

The improvement in the operation efficiency of the apparatus realized by the HCMC in the device manufacturing process will be described. For example, as illustrated in FIG. 13, it is assumed that a device maker uses six HCs and four MCs in order to process a manufacturing process X (that is, this device maker owns only the existing apparatuses HC and MC). Thereafter, the device maker changes the process X to a process Y according to a change in a manufacturing device. As a result, the device maker needs eight HCs and two MCs. The maker needs to install two more HCs, and thus, the increase in investment and the lead time are required. At the same time, two MCs are not operated, and thus, the maker unnecessarily owns these. As described above, since the HC and the MC are generally different in the implantation method, it is difficult to convert the non-operating MCs to newly necessary HCs.

Figure 14:
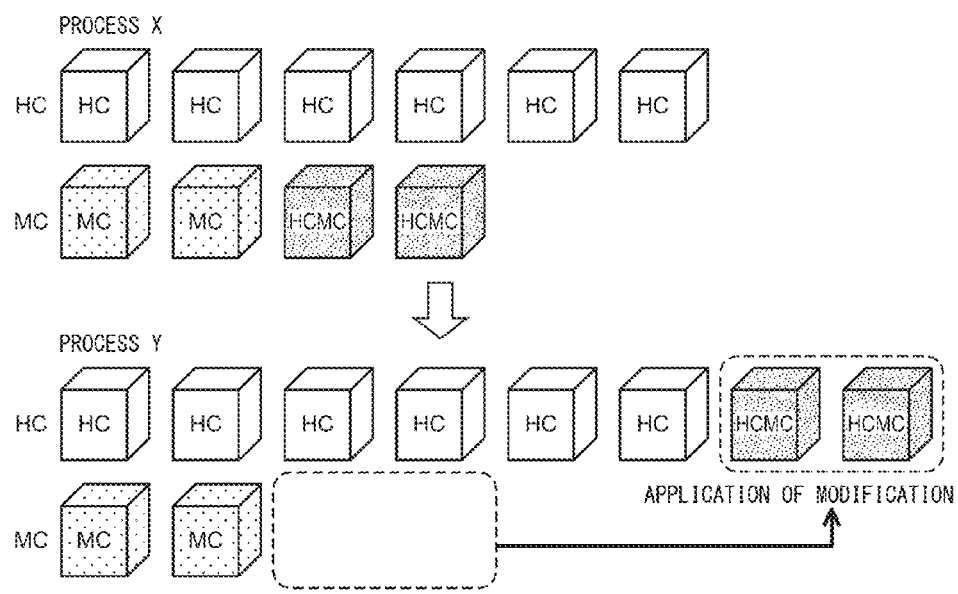
FIG. 14 is a diagram describing the use of an ion implantation apparatus according to an embodiment of the present invention.

Next, as illustrated in FIG. 14, it is considered that the device maker uses six HCs, two MCs, and two HCMCs in order to process the process X. In this case, even when the process X is changed to the process Y according to the change in the manufacturing device, the HCMC can be operated as the HC because the HCMC is the process shared machine of the HC and the MC. Therefore, additional equipment installation and non-operation are unnecessary.

As such, there is a great merit when the device maker owns a certain number of HCMCs. This is because the process change of HC and the MC can be absorbed by the HCMC. Also, when some apparatuses cannot be used due to malfunction or maintenance, the HCMC can also be used as the HC or the MC. Therefore, by owning the HCMC, the overall operating rate of the apparatus can be significantly improved.

Also, ultimately, it can be considered that all apparatuses are provided with HCMCs. However, in many cases, it is practical that part of the apparatuses are provided with HCMCs considering a price difference between the HCMC and the HC (or MC) or the utilization of the already owned HC or MC.

Also, when a type of the existing ion implantation apparatus is replaced with other apparatuses having different methods of implanting ions into the wafer in order for an ion implantation process to be performed, it may be difficult to match the implantation characteristics. This is because a beam divergence angle or a beam density may be different even though the energy and dose are matched in two types of ion implantation apparatuses for the ion implantation process. However, the HCMC can process the high-dose high-current ion implantation condition and the medium-dose medium-current ion implantation condition on the same beamline (the same ion beam trajectory). In this way the HCMC can separately use the high-dose high-current ion implantation condition and the medium-dose medium-current ion implantation condition. Therefore, it is expected to facilitate the matching because the change in the implantation characteristics followed by the replacement of the apparatus is sufficiently suppressed.

The HCMC is the shared machine of the HC and the MC and can also process the implantation condition out of the operation range of the existing HC or the MC. As illustrated in FIG. 11, the HCMC is a new apparatus that can also process the high energy/high dose implantation (right upper region F in the range D) and low energy/low dose implantation (left lower region G in the range D). Therefore, in addition or alternative to the first beamline setting S1 and the second beamline setting S2 described above, in an embodiment, the ion implantation apparatus may include a third beamline setting for high energy/high dose implantation and/or a fourth beamline setting for low energy/low dose implantation.

As described above, in the present embodiment, the beam lines of the serial-type high-dose high-current ion implantation apparatus and the serial-type medium-dose medium-current ion implantation apparatus are matched and shared. Moreover, a structure for switching the beamline configuration is constructed. In this manner, the implantation processing is possible over a broad range of energy and beam current regions on the same beamline (the same ion beam trajectory and the same implantation method).

The present invention has been described based on the embodiments. The present invention is not limited to the embodiments, and it can be understood by those skilled in the art that designs can be modified in various ways, various modifications can be made, and such modifications fall within the scope of the present invention.

In addition or alternative to the above-described configurations, the quantitative adjustment of the beam current by the beam current adjustment system can be configured in various ways. For example, when the beam current adjustment system includes a variable-width aperture arranged on the beamline, the variable-width aperture may be disposed at any arbitrary position. Therefore, the variable-width aperture may be disposed between the ion source and the mass analysis magnet, between the mass analysis magnet and the mass analysis slit, between the mass analysis slit and the beam shaping device, between the beam shaping device and the beam control device, between the beam control device and the beam conditioning device, between the respective elements of the beam conditioning device, and/or between the beam conditioning device and the workpiece. The variable-width aperture may be the mass analysis slit.

The beam current adjustment may be configured to adjust the amount of ion beam passing through the aperture by arranging the divergence/convergence lens system before and/or after a fixed-width aperture. The fixed-width aperture may be the mass analysis slit.

The beam current adjustment may be performed using an energy slit opening width variable (and/or a beamline end opening width variable slit apparatus). The beam current adjustment may be performed using an analyzer magnet (mass analysis magnet) and/or a steerer magnet (trajectory modification magnet). The dose amount adjustment may be accompanied by an expansion of the variable range of mechanical scan speed (for example, from ultra-low speed to ultra-high speed) and/or a change in the number of times of the mechanical scanning.

The beam current adjustment may be performed by the adjustment of the ion source (for example, amount of gas or arc current). The beam current adjustment may be performed by the exchange of the ion source. In this case, the ions source for MC and the ion source for HC may be selectively used. The beam current adjustment may be performed by the gap adjustment of the extraction electrode of the ion source. The beam current adjustment may be performed by providing the CVA immediately downstream of the ion source.

The beam current adjustment may be performed according to the change in the vertical width of the ribbon beam. The dose amount adjustment may be performed according to the change in the scanning speed during the two-dimensional mechanical scanning.

The beamline device may include a plurality of beamline components configured to operate under only one of the first beamline setting and the second beamline setting, and thus, the ion implantation apparatus may be configured as a high-current ion implantation apparatus or a medium-current ion implantation apparatus. That is, with the HCMC as a platform, for example, by exchanging some beamline components, or changing the power supply configuration, the serial-type high-dose dedicated ion implantation apparatus or the serial-type medium-dose dedicated ion implantation apparatus can be produced from the serial-type high-dose medium-dose wide-use ion implantation apparatus. Since it is expected to manufacture each dedicated apparatus at lower cost than the wide-use apparatus, it can contribute to reducing the manufacturing costs for the device maker.

In the MC, implantation at higher energy may be achieved by using multivalent ions such as divalent ions or trivalent ions. However, in the typical ion source (thermionic emission type ion source), the generation efficiency of multivalent ions is much lower than the generation efficiency of monovalent ions. Therefore, practical dose implantation in the high energy range is actually difficult. When a multivalent ion enhancement source, such as an RF ion source, is employed as the ion source, tetravalent or pentavalent ions can be obtained. Therefore, more ion beams can be obtained in the higher energy condition.

Therefore, by employing the multivalent ion enhancement source, such as the RF ion source, as the ion source, the HCMC can operate as the serial-type high energy ion implantation apparatus (HE). Therefore, a portion of the implantation condition that has been processed by only the serial-type high energy/low-dose ion implantation apparatus can be processed by the HCMC (the range of the MC illustrated in FIG. 8 may be expanded to include at least a portion of the range C).

Hereinafter, several aspects of the present invention will be described.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the beamline device supplies the ion beam having a beam irradiation region exceeding the width of the workpiece in the implantation processing chamber, the implantation processing chamber includes a mechanical scanning device for mechanically scanning the workpiece with respect to the beam irradiation region, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the ion implantation apparatus is configured to irradiate the workpiece with the ion beam in cooperation with mechanical scanning of the workpiece, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

The beamline device may take the same implantation method in the first implantation setting configuration and the second implantation setting configuration. The beam irradiation region may be equal in the first implantation setting configuration and the second implantation setting configuration.

The beamline apparatus may include a beam conditioning device for conditioning the ion beam, and a beam shaping device for shaping the ion beam. The beam conditioning device and the beam shaping device in the beamline device may be disposed in the same layout in the first implantation setting configuration and the second implantation setting configuration. The beam implantation apparatus may have the same installation floor area in the first implantation setting configuration and the second implantation setting configuration.

The beamline device may include a beam current adjustment system for adjusting the total amount of beam current of the ion beam. The first implantation setting configuration may include a first beam current setting for the beam current adjustment system, the second implantation setting configuration may include a second beam current setting for the beam current adjustment system, and the second beam current setting may be determined to make the beam current of the ion beam smaller than that of the first beam current setting.

The beam current adjustment system may be configured to block at least a portion of the ion beam when passing through an adjustment element. The beam current adjustment system may include a variable-width aperture arranged on the beamline. The beam current adjustment system may include a beamline end opening width variable slit device. The ion source may be configured to adjust the total amount of beam current of the ion beam. The ion source may include an extraction electrode for extracting the ion beam, and the total amount of beam current of the ion beam may be adjusted by adjusting an opening of the extraction electrode.

The beamline device may include an energy adjustment system for adjusting an implantation energy of the ions into the workpiece. The first implantation setting configuration may include a first energy setting for the energy adjustment system, the second implantation setting configuration may include a second energy setting for the energy adjustment system, the first energy setting may be suitable for transport of a lower energy beam as compared with the second energy setting.

The energy adjustment system may include a beam parallelizing device for parallelizing the ion beam. The beam parallelizing device may be configured to decelerate, or decelerate and accelerate the ion beam under the first implantation setting configuration, and accelerate, or accelerate and decelerate the ion beam under the second implantation setting configuration. The beam parallelizing device may include an acceleration lens for accelerating the ion beam, and a deceleration lens for decelerating the ion beam, and may be configured to modify a distribution of acceleration and deceleration, and the beam parallelizing device may be configured to mainly decelerate the ion beam under the first implantation setting configuration, and mainly accelerate the ion beam under the second implantation setting configuration.

The beamline device may include a beam current adjustment system for adjusting the total amount of beam current of the ion beam, and an energy adjustment system for adjusting an implantation energy of the ions into the workpiece, and may adjust the total amount of the beam current and the implantation energy individually or simultaneously. The beam current adjustment system and the energy adjustment system may be separate beamline components.

The ion implantation apparatus may include a control unit configured to manually or automatically select one implantation setting configuration suitable for a given ion implantation condition among the plurality of implantation setting configurations including the first implantation setting configuration and the second implantation setting configuration.

The control unit may select the first implantation setting configuration when a desired ion dose amount implanted into the workpiece is in the range of about $1 \times 10^{14}$ to $1 \times 10^{17}$ atoms/cm$^2$, and may select the second implantation setting configuration when a desired ion dose amount implanted into the workpiece is in the range of about $1 \times 10^{11}$ to $1 \times 10^{14}$ atoms/cm$^2$.

The beamline device may have a first energy adjustment range under the first implantation setting configuration, and may have a second energy adjustment range under the second implantation setting configuration, and the first energy adjustment range and the second energy adjustment range may have a partially overlapped range.

The beamline device may have a first dose adjustment range under the first implantation setting configuration, and may have a second dose adjustment range under the second implantation setting configuration, and the first dose adjustment range and the second dose adjustment range may have a partially overlapped range.

The beamline device may include a beam scanning device for providing scanning of the ion beam to form an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The beamline device may include a ribbon beam generator for generating a ribbon beam having an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The implantation processing chamber may include a workpiece holder configured to provide mechanical scanning of the workpiece in two directions perpendicular to each other in a plane perpendicular to the beam transportation direction.

The beamline device may be configured to be selectable from a plurality of beamline components configured to be operated under only one of the first implantation setting configuration and the second implantation setting configuration, and the ion implantation apparatus may be configured as a high-current dedicated ion implantation apparatus or a medium-current dedicated ion implantation apparatus.

An ion implantation method according to an embodiment includes: selecting one implantation setting configuration, with respect to a beamline device, which is suitable for a given ion implantation condition among a plurality of implantation setting configurations including a first implantation setting configuration suitable for transport of a low energy/high current beam for high-dose implantation into a workpiece, and a second implantation setting configuration suitable for transport of a high energy/low current beam for low-dose implantation into the workpiece; transporting an ion beam along a beam center trajectory being a reference in a beamline from an ion source to an implantation processing chamber by using the beamline device under the selected implantation setting configuration; and irradiating the workpiece with the ion beam in cooperation with mechanical scanning of the workpiece, wherein the beam center trajectory being the reference is equal in the first implantation setting configuration and the second implantation setting configuration.

The transporting may include adjusting an implantation dose amount into the workpiece by adjusting the total amount of beam current of the ion beam. The implantation dose amount may be adjusted in a first dose adjustment range under the first implantation setting configuration, and may be adjusted in a second dose adjustment range under the second implantation setting configuration, the second dose adjustment range including a dose range smaller than the first dose adjustment range.

The transporting may include adjusting the implantation energy into the workpiece. The implantation energy may be adjusted in a first energy adjustment range under the first implantation setting configuration, and may be adjusted in a second energy adjustment range under the second implantation setting configuration, the second energy adjustment range including an energy range higher than the first energy adjustment range.

1. An ion implantation apparatus according to an embodiment has the same beam trajectory and the same implantation method and has a broad energy range by switching a connection of a power supply for deceleration as a whole and a connection of a power supply for acceleration as a whole.

2. An ion implantation apparatus according to an embodiment has the same beam trajectory and the same implantation method and has a broad beam current range by including a device for cutting a portion of beam in a beamline upstream part in a beamline capable of obtaining a high current.

3. An ion implantation apparatus according to an embodiment may have the same beam trajectory and the same implantation method and have a broad energy range and a broad beam current range by including both of the features of the embodiment 1 and the embodiment 2.

An ion implantation apparatus according to an embodiment may be an apparatus that combines a beam scanning and a mechanical wafer scanning as the same implantation method in the embodiments 1 to 3. An ion implantation apparatus according to an embodiment may be an apparatus that combines a ribbon-shaped beam and a mechanical wafer scanning as the same implantation method in the embodiments 1 to 3. An ion implantation apparatus according to an embodiment may be an apparatus that combines a two-dimensional mechanical wafer scanning as the same implantation method in the embodiments 1 to 3.

4. An ion implantation apparatus according to an embodiment is configured to freely select/switch a high-dose high-current ion implantation and a medium-dose medium-current ion implantation by configuring a high-dose high-current ion implantation beamline component and a medium-dose medium-current ion implantation beamline component in parallel on the same beamline (the same ion beam trajectory and the same implantation method), and covers a very broad energy range from low energy to high energy and a very broad dose range from a low dose to a high dose.

5. In the embodiment 4, each beamline component shared in the high dose use and the medium dose use and each beamline component individually switched in the high dose/medium dose use may be configured on the same beamline.

6. In the embodiment 4 or 5, in order to adjust the beam current amount in a broad range, a beam limiting device (vertical or horizontal variable-width slit, or rectangular or circular variable opening) for physically cutting a portion of beam in a beamline upstream part may be provided.

7. In any one of the embodiments 4 to 6, a switch controller control device may be provided to select a high-dose high-current ion implantation and a medium-dose medium-current ion implantation, based on a desired ion dose amount implanted into the workpiece.

8. In the embodiment 7, the switch controller is configured to operate the beamline in a medium-dose acceleration (extraction)/acceleration (P lens)/acceleration or deceleration (AD column) mode when a desired ion dose amount implanted into the workpiece is in the medium-dose medium-current range of about $1 \times 10^{11}$ to $1 \times 10^{14}$ atoms/cm$^2$, and operate the beamline in a high-dose acceleration (extraction)/deceleration (P lens)/deceleration (AD column) mode when a desired ion dose amount implanted into the workpiece is in the high-dose high-current range of about $1 \times 10^{14}$ to $1 \times 10^{17}$ atoms/cm$^2$.

9. In any one of the embodiments 4 to 8, an apparatus for implanting ions of relatively high energy by using an acceleration mode and an apparatus for implanting ions of relatively low energy by using a deceleration mode may have a mutually overlapped energy range.

10. In any one of the embodiments 4 to 8, an apparatus for implanting ions of relatively high energy by using an acceleration mode and an apparatus for implanting ions of relatively low energy by using a deceleration mode may have a mutually overlapped dose range.

11. In any one of the embodiments 4 to 6, by limiting the beamline components, the ion implantation apparatus may easily be changed to a high-dose high-current dedicated ion implantation apparatus or a medium-dose medium-current dedicated ion implantation apparatus.

12. In anyone of the embodiments 4 to 11, the beamline configuration may combine a beam scanning and a mechanical substrate scanning.

13. In anyone of the embodiments 4 to 11, the beamline configuration may combine a mechanical substrate scanning and a ribbon-shaped beam having a width equal to or greater than a width of a substrate (or wafer or workpiece).

14. In anyone of the embodiments 4 to 11, the beamline configuration may include a mechanical substrate scanning in a two-dimensional direction.

Figure 15:
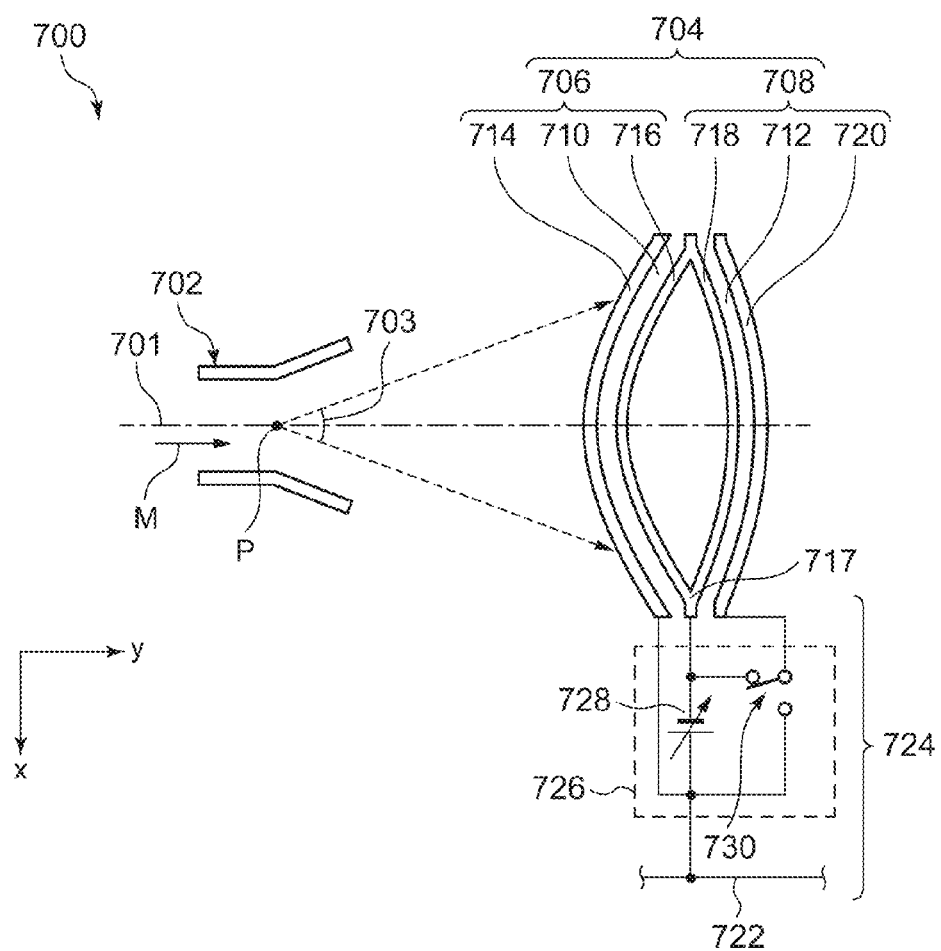
FIG. 15 is a diagram illustrating a schematic configuration of an ion implantation apparatus according to an embodiment of the present invention.

FIG. 15 is a diagram illustrating a schematic configuration of an ion implantation apparatus 700 according to an embodiment of the present invention. The ion implantation apparatus 700 includes a beam scanning unit 702 and a beam parallelizing unit 704. The beam scanning unit 702 is provided on the upstream side of the beam parallelizing unit 704 in a beam transportation direction. In FIG. 15, the beam transportation direction is indicated by an arrow M. For convenience of description, the beam transportation direction will be referred to as y-direction, and a scanning direction perpendicular to the beam transportation direction will be referred to as x-direction.

The beam scanning unit 702 performs scanning of an ion beam, that is incident from the upstream side, over a scanning angle range 703 at a focus position P. The scanning angle range 703 is equally spread on both sides of a "beam center trajectory being a reference" (hereinafter, also referred to as a "reference trajectory"). In FIG. 15, the reference trajectory 701 is indicated by a dashed-dotted line. Generally, the ion beam is deflected from the reference trajectory 701 at the focus position P. It should be appreciated that, in an embodiment where an ion beam is not scanned, such an unscanned ion beam is diverged from a convergence point of the beam (e.g., a mass analysis slit) to be directed away from the reference trajectory 701. The scanning angle range 703 is determined so that the ion beam (indicated by a dashed arrow in FIG. 15) taking a maximum deflection angle is incident on an x-direction end portion of the beam parallelizing unit 704.

The scanned ion beam exits from the beam scanning unit 702. The ion beam has an angle to the reference trajectory 701. The beam parallelizing unit 704 deflects the scanned ion beam so as to be parallel to the reference trajectory 701. The parallelized ion beam, as described above, has an elongated irradiation region extending in the scanning direction (x-direction).

The basic configuration of the ion implantation apparatus 700 according to the present embodiment is substantially identical to that of the ion implantation apparatus 100 (see FIG. 2) or the ion implantation apparatus 200 (see FIG. 5) according to the respective embodiments described above. Thus, each of the beam scanning unit 702 and the beam parallelizing unit 704 may be a component of the beamline device 104 of the ion implantation apparatus 100. As described above, the beam scanning unit 702 may be a beam scanning device that scans a spot ion beam, and the beam parallelizing unit 704 may be an electrostatic beam parallelizing device. Also, the beam scanning unit 702 and the beam parallelizing unit 704 may be the scanner 209 and the beam parallelizing mechanism 211 of the ion implantation apparatus 200, respectively.

The beam parallelizing unit 704 includes a double P lens. The double P lens includes an acceleration lens 706, and a deceleration lens 708 disposed adjacent to the acceleration lens 706 in the beam transportation direction. The acceleration lens 706 and the deceleration lens 708 are disposed in this order from the upstream side in the beam transportation direction. Hereinafter, the acceleration lens and the deceleration lens will be also referred to as an acceleration P lens and a deceleration P lens, respectively.

Each of the acceleration lens 706 and the deceleration lens 708 includes a portion that is curved in a bow shape symmetrical upward and downward in the x-direction from the reference trajectory 701. The bow-shaped portion of the acceleration lens 706 is convex toward the upstream side. The bow-shaped portion of the acceleration lens 706 is curved from the reference trajectory 701 to the x-direction upper end portion of the acceleration lens 706 that is directed toward the downstream of the beam transportation direction, and is curved from the reference trajectory 701 to the x-direction lower end portion of the acceleration lens 706 that is directed toward the downstream of the beam transportation direction. The bow-shaped portion of the deceleration lens 708 is convex toward the downstream side. The bow-shaped portion of the deceleration lens 708 is curved from the reference trajectory 701 to the x-direction upper end portion of the deceleration lens 708 that is directed toward the upstream of the beam transportation direction, and is curved from the reference trajectory 701 to the x-direction lower end portion of the deceleration lens 708 that is directed toward the upstream of the beam transportation direction. These bow-shaped portions intersect almost perpendicular to the reference trajectory 701.

The curvature of the acceleration lens 706 is smaller than a semicircle whose radius is the x-direction length from the reference trajectory 701 to the x-direction upper end portion (or lower end portion) of the acceleration lens 706. Therefore, the y-direction length of the acceleration lens 706 is shorter than the x-direction length from the reference trajectory 701 to the x-direction upper end portion (or lower end portion) of the acceleration lens 706. Likewise, the curvature of the deceleration lens 708 is smaller than a semicircle, the radius of which is the x-direction length from the reference trajectory 701 to the x-direction upper end portion (or lower end portion) of the deceleration lens 708. Therefore, the y-direction length of the deceleration lens 708 is shorter than the x-direction length from the reference trajectory 701 to the x-direction upper end portion (or lower end portion) of the deceleration lens 708.

As illustrated, the curvature of the deceleration lens 708 is smaller than the curvature of the acceleration lens 706. Therefore, the length of the deceleration lens 708 in the beam transportation direction (y-direction) is shorter than the length of the acceleration lens 706 in the beam transportation direction.

In the present embodiment, an operation mode to use only one P lens of the double P lens is set as described below. The shape of the P lens is designed to parallelize the ion beam in such a solo operation mode. According to the present embodiment, the curvature of the P lens on one side of the double P lens is made smaller than the curvature of the P lens on the other side. Thus, as compared with a case where both of the P lenses are designed to have the same curvature, the length (y-direction width) of the double P lens in the beam transportation direction can be more reduced. Therefore, it is possible to reduce the divergence of the ion beam generated by the space charge effect while the ion beam passes through the double P lens.

The acceleration lens 706 includes an acceleration gap 710 curved in a bow shape. The deceleration lens 708 includes a deceleration gap 712 curved in a bow shape. The acceleration gap 710 is convex toward the upstream side, and the deceleration gap 712 is convex toward the downstream side. Both of the convex portion of the acceleration gap 710 and the convex portion of the deceleration gap 712 are located on the reference trajectory 701. As illustrated, the curvature of the deceleration gap 712 is smaller than the curvature of the acceleration gap 710.

In order to form the acceleration gap 710, the acceleration lens 706 includes a pair of acceleration electrodes, that is, an acceleration entrance electrode 714 and an acceleration exit electrode 716. Each of the acceleration entrance electrode 714 and the acceleration exit electrode 716 is an electrode member having an elongated opening in the x-direction so as to allow the passage of the ion beam. The acceleration entrance electrode 714 and the acceleration exit electrode 716 are disposed spaced apart from each other so as to apply different potentials. Thus, the acceleration gap 710 is defined between the trailing edge of the acceleration entrance electrode 714 and the leading edge of the acceleration exit electrode 716. The trailing edge of the acceleration entrance electrode 714 and the leading edge of the acceleration exit electrode 716 correspond to the above-described bow-shaped portion.

When a lower potential is applied to the acceleration exit electrode 716 than the acceleration entrance electrode 714, an electric field for accelerating the ion beam is generated in the acceleration gap 710. The acceleration electric field has a component for deflecting the ion beam as well as a component for accelerating the ion beam. The acceleration lens 706 is configured to direct the traveling direction of the ion beam to the direction parallel to the reference trajectory 701 due to the deflection component.

Also, in order to form the deceleration gap 712, the deceleration lens 708 includes a pair of deceleration electrodes, that is, a deceleration entrance electrode 718 and a deceleration exit electrode 720. Each of the deceleration entrance electrode 718 and the deceleration exit electrode 720 is an electrode member having an elongated opening in the x-direction so as to allow the passage of the ion beam. The deceleration entrance electrode 718 and the deceleration exit electrode 720 are disposed spaced apart from each other so as to apply different potentials. Thus, the deceleration gap 712 is defined between the trailing edge of the deceleration entrance electrode 718 and the leading edge of the deceleration exit electrode 720. The trailing edge of the deceleration entrance electrode 718 and the leading edge of the deceleration exit electrode 720 correspond to the above-described bow-shaped portion.

The curvatures of the trailing edge of the deceleration entrance electrode 718 and the leading edge of the deceleration exit electrode 720 are smaller than the curvatures of the trailing edge of the acceleration entrance electrode 714 and the leading edge of the acceleration exit electrode 716. Therefore, the y-direction distance between the x-direction center portion and the x-direction end portion of the trailing edge of the deceleration entrance electrode 718 is shorter than the y-direction distance between the x-direction center portion and the x-direction end portion of the trailing edge of the acceleration entrance electrode 714. Likewise, the y-direction distance between the x-direction center portion and the x-direction end portion of the leading edge of the deceleration exit electrode 720 is shorter than the y-direction distance between the x-direction center portion and the x-direction end portion of the leading edge of the acceleration exit electrode 716.

When a higher potential is applied to the deceleration exit electrode 720 than the deceleration entrance electrode 718, an electric field for decelerating the ion beam is generated in the deceleration gap 712. The deceleration electric field has a component for deflecting the ion beam as well as a component for decelerating the ion beam. The deceleration lens 708 is configured to direct the traveling direction of the ion beam to the direction parallel to the reference trajectory 701 due to the deflection component.

The acceleration exit electrode 716 and the deceleration entrance electrode 718 are electrically connected together so as to apply the same potential. In the present embodiment, the acceleration exit electrode 716 and the deceleration entrance electrode 718 are formed in a single electrode member. The single electrode member may be referred to as an intermediate electrode member 717. As illustrated, both end portions of the acceleration exit electrode 716 in the beam scanning direction (x-direction) may be connected to both end portions of the deceleration entrance electrode 718 in the beam scanning direction. In another embodiment, the acceleration exit electrode 716 and the deceleration entrance electrode 718 may be formed in separate members.

As described above, an energy setting used for a particular ion implantation process is selected from a plurality of energy settings according to given ion implantation conditions. The plurality of energy settings includes a first energy setting suitable for transport of a low energy ion beam, and a second energy setting suitable for transport of a high energy ion beam. Like the above-described embodiment, the first energy setting will be referred to as a low energy mode, and the second energy setting will be referred to as a high energy mode.

The ion implantation apparatus 700 includes a beam transport unit 722, and a high-voltage power supply system 724 configured to apply a potential to the beam transport unit 722. The beam transport unit 722 is the potential reference of the beam parallelizing unit 704.

The high-voltage power supply system 724 includes a third power supply unit 726 and is configured to apply a reference potential to the third power supply unit 726. The high-voltage power supply system 724 is configured to apply a second reference potential to the third power supply unit 726 under the second energy setting, and apply a first reference potential to the third power supply unit 726 under the first energy setting. The first reference potential is different from the second reference potential. The second reference potential is, for example, a potential that is positive with respect to a ground potential. The first reference potential is, for example, a potential that is negative with respect to the ground potential. The third power supply unit 726 is configured to apply the potential to at least one electrode of the beam parallelizing unit 704, with the beam transport unit 722 as the potential reference.

In another embodiment, the second reference potential may be a potential that is negative with respect to the ground potential. Also, the first reference potential may be a potential that is positive with respect to the ground potential. Each of the first reference potential and the second reference potential is appropriately determined according to given implantation conditions including implantation energy, for example.

The high-voltage power supply system 724 may have a configuration similar to the above-described high-voltage power supply system 230 (see FIGS. 6 and 7) in portions other than the third power supply unit 726. Therefore, the high-voltage power supply system 724 may include, for example, the first power supply unit 231 and the second power supply unit 232.

Like the third power supply unit 233 (see FIGS. 6 and 7), the third power supply unit 726 is configured to operate the beam parallelizing unit 704 under any one of the plurality of energy settings. The third power supply unit 726 is configured to generate a potential difference in at least the acceleration lens 706 under the second energy setting, and generate a potential difference in at least the deceleration lens 708 under the first energy setting.

The beam transport unit 722 may be the beamline device 104 (see FIG. 2), or may include one or more of beamline components illustrated in FIG. 5. The beam transport unit 722 may include the terminal 216 (see FIGS. 6 and 7). In this case, the third power supply unit 726 may be configured to apply the potential to at least one electrode of the beam parallelizing unit 704, with the terminal 216 as the potential reference.

The third power supply unit 726 includes a common power supply 728 for the acceleration lens 706 and the deceleration lens 708. The common power supply 728 is a variable DC power supply and is provided between the beam parallelizing unit 704 and the beam transport unit 722. A voltage that the common power supply 728 applies with respect to the reference voltage V0 will be indicated by V (<0).

The common power supply 728 is configured to apply the potential V, which is negative with respect to the reference potential (that is, the beam transport unit 722), to the acceleration exit electrode 716 and the deceleration entrance electrode 718. The negative terminal of the common power supply 728 is connected to the intermediate electrode member 717. The positive terminal of the common power supply 728 is connected to the reference potential. The acceleration entrance electrode 714 is also connected to the reference potential.

Also, the third power supply unit 726 includes a switch 730. The switch 730 is configured to be switchable between a first state to disconnect the deceleration exit electrode 720 from the common power supply 728 and a second state to connect the deceleration exit electrode 720 to the common power supply 728. The second state is illustrated in FIG. 15. In the first state, the switch 730 connects the deceleration exit electrode 720 to the reference potential. In the second state, the switch 730 connects the deceleration exit electrode 720 to the negative terminal of the common power supply 728.

The switch 730 is switched to the second state under the second energy setting and is switched to the first state under the first energy setting. Therefore, the switch 730 connects the deceleration exit electrode 720 to the common power supply 728 so that the negative potential V is applied to the deceleration exit electrode 720 under the second energy setting. The switch 730 connects the deceleration exit electrode 720 to the reference potential under the first energy setting. The switching process of the third power supply unit 726 may be performed by the control unit 116 (see FIG. 2) as described above.

In this manner, under the second energy setting, the reference potential V0, the potential V0+V, the potential V0+V, and the potential V0+V are applied to the acceleration entrance electrode 714, the acceleration exit electrode 716, the deceleration entrance electrode 718, and the deceleration exit electrode 720, respectively. Therefore, while the acceleration lens 706 operates at the voltage V, the deceleration lens 708 does not operate.

On the other hand, under the first energy setting, the reference potential V0, the potential V0+V, the potential V0+V, and the potential V0 are applied to the acceleration entrance electrode 714, the acceleration exit electrode 716, the deceleration entrance electrode 718, and the deceleration exit electrode 720, respectively. Therefore, the acceleration lens 706 operates at the voltage V, and the deceleration lens 708 operates at the voltage −V.

Although details will be described below, the third power supply unit 726 is configured to apply a second acceleration voltage $V_{AP}$ to the acceleration lens 706 under the second energy setting. The second acceleration voltage $V_{AP}$ is set according to energy $T_{Ai}$ of the ion beam incident on the acceleration lens 706 under the second energy setting. Also, as described above, the third power supply unit 726 is configured to generate no potential difference in the deceleration lens 708 under the second energy setting.

On the other hand, the third power supply unit 726 is configured to apply a first acceleration voltage $V_{AP}'$ to the acceleration lens 706 under the first energy setting. The first acceleration voltage $V_{AP}'$ is set according to energy $T_{Ai}$ of the ion beam incident on the acceleration lens 706 under the first energy setting.

Also, the third power supply unit 726 is configured to apply a first deceleration voltage $V_{DP}$ to the deceleration lens 708 under the first energy setting. Due to the configuration of the third power supply unit 726, the first deceleration voltage $V_{DP}$ and the first acceleration voltage $V_{AP}'$ are equal in magnitude but opposite in sign ($V_{DP}=-D_{AP}'$). Accordingly, the beam parallelizing unit 704 does not accelerate or decelerate the ion beam as a whole. That is, the energy of the ion beam incident on the beam parallelizing unit 704 under the first energy setting is substantially equal to the energy of the ion beam exiting from the beam parallelizing unit 704.

In the present embodiment, the lens shape design of the beam parallelizing unit 704 has two stages. In the first stage, the shape of the acceleration lens 706 is designed. At this time, the shape of the deceleration lens 708 is not considered. Therefore, the shape of the acceleration lens 706 is determined independently of the shape of the deceleration lens 708. In the second stage, the shape of the deceleration lens 708 is designed. To this end, the shape of the acceleration lens 706, which is determined in the first stage, is used. Therefore, the shape of the deceleration lens 708 is determined depending on the shape of the acceleration lens 706.

In the first stage, the shape of the acceleration lens 706 is determined so that the ion beam incident from the focus position P to the acceleration lens 706 is parallelized at a predetermined acceleration/deceleration ratio $R_A$. The design of the acceleration lens 706 can be done using the basic relational expression of the acceleration lens 706. An example of the design will be described below with reference to FIG. 16.

Herein, the acceleration/deceleration ratio $R_A$ during acceleration in the acceleration lens 706 is defined as a ratio of exit energy $T_{Ao}$ to entrance energy $T_{Ai}$ with respect to the acceleration lens 706 (that is, $R_A=T_{Ao}/T_{Ai}$). Using the acceleration/deceleration ratio $R_A$, the potential difference $V_{AP}$ of the acceleration lens 706 is expressed as:

$V_{AP}=(T_{Ai}/q)\times(R_A-1)$, where $q$ represents charge of ion.

By applying the potential difference $V_{AP}$ to the acceleration lens 706 having the designed shape, the ion beam scanned at the focus position P is parallelized by the acceleration lens 706. The beam parallelizing unit 704 can parallelize the ion beam incident from the beam scanning unit 702 by the acceleration lens 706 alone. In this manner, the beam parallelizing unit 704 operates in an acceleration-alone mode.

In the second stage, the shape of the deceleration lens 708 is determined so that the ion beam exiting from the acceleration lens 706 is parallelized. The ion beam used herein is an ion beam that is incident from the focus position P to the acceleration lens 706 and is preliminarily deflected for parallelization (or partially parallelized) at an acceleration/deceleration ratio $R_A'$ smaller than the predetermined acceleration/deceleration ratio $R_A$. The setting of the small acceleration/deceleration ratio $R_A'$ to the acceleration lens 706 corresponds to weakening the deflecting force of the acceleration lens 706. Therefore, under the small acceleration/deceleration ratio $R_A'$, the ion beam that is incident from the focus position P to the acceleration lens 706 and exits from the acceleration lens 706 is on the way to the parallelization and is not completely parallelized.

The shape of the deceleration lens 708 is determined so that the insufficient deflection in the acceleration lens 706 due to the preliminary deflection for parallelization is compensated. That is, the shape of the deceleration lens 708 is determined so that the preliminarily deflected and incompletely parallelized ion beam exiting from the acceleration lens 706 is parallelized at an acceleration/deceleration ratio $R_D$. Herein, the acceleration/deceleration ratio $R_D$ during deceleration in the deceleration lens 708 is defined as a ratio of exit energy $T_{Do}$ to entrance energy $T_{Di}$ with respect to the deceleration lens 708 (that is, $R_D=T_{Do}/T_{Di}$).

Herein, the entrance energy $T_{Di}$ to the deceleration lens 708 is equal to the exit energy $T_{Ao}$ from the acceleration lens 706. Also, in the present embodiment, due to the configuration of the third power supply unit 726, the entrance energy $T_{Ai}$ to the acceleration lens 706 is equal to the exit energy $T_{Do}$ from the deceleration lens 708. Therefore, the acceleration/deceleration ratio $R_D$ of the deceleration lens 708 is equal to the reciprocal of the acceleration/deceleration ratio $R_A'$ of the acceleration lens 706 ($R_D=1/R_A'$).

The design of the deceleration lens 708 can be done using the basic relational expression of the acceleration lens 706 and the basic relational expression of the deceleration lens 708. From the point that the incident angle of the ion beam to the deceleration lens 708 is equal to the exit angle of the ion beam from the acceleration lens 706, the basic relational expression of the acceleration lens 706 and the basic relational expression of the deceleration lens 708 are correlated. An example of the design will be described below with reference to FIG. 16.

The potential difference $V_{AP}'$ of the acceleration lens 706 and the potential difference $V_{DP}$ of the deceleration lens 708 are expressed as:

$V_{AP}'=(T_{Ai}/q)\times(R_A'-1)$ $V_{DP}=(T_{Di}/q)\times(R_D-1)=(T_{Di}/q)\times(1/R_A'-1)$ By applying the potential difference $V_{AP}'$ and the potential difference $V_{DP}$, respectively, to the acceleration lens 706 and the deceleration lens 708 each having the designed shape, the ion beam scanned at the focus position P is parallelized by a combination of the acceleration lens 706 and the deceleration lens 708. The beam parallelizing unit 704 can parallelize the ion beam incident from the beam scanning unit 702 by the cooperation of the acceleration lens 706 and the deceleration lens 708. In this manner, the beam parallelizing unit 704 operates in an acceleration/deceleration mode.

Figure 16:
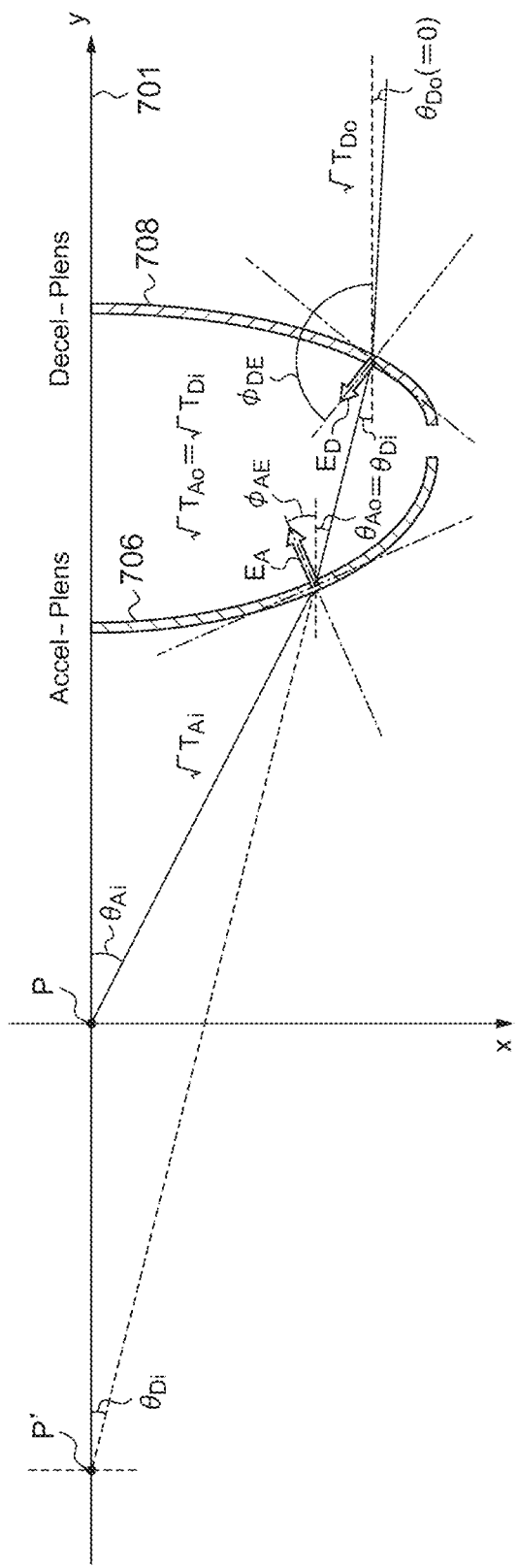
FIG. 16 is a diagram describing an example of a lens shape design according to an embodiment of the present invention.

FIG. 16 is a diagram describing an example of a lens shape design according to an embodiment of the present invention. Since the acceleration P lens 706 and the deceleration P lens 708 are symmetrical to the reference trajectory 701, the lower half from the reference trajectory 701 is illustrated in FIG. 16.

The symbols described in FIG. 16 represent the following:

$T_{Ai}$: entrance energy of acceleration P lens $T_{Ao}$: exit energy of acceleration P lens $T_{Di}$: entrance energy of deceleration P lens $T_{Do}$: exit energy of deceleration P lens $\theta_{Ai}$: incident angle of acceleration P lens $\theta_{Ao}$: output angle of acceleration P lens $\theta_{Di}$: incident angle of deceleration P lens $\theta_{Do}$: output angle of deceleration P lens $\phi_{AE}$: angle between electric field of acceleration P lens and y-axis $\phi_{DE}$: angle between electric field of deceleration P lens and y-axis $E_A$: electric field of acceleration P lens $E_D$: electric field of deceleration P lens The basic relational expression of the acceleration P lens 706 is given by Expression (1).

$$\frac{\sin(\theta_{Ai} - \phi_{AE})}{\sin(\theta_{Ao} - \phi_{AE})} = \sqrt{\frac{T_{Ao}}{T_{Ai}}} = \sqrt{R_A} \quad (1)$$

The relational expression of the deceleration P lens 708 is given by Expression (2).

$$\frac{\sin(\theta_{Di} - \varphi_{DE})}{\sin(\theta_{Do} - \varphi_{DE})} = \sqrt{\frac{T_{Do}}{T_{Di}}} = \sqrt{R_D} \quad (2)$$

Since $\theta_{Ao}=0$ in the acceleration-alone mode, Expression (1) becomes Expression (1').

$$-\frac{\sin(\theta_{Ai} - \phi_{AE})}{\sin\phi_{AE}} = \sqrt{R_A} \quad (1')$$

Therefore, in the first stage of the lens shape design, Expression (1') is used to design the shape of the acceleration P lens 706 so as to produce the electric field $E_A$ of the angle $\phi_{AE}$ applied to the beam of the incident angle $\theta_{Ai}$ at the acceleration/deceleration ratio $R_A$.

In the acceleration/deceleration mode, since $\theta_{Di}=\theta_{Ao}$, $\theta_{Do}=0$, and $R_D=1/R_A'$, Expression (2) becomes Expression (2').

$$-\frac{\sin(\theta_{Ao} - \phi_{DE})}{\sin\phi_{DE}} = \frac{1}{\sqrt{R_A'}} \quad (2')$$

If the product of (1) and (2') is taken by replacing $R_A$ with $R_A'$ in Expression (1), Expression (3) is obtained.

$$-\frac{\sin(\theta_{Ai} - \phi_{AE})}{\sin(\theta_{Ao} - \phi_{AE})} \cdot \frac{\sin(\theta_{Ao} - \varphi_{DE})}{\sin\phi_{DE}} = 1 \quad (3)$$

From Expression (3), $$\tan\theta_{Ao} = \frac{\sin\phi_{DE} \cdot (\sin(\theta_{Ai} - \phi_{AE}) + \sin\phi_{AE})}{\sin(\theta_{Ai} - \phi_{AE}) \cdot \cos\phi_{DE} + \sin\phi_{DE} \cdot \cos\phi_{AE}} \quad (4)$$

From Expression (4), $$\theta_{Ao} = \tan^{-1}\left(\frac{\sin\phi_{DE} \cdot (\sin(\theta_{Ai} - \phi_{AE}) + \sin\phi_{AE})}{\sin(\theta_{Ai} - \phi_{AE}) \cdot \cos\phi_{DE} + \sin\phi_{DE} \cdot \cos\phi_{AE}}\right) \quad (5)$$

If Expression (5) is substituted into Expression (2'), Expression (6) is obtained.

$$-\frac{\sin\left(\tan^{-1}\left(\frac{\sin\phi_{DE} \cdot (\sin(\theta_{Ai} - \phi_{AE}) + \sin\phi_{AE})}{\sin(\theta_{Ai} - \phi_{AE}) \cdot \cos\phi_{DE} + \sin\phi_{DE} \cdot \cos\phi_{AE}}\right) - \phi_{DE}\right)}{\sin\phi_{DE}} = \frac{1}{\sqrt{R_A'}} \quad (6)$$

Therefore, in the second stage of the lens shape design, Expression (6) is used to design the shape of the deceleration P lens 708 so as to produce the electric field $E_D$ of the angle $\phi_{DE}$ applied to the beam of the incident angle $\theta_{Ai}$ at the acceleration/deceleration ratio $R_A'$. Also, herein, the acceleration/deceleration ratio $R_A$ of the acceleration P lens 706 is $R_A'<R_A$.

So far, the lens shape design has been described with the example of the case where the acceleration lens 706 and the deceleration lens 708 are arranged in this order from the upstream in the beam transportation direction. However, the arrangement of the lenses may be reversed. The present design method can also be applied to the case where the deceleration lens and the acceleration lens are arranged in this order from the upstream in the beam transportation direction. In this case, the deceleration lens is first designed. The shape of the deceleration lens is determined so that the ion beam deflected from the reference trajectory 701 at the focus position P of the beam scanning unit and being incident to the deceleration lens is parallelized at a predetermined acceleration/deceleration ratio. Accordingly, the predetermined acceleration/deceleration ratio is used for the parallelization where only the deceleration lens is used. It should be appreciated that, in an embodiment where an ion beam is not scanned, such an unscanned ion beam is diverged from a convergence point of the beam (e.g., a mass analysis slit) to be directed away from the reference trajectory 701 and then the ion beam is incident into the deceleration lens. Next, the acceleration lens is designed. The shape of the acceleration lens is determined so that the preliminarily deflected ion beam exiting from the deceleration lens is parallelized. Where both of the acceleration lens and the deceleration lens are used for the parallelization, the ion beam exiting from the deceleration lens is an ion beam that is incident from the focus position P to the deceleration lens and is preliminarily deflected for parallelization or partially parallelized at an acceleration/deceleration ratio larger than the predetermined acceleration/deceleration ratio. In the case of the deceleration lens, as opposed to the acceleration lens, the deflecting force is more weakened as the acceleration/deceleration ratio is larger.

Figure 17:
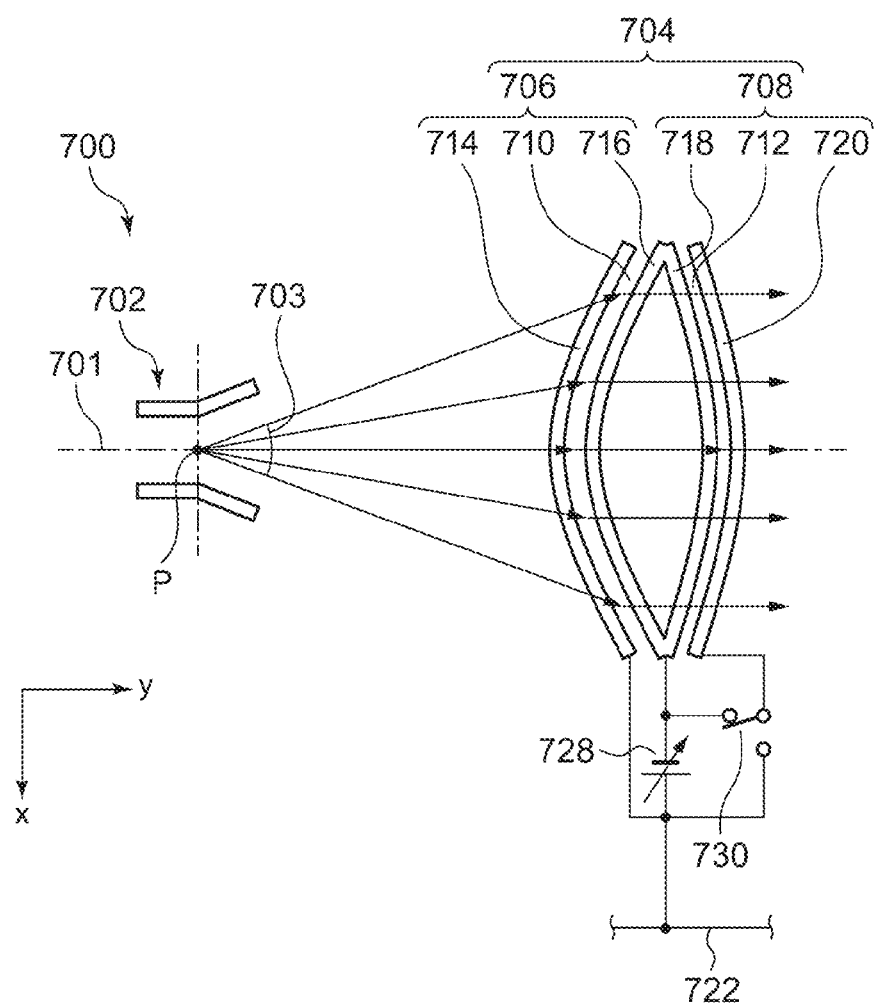
FIG. 17 is a diagram illustrating an operation of an ion implantation apparatus under a second energy setting according to an embodiment of the present invention.

FIG. 17 is a diagram illustrating the operation of the ion implantation apparatus 700 under the second energy setting (high energy mode, acceleration-alone mode) according to an embodiment of the present invention. As illustrated in FIG. 17, the ion beam is incident from the upstream of the beamline to the beam scanning unit 702 and is scanned at the focus position P over the scanning angle range 703. The ion beam is equally spread on both sides of the reference trajectory 701 in this manner and is incident on the beam parallelizing unit 704.

Under the second energy setting, the positive potential V0 is applied to the beam transport unit 722. Depending on the entrance energy $T_{Ai}$ to the beam parallelizing unit 704, the applied voltage $V_{AP}$(<0) of the common power supply 728 is set according to the expression of $V_{AP}=(T_{Ai}/q)\times(R_A-1)$. Therefore, the reference potential V0 and the potential V0+$V_{AP}$ are applied to the acceleration entrance electrode 714 and the acceleration exit electrode 716, respectively, and the acceleration voltage $V_{AP}$ is generated in the acceleration gap 710. Since the switch 730 adopts the second state as illustrated, the deceleration entrance electrode 718 and the deceleration exit electrode 720 are set to the same potential V0+$V_{AP}$, and thus, the potential difference is not generated in the deceleration gap 712. In this manner, the acceleration lens 706 alone operates at the voltage $V_{AP}$ under the second energy setting.

The shape of the acceleration lens 706 is designed such that the ion beam incident from the focus position P to the acceleration gap 710 is parallelized at the acceleration/deceleration ratio $R_A$. Therefore, the beam parallelizing unit 704 can parallelize the ion beam incident from the beam scanning unit 702 by the acceleration lens 706 alone. The parallelized ion beam has an elongated irradiation region extending in the scanning direction (x-direction).

Figure 18:
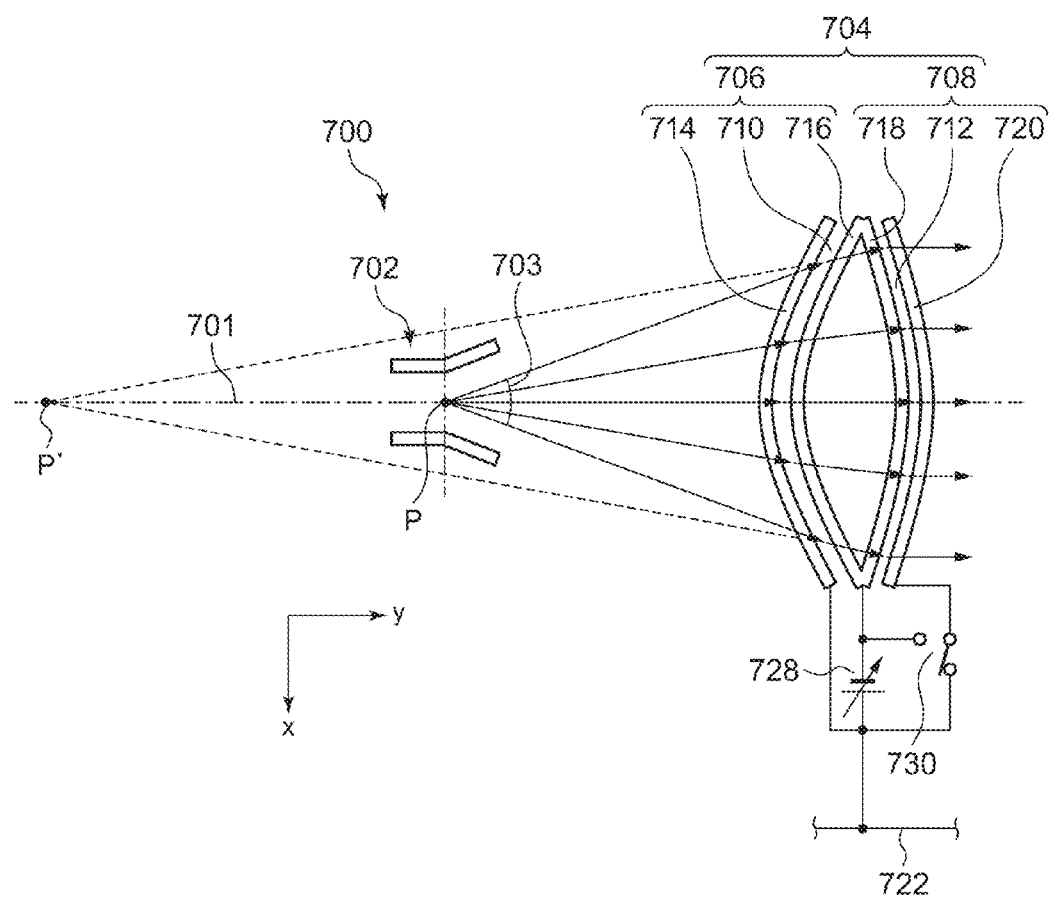
FIG. 18 is a diagram illustrating an operation of an ion implantation apparatus under a first energy setting according to an embodiment of the present invention.

FIG. 18 is a diagram illustrating the operation of the ion implantation apparatus 700 under the first energy setting (low energy mode, acceleration/deceleration mode) according to an embodiment of the present invention. In the present embodiment, the beam scanning unit 702 is configured to scan the ion beam over the scanning angle range 703 in the first energy setting as well as the second energy setting. Therefore, the ion beam is incident from the upstream of the beamline to the beam scanning unit 702 and is scanned at the focus position P in the scanning angle range 703. The scanned ion beam is incident on the beam parallelizing unit 704.

Under the first energy setting, the negative potential V0' (<0) is applied to the beam transport unit 722. Depending on the entrance energy $T_{Ai}$ to the beam parallelizing unit 704, the applied voltage $V_{AP}$' (<0) of the common power supply 728 is set according to the expression of $V_{AP}'=(T_{Ai}/q)\times(R_A'-1)$. Therefore, the reference potential V0' and the potential V0'+$V_{AP}$' are applied to the acceleration entrance electrode 714 and the acceleration exit electrode 716, respectively, and the acceleration voltage $V_{AP}$' is generated in the acceleration gap 710.

The acceleration/deceleration ratio $R_A$' is set such that the acceleration lens 706 does not completely parallelize the ion beam. The ion beam exiting from the acceleration lens 706 is directed toward the deceleration lens 708 at an intermediate angle between the original ion beam incident on the acceleration lens 706 and the completely parallelized ion beam.

Under the first energy setting, the switch 730 adopts the first state. Therefore, the potential V0'+$V_{AP}$' and the reference potential V0' are applied to the deceleration entrance electrode 718 and the deceleration exit electrode 720, respectively, and the deceleration voltage –$V_{AP}$' is generated in the deceleration gap 712. In this manner, under the first energy setting, the acceleration lens 706 operates at the voltage $V_{AP}$', and the deceleration lens 708 operates at the voltage –$V_{AP}$'.

Since the shape of the deceleration lens 708 is designed to compensate the insufficient deflection in the acceleration lens 706, the ion beam exiting from the acceleration lens 706 is parallelized by the deceleration lens 708. Also, if considering the single deceleration lens 708, the deceleration lens 708 parallelizes the ion beam incident from a virtual focus position P' at a predetermined acceleration/deceleration ratio $R_D$. The virtual focus position P' is more upstream than the focus position P (see FIG. 18).

In this manner, the beam parallelizing unit 704 can parallelize the ion beam incident from the beam scanning unit 702 by the cooperation of the acceleration lens 706 and the deceleration lens 708. The parallelized ion beam has an elongated irradiation region extending in the scanning direction (x-direction).

As described above, according to the present embodiment, the relatively simple configuration of the single common power supply 728 and the single switch 730 can realize the switching between two types of parallelizing lenses (that is, switching between the parallelizing by the acceleration lens alone and the parallelizing by the combination of the acceleration lens and the deceleration lens). Also, in the single beam parallelizing unit 704, the two types of the parallelizing lenses can be selected according to the ion implantation conditions (for example, implantation energy).

By the way, while the ion beam is parallelized by the acceleration lens 706 under the acceleration-alone mode, the ion beam is finally parallelized by the deceleration lens 708 under the acceleration/deceleration mode. Since the deceleration lens 708 is disposed downstream of the acceleration lens 706, the width of the ion beam in the scanning direction (x-direction) under the acceleration/deceleration mode is slightly longer than that under the acceleration-alone mode. That is, under the acceleration/deceleration mode, the ion beam is slightly spread in the x-direction during the transportation between the acceleration lens 706 and the deceleration lens 708.

Therefore, the beam scanning unit 702 may be configured to scan the ion beam in different scanning angle ranges in the acceleration-alone mode and the acceleration/deceleration mode from each other, so that the width of the ion beam exiting from the beam parallelizing unit 704 becomes equal in the acceleration-alone mode and the acceleration/deceleration mode. Likewise, the beam scanning unit 702 may be configured to scan the ion beam in different scanning angle ranges in the first energy setting and the second energy setting from each other, so that the width of the ion beam exiting from the beam parallelizing unit 704 becomes equal in the first energy setting and the second energy setting. For example, the beam scanning unit 702 may be configured such that the scanning angle range in the acceleration/deceleration mode (or the first energy setting) is narrower than that in the acceleration-alone mode (or the second energy setting). In this manner, it is possible to adjust the width of the ion beam in the two operation modes.

In the above-described embodiment, the third power supply unit 726 includes the single common power supply 728. However, the third power supply unit 726 may include two power supplies. The third power supply unit 726 may include a first power supply 732 for generating a potential difference in the acceleration lens 706, and a second power supply 734 for generating a potential difference in the deceleration lens 708.

Figure 19:
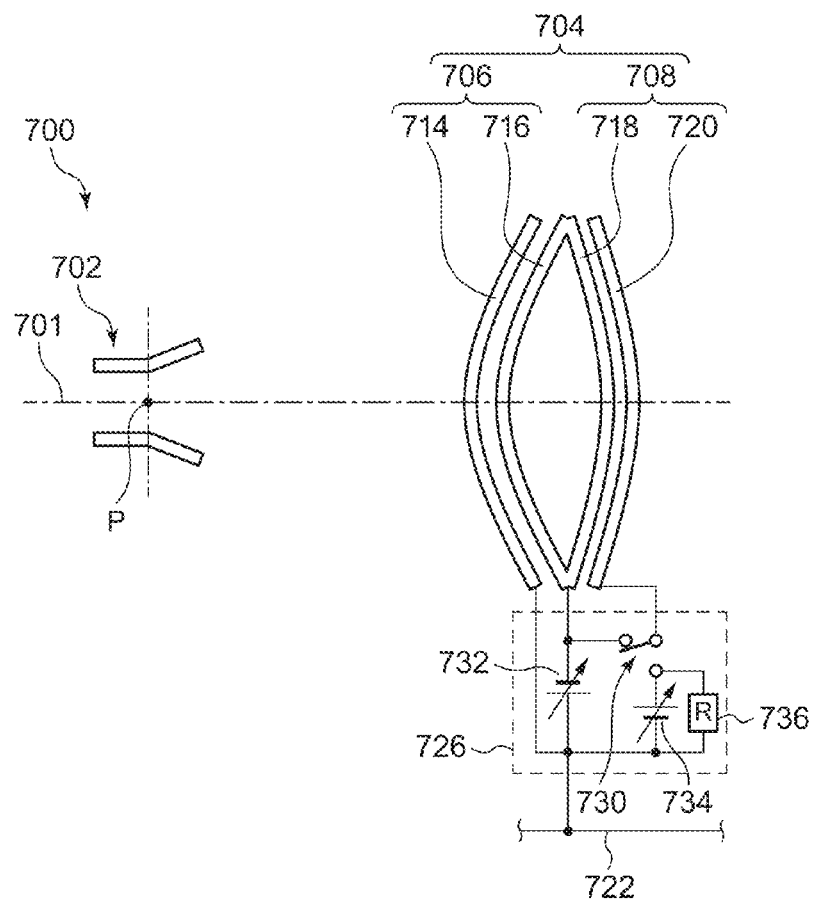
FIG. 19 is a diagram illustrating a schematic configuration of an ion implantation apparatus according to an embodiment of the present invention.

FIG. 19 is a diagram illustrating a schematic configuration of an ion implantation apparatus 700 according to an embodiment of the present invention. The ion implantation apparatus 700 illustrated in FIG. 19 differs from the ion implantation apparatus 700 illustrated in FIG. 15 in view of the configuration of the third power supply unit 726.

The third power supply unit 726 includes a first power supply 732 for the acceleration lens 706 and the deceleration lens 708. The first power supply 732 is configured to apply the potential, which is negative with respect to the reference potential (that is, the beam transport unit 722), to the acceleration exit electrode 716 and the deceleration entrance electrode 718. The positive terminal of the first power supply 732 is connected to the reference potential, and the negative terminal of the first power supply 732 is connected to the acceleration exit electrode 716 and the deceleration entrance electrode 718. The first power supply 732 may be the above-described common power supply 728. The acceleration entrance electrode 714 is connected to the reference potential.

Also, the third power supply unit 726 includes a second power supply 734 for the deceleration lens 708. The second power supply 734 is configured to apply the potential, which is positive with respect to the reference potential, to the deceleration exit electrode 720. A switch 730 is provided between the positive terminal of the second power supply 734 and the deceleration exit electrode 720. The negative terminal of the second power supply 734 is connected to the reference potential.

The switch 730 is configured to be switchable between a first state to connect the deceleration exit electrode 720 to the second power supply 734 and a second state to connect the deceleration exit electrode 720 to the first power supply 732. The second state is illustrated in FIG. 19. The switch 730 is switched to the second state under the second energy setting and is switched to the first state under the first energy setting.

The third power supply unit 726 includes a resistor 736 between the switch 730 and the reference potential. The resistor 736 is provided in parallel to the second power supply 734. The resistor 736 provides a return path of a beam current from the deceleration exit electrode 720 to the reference potential. That is, the resistor 736 is provided for discharging charges that may be accumulated in the deceleration exit electrode 720 when the ion beam is impinged onto the deceleration exit electrode 720. The resistor 736 is the current path that bypasses the second power supply 734.

Since the third power supply unit 726 includes the second power supply 734 separately from the first power supply 732, it is possible to individually adjust the voltages of the first power supply 732 and the second power supply 734. Therefore, the deceleration effect of the deceleration lens 708 can be more increased than the acceleration effect of the acceleration lens 706. Thus, two P lenses can be operated so that the exit energy from the deceleration lens 708 is smaller than the entrance energy to the acceleration lens 706. Therefore, in the acceleration/deceleration mode, the beam parallelizing unit 704 can decelerate the ion beam as a whole.

Figure 20:
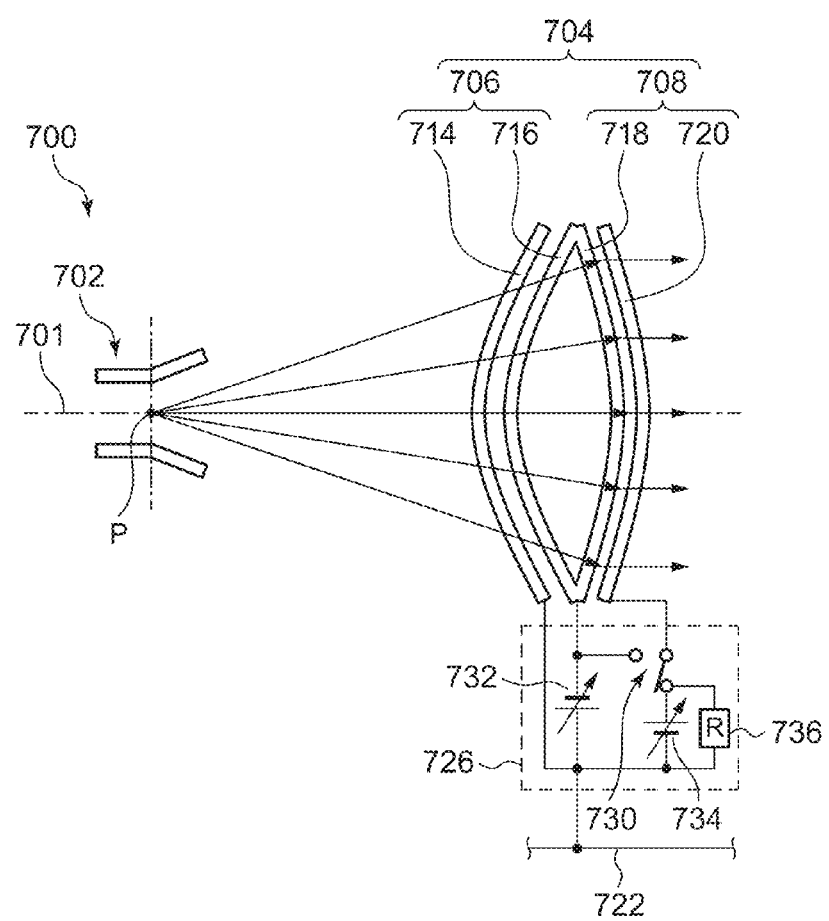
FIG. 20 is a diagram illustrating an operation of an ion implantation apparatus according to an embodiment of the present invention.

Also, according to the present embodiment, it is possible to realize the switching of three types of parallelizing lenses. The beam parallelizing unit 704 can operate in a deceleration-alone mode illustrated in FIG. 20, as well as in the acceleration-alone mode and the acceleration/deceleration mode. In the deceleration-alone mode, like in the acceleration/deceleration mode, the switch 730 is switched to the second power supply 734, and the applied voltage of the first power supply 732 is set to zero. Therefore, the potential difference is not generated in the acceleration lens 706, and the deceleration lens 708 alone operates at the applied voltage of the second power supply 734.

Figure 21:
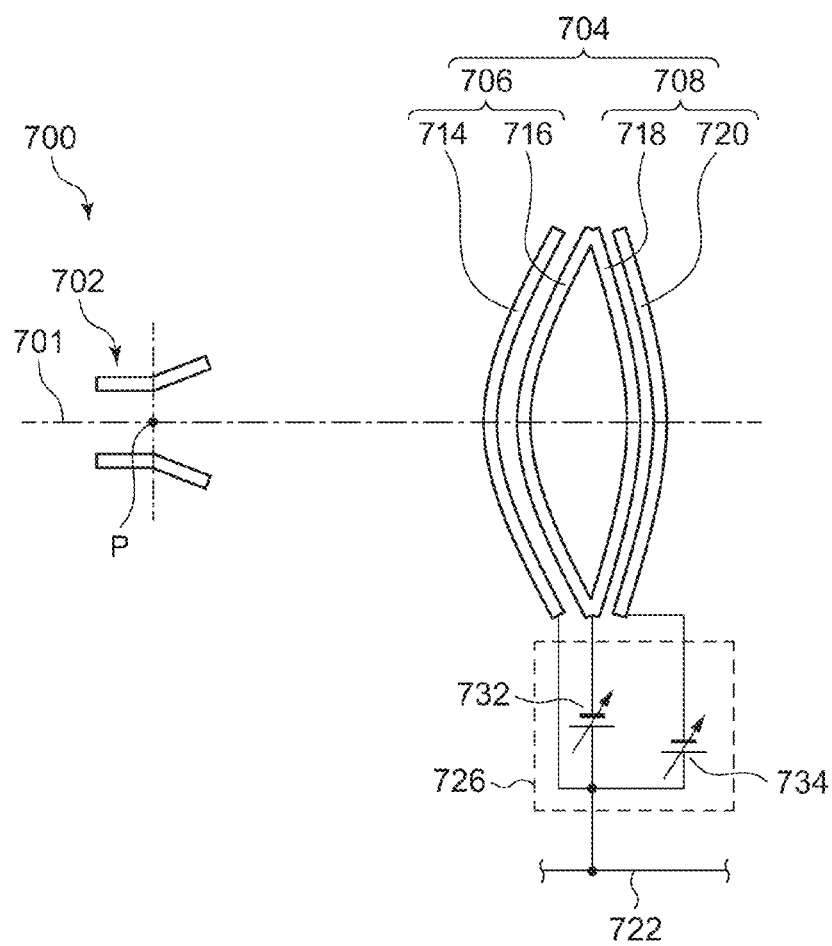
FIG. 21 is a diagram illustrating a schematic configuration of an ion implantation apparatus according to an embodiment of the present invention.

FIG. 21 is a diagram illustrating a schematic configuration of an ion implantation apparatus 700 according to an embodiment of the present invention. The ion implantation apparatus 700 illustrated in FIG. 21 differs from the ion implantation apparatus 700 illustrated in FIGS. 15 to 19 in view of the configuration of the third power supply unit 726.

Like the third power supply unit 726 of FIG. 19, the third power supply unit 726 of FIG. 21 includes a first power supply 732 and a second power supply 734. The first power supply 732 is same in the two embodiments. However, the second power supply 734 of FIG. 21 is connected in a direction opposite to the second power supply 734 of FIG. 19. Also, the third power supply unit 726 of FIG. 21 does not include the switch 730. Thus, the negative terminal of the second power supply 734 is directly connected to the deceleration exit electrode 720.

The third power supply unit 726 is configured to the acceleration-alone mode and the acceleration/deceleration mode by adjusting the applied voltages of the first power supply 732 and the second power supply 734. In the acceleration-alone mode, the first power supply 732 and the second power supply 734 generate the same voltage to be applied. Therefore, the potential difference is not generated in the deceleration lens 708, and the acceleration lens 706 alone operates at the applied voltage of the first power supply 732. In the acceleration/deceleration mode, the applied voltage of the second power supply 734 is set to zero. In this manner, the acceleration lens 706 operates at the applied voltage of the first power supply 732, and the deceleration lens 708 operates at the applied voltage of the second power supply 734.

According to an embodiment, the beam parallelizing unit 704 may include a pair of first electrodes forming a first gap curved in a bow shape between the electrodes, and a pair of second electrodes forming a second gap curved in a bow shape between the electrodes. The pair of first electrodes may be disposed upstream of the pair of second electrodes. The curvature of the second gap may be smaller than the curvature of the first gap. As described above, the pair of first electrodes may constitute the acceleration lens 706, and the pair of second electrodes may constitute the deceleration lens 708.

Alternatively, according to another embodiment, the pair of first electrodes may constitute the deceleration lens, and the pair of second electrodes may constitute the acceleration lens. In this case, the beam parallelizing unit 704 can provide the deceleration-alone mode (parallelizing by the deceleration lens alone) and the deceleration/acceleration mode (parallelizing by the combination of the deceleration lens and the acceleration lens).

In the above-described embodiments, the ion implantation apparatus 700 includes the beam scanning unit 702 and the beam parallelizing unit 704. However, according to another embodiment, the ion implantation apparatus 700 may include a ribbon beam generator instead of the beam scanning unit 702. The ribbon beam generator may be configured to generate a fan-shaped ribbon beam by diverging an ion beam in a fan shape. The beam parallelizing unit 704 may be configured to parallelize the fan-shaped ribbon beam.

Figure 22A:
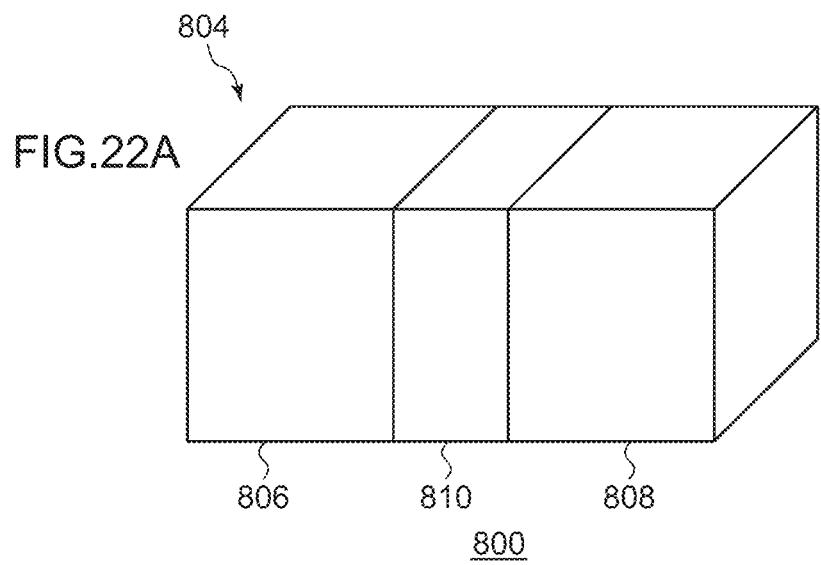
FIG. 22A is a diagram schematically illustrating an external appearance of a beam parallelizing unit of an ion implantation apparatus according to an embodiment of the present invention.
Figure 22B:
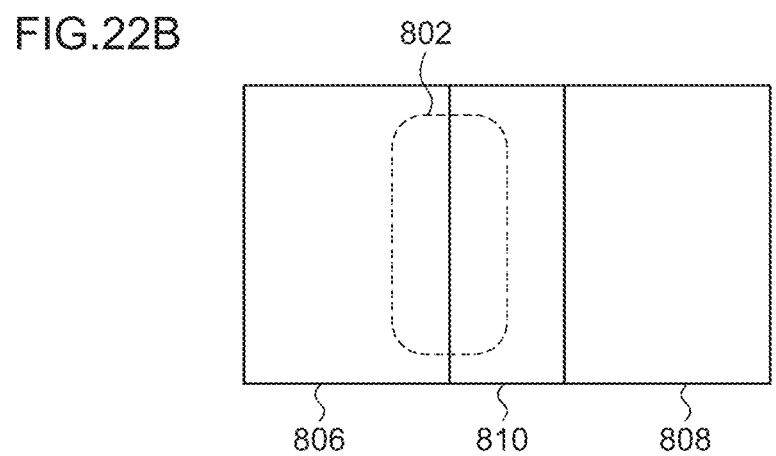
FIG. 22B is a schematic top view of a beam parallelizing unit according to an embodiment of the present invention.
Figure 22C:
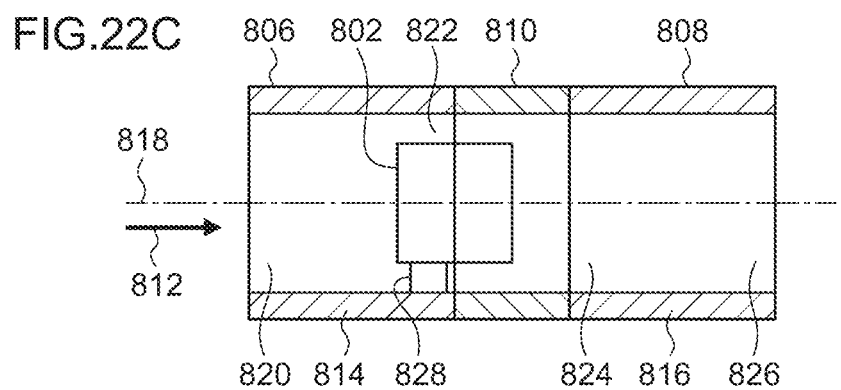
FIG. 22C is a schematic sectional side view of a beam parallelizing unit according to an embodiment of the present invention.

FIG. 22A is a diagram schematically illustrating an external appearance of a beam parallelizing unit 800 of an ion implantation apparatus according to an embodiment of the present invention. FIG. 22B is a schematic top view of a beam parallelizing unit 800 according to an embodiment of the present invention. FIG. 22C is a schematic sectional side view of a beam parallelizing unit 800 according to an embodiment of the present invention.

The beam parallelizing unit 800 can be employed as a beam parallelizing apparatus for any ion implantation apparatus. For example, the beam parallelizing unit 800 may be employed as the beam parallelizing mechanism 211 of the ion implantation apparatus 200 or the beam parallelizing unit 704 of the ion implantation apparatus 700 described above.

The beam parallelizing unit 800 includes a lens electrode unit 802 and a vacuum unit 804. The vacuum unit 804 is configured to house the lens electrode unit 802 in a vacuum environment. In FIG. 22B, the lens electrode unit 802 is illustrated by a dashed line to facilitate understanding of the arrangement of the lens electrode unit 802 in the vacuum unit 804.

The lens electrode unit 802 is a main part that provides a parallelizing function in the beam parallelizing unit 800 and includes a plurality of electrode sections for parallelizing an ion beam. The lens electrode unit 802 may include an acceleration lens unit and a deceleration lens unit that is arranged in the downstream of the acceleration lens unit. Alternatively, the deceleration lens unit may be arranged in the upstream of the acceleration lens unit. As explained previously, the acceleration lens unit includes a plurality of acceleration electrode sections that form an acceleration gap, which is curved in a bow shape. The deceleration lens unit includes a plurality of deceleration electrode sections that form a deceleration gap, which is curved in a bow shape.

As described above, an energy setting used for a particular ion implantation process is selected among from a plurality of energy settings according to a given ion implantation condition. A power supply unit (for example, third power supply unit 726) of the ion implantation apparatus operates the lens electrode unit 802 under any one of the plurality of energy settings. The plurality of energy settings includes a first energy setting (low energy mode) suitable for transport of a low energy ion beam, and a second energy setting (high energy mode) suitable for transport of a high energy ion beam. The power supply unit is configured to generate an electric potential difference in at least the acceleration gap under the second energy setting, and generate an electric potential difference in at least the deceleration gap under the first energy setting.

The vacuum unit 804 includes a first vacuum container 806 and a second vacuum container 808, which may be referred to as a first vacuum chamber and a second vacuum chamber, respectively. Also, the vacuum unit 804 includes an insulating container wall 810 connecting the first vacuum container 806 and the second vacuum container 808. The insulating container wall 810 may be referred to as an insulating chamber wall. The first vacuum container 806, the insulating container wall 810, and the second vacuum container 808 are disposed in this order from an upstream side along a beam transport direction 812 illustrated in FIG. 22C. The first vacuum container 806 and the insulating container wall 810 are fixed being adjacent to each other, and the insulating container wall 810 and the second vacuum container 808 are fixed being adjacent to each other.

The insulating container wall 810 is configured such that the first vacuum container 806 and the second vacuum container 808 communicate in an airtight manner. The first vacuum container 806 and the second vacuum container 808 communicate with each other via the insulating container wall 810. A vacuum evacuation system (not shown) is attached to the vacuum unit 804. Therefore, a vacuum environment is provided and maintained inside the vacuum unit 804.

The first vacuum container 806 surrounds at least a portion of the lens electrode unit 802. The insulating container wall 810 surrounds at least a portion of the lens electrode unit 802. More specifically, as illustrated in FIG. 22B and FIG. 22C, a front portion (i.e., a portion on the upstream side) of the lens electrode unit 802 is surrounded by the first vacuum container 806, and a rear portion (i.e., a portion on the downstream side) of the lens electrode unit 802 is surrounded by the insulating container wall 810. In this manner, the lens electrode unit 802 is disposed at a border between the first vacuum container 806 and the insulating container wall 810.

The first vacuum container 806 and the insulating container wall 810 as a whole constitute a parallelizing lens vacuum container for the lens electrode unit 802. The parallelizing lens vacuum container constitutes, for example, a portion of the terminal 216 (see FIG. 5A and FIG. 5B) in the ion implantation apparatus. The second vacuum container 808 may constitute, for example, at least a portion of a vacuum container for housing a beamline component (for example, the energy filter 213) disposed at the downstream of the beam parallelizing unit 800. The second vacuum container 808 may constitute at least a portion of a processing chamber for ion implantation into a workpiece (for example, the implantation processing chamber 106 shown in FIG. 2).

As illustrated in FIG. 22C, the first vacuum container 806 and the second vacuum container 808 include a first conductive container wall 814 and a second conductive container wall 816 that surround a reference trajectory 818 of an ion beam, respectively.

A front portion of the lens electrode unit 802 is surrounded by the first conductive container wall 814. The first conductive container wall 814 and the second conductive container wall 816 may be referred to as the first conductive chamber wall and the second conductive chamber wall.

A first entrance opening 820 and a first exit opening 822 are formed on the first conductive container wall 814. The first conductive container wall 814 has, for example, a box-like structure of a cuboidal shape, or may have a tube-like or hollow structure. The first entrance opening 820 and the first exit opening 822 are respectively formed on one face and the other face of the box-like structure that face each other or formed on one end and the other end of the cylindrical structure. A second entrance opening 824 and a second exit opening 826 are formed on the second conductive container wall 816. The second conductive container wall 816 may have, for example, a box-like structure of a cuboidal shape, or may have a tube-like or hollow structure, in the same way as in the first conductive container wall 814. The second entrance opening 824 and the second exit opening 826 may be respectively formed on one face and the other face of the box-like structure that face each other or formed on one end and the other end of the cylindrical structure. The first conductive container wall 814 and the second conductive container wall 816 are made of, for example, a metal.

The insulating container wall 810 is provided continuously with the first conductive container wall 814 so as to surround the first exit opening 822 and is provided continuously with the second conductive container wall 816 so as to surround the second entrance opening 824. The insulating container wall 810 has a box-like or cylindrical structure having an opening size that is equal to or larger than the size of the first exit opening 822 and/or the second entrance opening 824. The insulating container wall 810 may be an insulating bushing that has such a large opening. In this manner, the insulating container wall 810 connects the first vacuum container 806 to the second vacuum container 808 such that the first conductive container wall 814 is insulated from the second conductive container wall 816.

An ion beam enters the first vacuum container 806 through the first entrance opening 820, enters the insulating container wall 810 through the first exit opening 822, and further enters the second vacuum container 808 through the second entrance opening 824. Then, the ion beam heads toward the downstream of the beamline after passing through the second exit opening 826.

The beam parallelizing unit 800 include at least one insulating member 828 that insulates at least one electrode section among the plurality of electrode sections of the lens electrode unit 802 from at least one of the first conductive container wall 814 and the second conductive container wall 816. The beam parallelizing unit 800 may include a plurality of insulating members 828, and all the electrode sections of the lens electrode unit 802 may be insulated from the first conductive container wall 814 and the second conductive container wall 816 respectively by these insulating members 828. One or more insulating members 828 are housed together with the lens electrode unit 802 in the vacuum environment provided by the vacuum unit 804.

As illustrated in FIG. 22C, the insulating members 828 are provided, for example, between the first conductive container wall 814 and the lens electrode unit 802. Thus, the insulating members 828 insulate at least one electrode section of the lens electrode unit 802 from the first conductive container wall 814. Further, the insulating members 828 provide structural support of the lens electrode unit 802 relative to the first conductive container wall 814. In addition, the lens electrode unit 802 is installed in the first vacuum container 806 such that the lens electrode unit 802 is insulated from the second vacuum container 808 by the insulating container wall 810.

The first vacuum container 806 and the second vacuum container 808 are configured such that the first vacuum container 806 and the second vacuum container 808 respectively have a first electric potential and a second electric potential during the ion implantation process. Since the first vacuum container 806 and the second vacuum container 808 are insulated from each other, the first potential can be set to be different from the second potential. On the other hand, the first potential and the second potential can also be set to be equal to each other. The first vacuum container 806 and the second vacuum container 808 are electrically separated from each other. Thereby, the respective potentials of these two vacuum containers can be freely controlled.

The first vacuum container 806 is configured such that a terminal potential is applied to the first conductive container wall 814 as the first potential. The terminal potential is a reference potential for the lens electrode unit 802. The second vacuum container 808 is configured such that an electric potential that is different from the terminal potential may be applied to the second conductive container wall 816 as the second potential. The second potential may be the same as the potential of the workpiece in the implantation processing chamber.

The second potential may be higher than the first potential (i.e., the terminal potential). Such an electric potential setting may be used in a deceleration mode (for example, a low energy mode) where an ion beam exiting from the beam parallelizing unit 800 is decelerated with respect to an ion beam entering the beam parallelizing unit 800. Conversely, the second potential may be lower than the first potential. Such an electric potential setting may be used in an acceleration mode (for example, a high energy mode) where an ion beam exiting from the beam parallelizing unit 800 is accelerated with respect to an ion beam entering the beam parallelizing unit 800. In a given electric potential setting, the second potential may be set to be equal to the first potential. Such an electric potential setting may be used in a so-called drift mode where an ion beam entering the beam parallelizing unit 800 and an ion beam exiting from the beam parallelizing unit 800 have equal energy.

As described above, at least one electrode section of the lens electrode unit 802 is insulated from each of the first conductive container wall 814 and the second conductive container wall 816. All the electrode sections of the lens electrode unit 802 may be each insulated from the first conductive container wall 814 and the second conductive container wall 816. Therefore, an electric potential that is different from the first potential and the second potential can be individually applied to at least one electrode section (for example, all the electrode sections) of the lens electrode unit 802.

An electric potential that is equal to the first potential (or the second potential) may be applied to at least one electrode section of the lens electrode unit 802. In this case, the electrode section may be electrically connected to the first conductive container wall 814 (or the second conductive container wall 816; this expression is omitted hereinafter in this paragraph). Alternatively, the electrode section and the first conductive container wall 814 may be configured such that the insulation and the conduction between the electrode section and the first conductive container wall 814 are selectable (for example, a switching circuit may be provided that is capable of shunting an insulating unit that connects the electrode section and the first conductive container wall 814 in an insulated manner).

FIG. 23A to FIG. 23D are each a schematic top view of a configuration of a beam parallelizing unit according to an embodiment of the present invention. FIG. 23E is a schematic top view of one exemplary configuration of a beam parallelizing unit. The beam parallelizing units illustrated in FIG. 23A to FIG. 23E differ from the beam parallelizing unit 800 illustrated in FIG. 22B in location and arrangement of a lens electrode unit. In FIG. 23A to FIG. 23E, a lens electrode unit is illustrated by a dashed line in the same way as in FIG. 22B.

Compared to the lens electrode unit 802 illustrated in FIG. 22B, a lens electrode unit 802a illustrated in FIG. 23A is disposed on the downstream side. A front portion of the lens electrode unit 802a is surrounded by the insulating container wall 810, and a rear portion of the lens electrode unit 802a is surrounded by the second vacuum container 808.

Compared to the lens electrode unit 802 illustrated in FIG. 22B, the length of a lens electrode unit 802b illustrated in FIG. 23B is extended in a beam transport direction. A front portion of the lens electrode unit 802b is surrounded by the first vacuum container 806, a middle portion of the lens electrode unit 802b is surrounded by the insulating container wall 810, and a rear portion of the lens electrode unit 802b is surrounded by the second vacuum container 808. In a case where the length of the insulating container wall 810 is shortened in the beam transport direction, a front portion of the lens electrode unit 802b may be surrounded by the first vacuum container 806, a middle portion of the lens electrode unit 802b may be surrounded by the insulating container wall 810, and a rear portion of the lens electrode unit 802b may be surrounded by the second vacuum container 808, in the same way.

Compared to the lens electrode unit 802 illustrated in FIG. 22B, a lens electrode unit 802c illustrated in FIG. 23C is disposed on the upstream side. The entirety of the lens electrode unit 802c is surrounded by the first vacuum container 806. Compared to the lens electrode units 802 and 802a respectively illustrated in FIG. 22B and FIG. 23A, a lens electrode unit 802d illustrated in FIG. 23D is disposed on the downstream side. The entirety of the lens electrode unit 802d is surrounded by the second vacuum container 808.

The lens electrode units 802a to 802d respectively illustrated in FIG. 23A to FIG. 23D include a plurality of lens stages (for example, which may include at least one acceleration lens and at least one deceleration lens). The lens electrode units 802a to 802d are linked to an insulating structure similar to the insulating structure to which the lens electrode unit 802 illustrated in FIG. 22B and FIG. 22C.

On the other hand, the lens electrode unit 802e illustrated in FIG. 23E includes connection units 830 and 831 that electrically connect and mechanically link the lens electrode unit 802e to the vacuum unit 804. A front portion of the lens electrode unit 802e is surrounded by a first vacuum container 806, a middle portion of the lens electrode unit 802e is surrounded by an insulating container wall 810, and a rear portion of the lens electrode unit 802e is surrounded by a second vacuum container 808. The lens electrode unit 802e consists of a single lens stage (i.e., a pair of lens electrodes). A lens electrode on the upstream side is mounted to the first vacuum container 806 by the connection unit 830, and a lens electrode on the downstream side is mounted to the second vacuum container 808 by the connection unit 831. The connection units 830 and 831 on the upstream side and the downstream side are housed in the first vacuum container 806 and the second vacuum container 808, respectively.

In an embodiment, the lens electrode unit 802 may be fixedly installed at a fixed position in the vacuum unit 804. The lens electrode unit 802 may be fixed to the vacuum unit 804, for example, at any position shown in FIG. 22 and FIG. 23A to FIG. 23D.

In an embodiment, the lens electrode unit 802 may be installed movably in the vacuum unit 804. The lens electrode unit 802 may be installed in the vacuum unit 804, for example, such that the lens electrode unit 802 is movable between any positions shown in FIG. 22 and FIG. 23A to FIG. 23D.

The lens electrode unit 802 may be installed in the vacuum unit 804 such that the lens electrode unit 802 is movable between a use position at which a portion of the lens electrode unit 802 is surrounded by the insulating container wall 810 and a retreat position at which the lens electrode unit 802 is entirely housed in the first vacuum container 806, exclusively, or the second vacuum container 808, exclusively. For example, the lens electrode unit 802 may be installed in the vacuum unit 804 such that the lens electrode unit 802 is movable between a use position at which a rear portion of the lens electrode unit 802 is surrounded by the insulating container wall 810 (see FIG. 22B) and a retreat position at which the lens electrode unit 802 is entirely housed in the first vacuum container 806 (see FIG. 23C).

The use position in this case is a position where the lens electrode unit 802 is to be disposed for an ion implantation process. The retreat position is a position where the lens electrode unit 802 can be disposed when the ion implantation process is not being performed (including, for example, when the ion implantation apparatus is under maintenance). The beam parallelizing unit 800 may be configured such that the lens electrode unit 802 is removable from the vacuum unit 804 when the lens electrode unit 802 is in the retreat position. In that case, the retreat position can be also referred to as a removal position.

Figure 24:
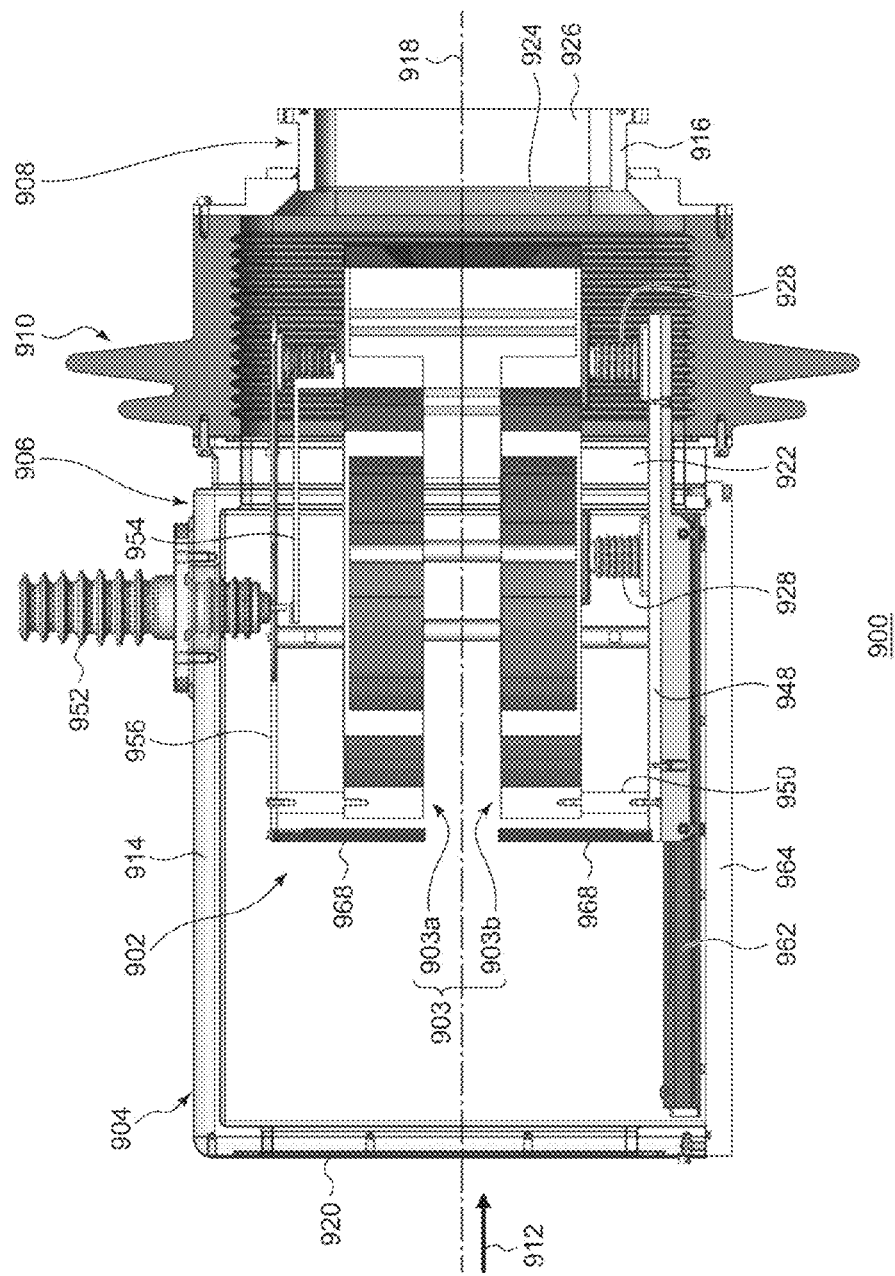
FIG. 24 is a sectional side view of a beam parallelizing unit according to an embodiment of the present invention.
Figure 25:
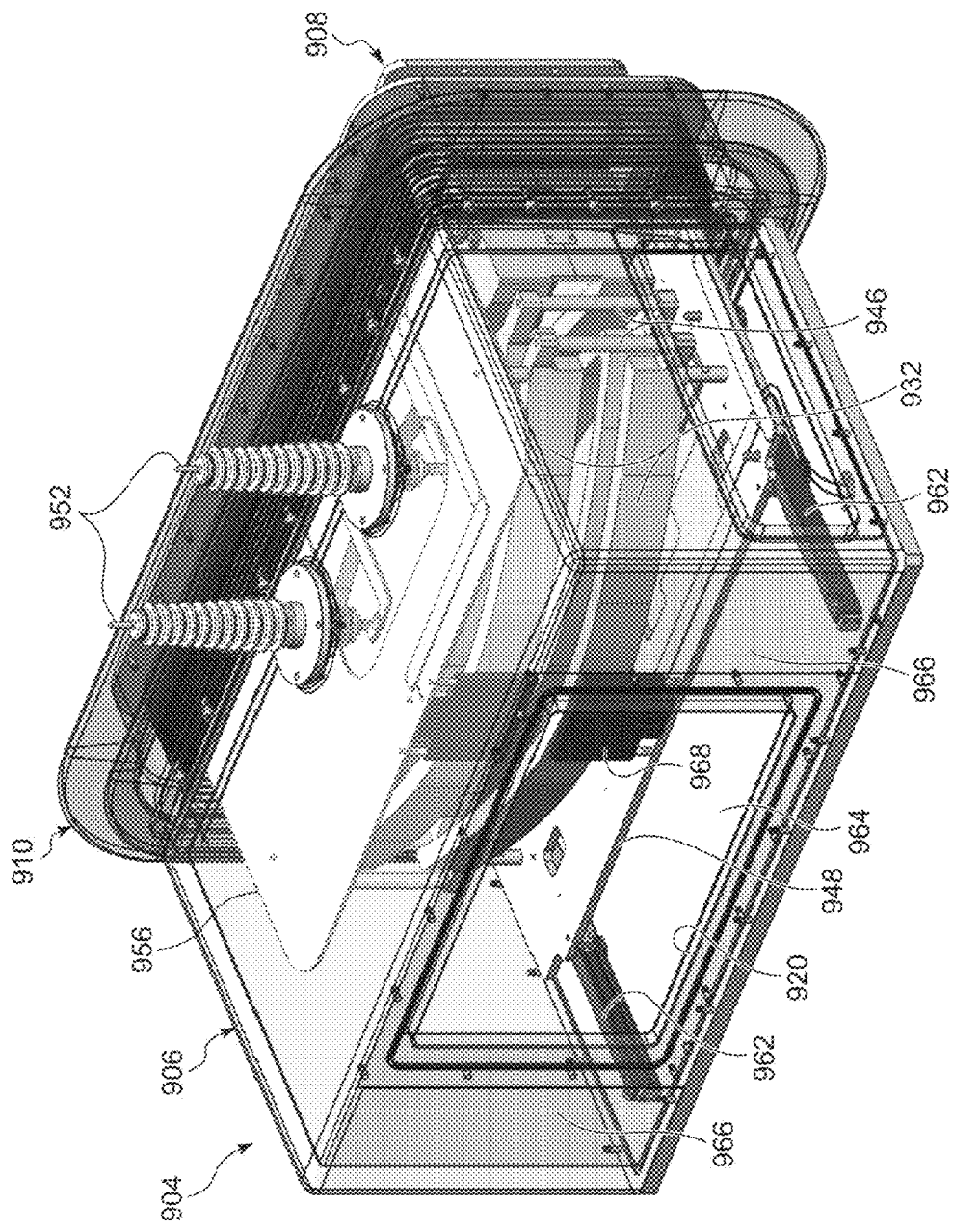
FIG. 25 is a perspective view of a beam parallelizing unit according to an embodiment of the present invention.

FIG. 24 is a sectional side view of a beam parallelizing unit 900 according to an embodiment of the present invention. FIG. 24 illustrates the beam parallelizing unit 900 when a lens electrode unit 902 is at a use position. FIG. 25 is a perspective view of the beam parallelizing unit 900 illustrated in FIG. 24. FIG. 25 illustrates a vacuum unit 904 of the beam parallelizing unit 900 translucently to facilitate the understanding of the internal structure of the beam parallelizing unit 900.

Figure 26:
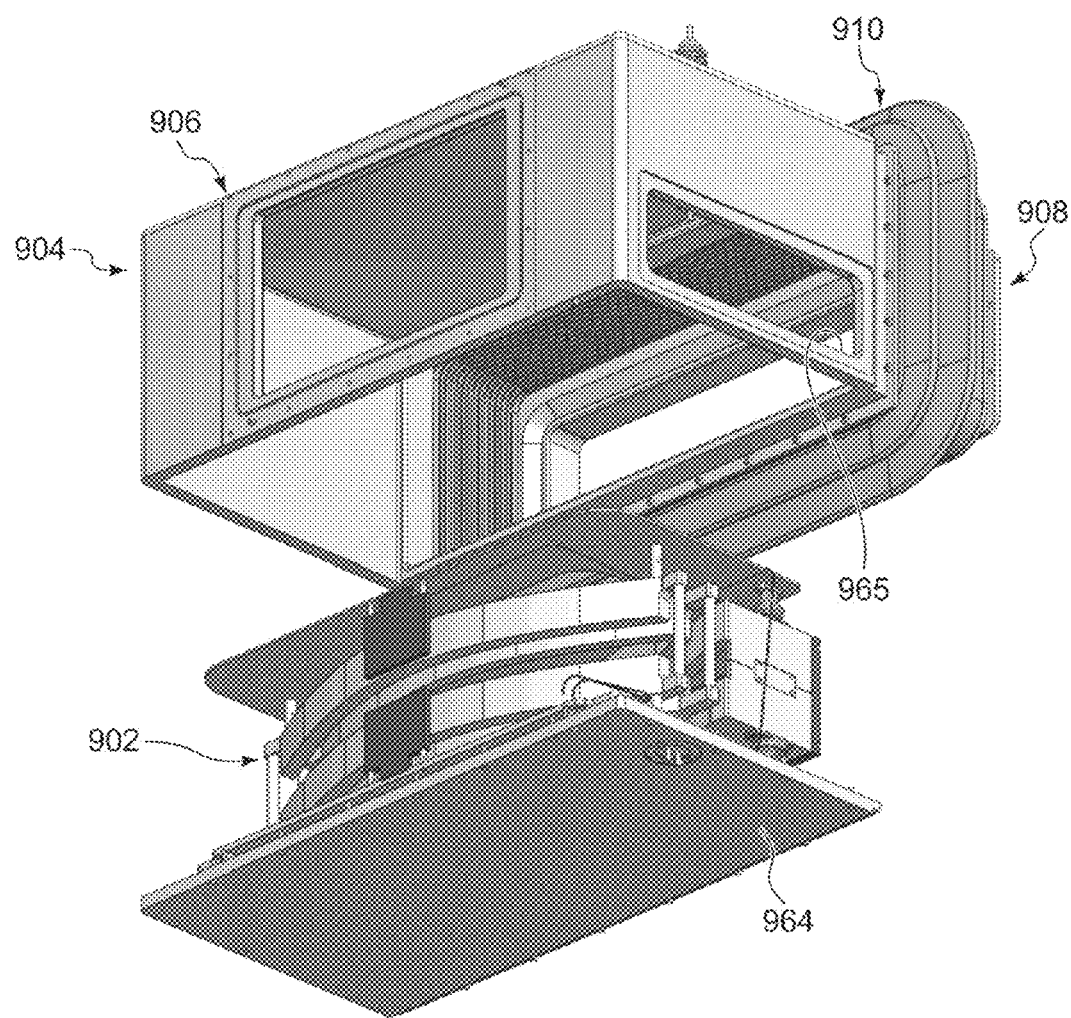
FIG. 26 is a diagram for explaining a task of removing a lens electrode unit of a beam parallelizing unit according to an embodiment of the present invention from a vacuum unit.
Figure 27:
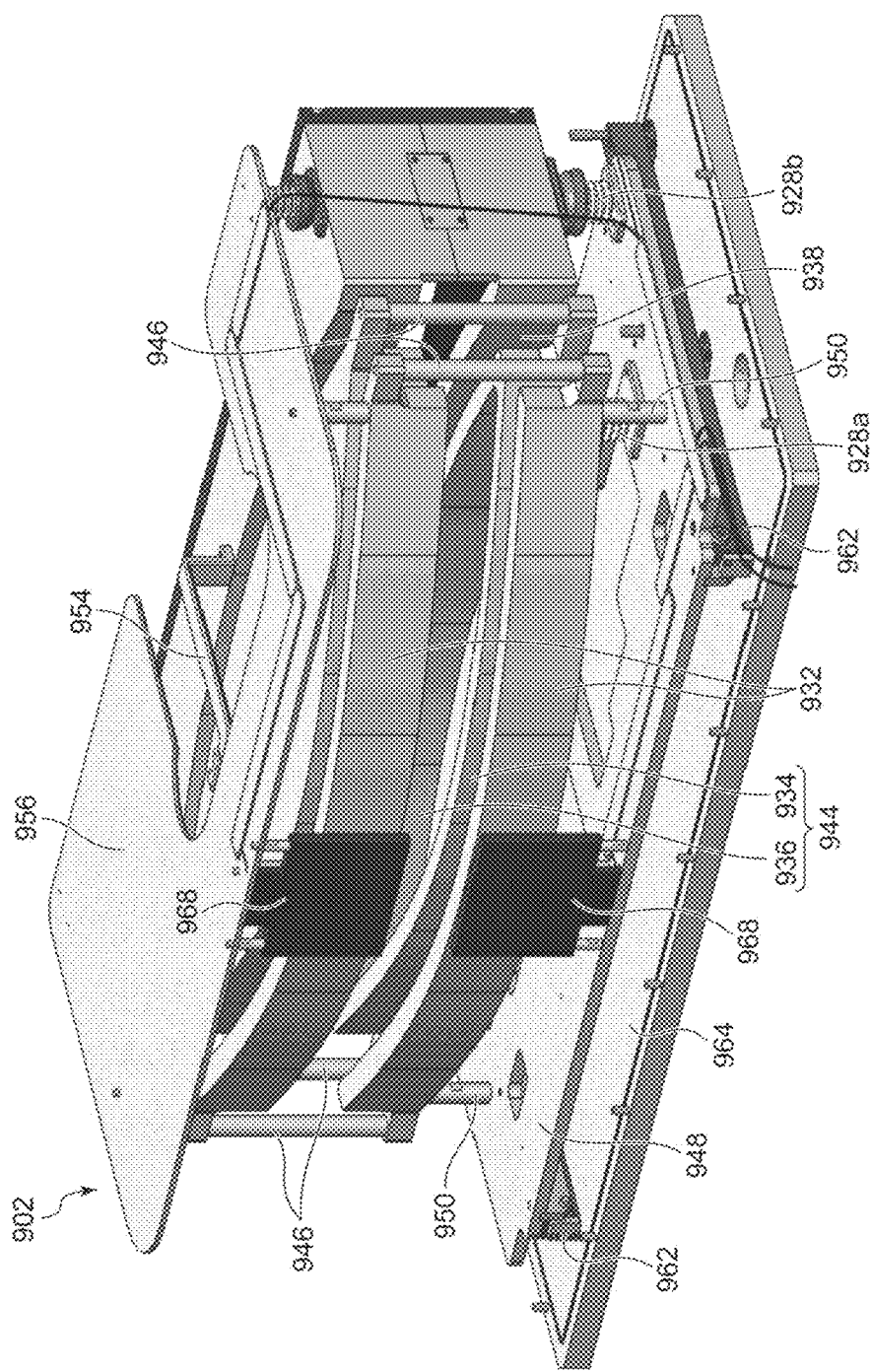
FIG. 27 is a perspective view of a lens electrode unit according to an embodiment of the present invention.
Figure 28A:
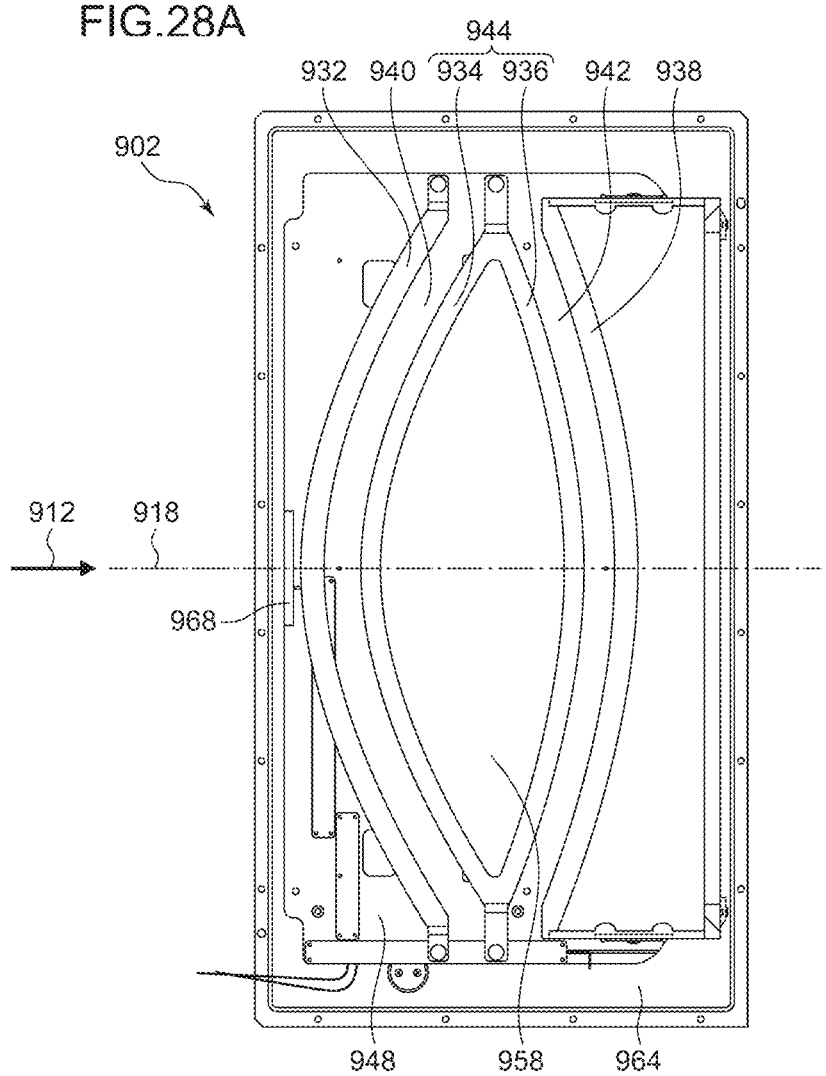
FIG. 28A is a top view illustrating a portion of a lens electrode unit according to an embodiment of the present invention.
Figure 28B:
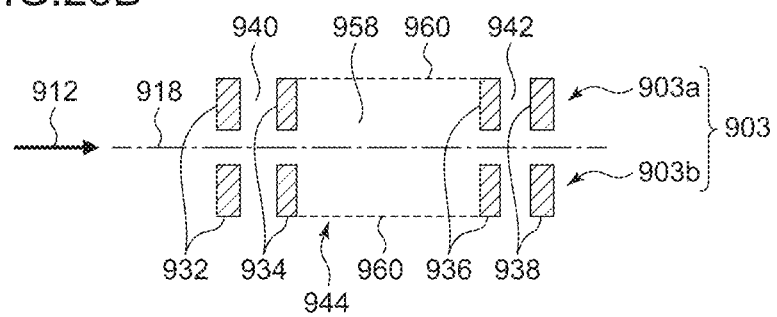
FIG. 28B is a cross-sectional view illustrating the arrangement of electrodes that constitute a lens electrode unit according to an embodiment of the present invention.

FIG. 26 is a diagram for explaining an operation of removing the lens electrode unit 902 of the beam parallelizing unit 900 from the vacuum unit 904. FIG. 27 is a perspective view of the lens electrode unit 902 illustrated in FIG. 26. FIG. 28A is a top view illustrating a portion of the lens electrode unit 902 illustrated in FIG. 26, and FIG. 28B is a cross-sectional view illustrating the arrangement of electrode sections that constitute the lens electrode unit 902.

With respect to the beam parallelizing unit 900, the lens electrode unit 902 is housed in the vacuum unit 904, as illustrated in FIG. 24, in the same way as in the beam parallelizing unit 800 explained in reference to FIG. 22A to FIG. 22C. A front portion of the lens electrode unit 902 is surrounded by a first vacuum container 906, and a rear portion of the lens electrode unit 902 is surrounded by an insulating container wall 910. A first entrance opening 920 and a first exit opening 922 are formed on a first conductive container wall 914 of the first vacuum container 906. A second entrance opening 924 and a second exit opening 926 are formed on a second conductive container wall 916 of the second vacuum container 908. In the following explanation, descriptions relating to points that are similar in the beam parallelizing unit 900 and the beam parallelizing unit 800 are appropriately omitted in order to avoid redundancy.

The lens electrode unit 902 includes a lens electrode array 903 consisting of a plurality of electrode sections for parallelizing an ion beam. In the same way as in the beam parallelizing unit 704 explained in reference to FIG. 15 to FIG. 21, the lens electrode array 903 includes, in order from the upstream side, an acceleration entrance electrode section 932, an acceleration exit electrode section 934, a deceleration entrance electrode section 936, and a deceleration exit electrode section 938 (see FIG. 28A and FIG. 28B).

An acceleration gap 940 curved in a bow shape is formed between the acceleration entrance electrode section 932 and the acceleration exit electrode section 934. A deceleration gap 942 curved in a bow shape is formed between the deceleration entrance electrode section 936 and the deceleration exit electrode section 938. In this manner, the lens electrode unit 902 includes: an acceleration lens unit including the acceleration entrance electrode section 932 and the acceleration exit electrode section 934; and a deceleration lens unit including the deceleration entrance electrode section 936 and the deceleration exit electrode section 938.

The acceleration exit electrode section 934 and the deceleration entrance electrode section 936 integrally form a single electrode member. The acceleration exit electrode section 934 and the deceleration entrance electrode section 936 are electrically connected at respective both ends, and the same potential is applied to these two electrode sections. The single electrode member may be referred to as an intermediate electrode member 944. Thus, the lens electrode array 903 is constituted with an upstream electrode member consisting of the acceleration entrance electrode section 932, the intermediate electrode member 944, and a downstream electrode member consisting of the deceleration exit electrode section 938. The acceleration exit electrode section 934 and the deceleration entrance electrode section 936 may be formed separately.

The lens electrode array 903 is divided into an upper electrode array 903a and a lower electrode array 903b that face each other across a reference trajectory 918 of an ion beam (which may be referred to as an ion beam reference trajectory 918). Therefore, each of the electrode sections that constitute the lens electrode array 903 is divided into an upper electrode and a lower electrode. Each of the upper electrode and the lower electrode is a rod-shaped body that is curved in a bow shape. The cross-sectional shape of the rod-shaped body is, for example, a substantially square shape.

These electrodes can be made by using a small quantity of materials compared to an electrode body that has the shape of a monolithic convex lens or concave lens. As a result, the weight of the lens electrode unit 902 can be reduced, thus helping the improvement of the workability for assembly, maintenance, and the like. Further, these electrodes are also advantageous in terms of the cost.

As illustrated in FIG. 27, an upper electrode and a lower electrode of each of the electrode sections are connected via conductive connection members 946. The conductive connection members 946 are rod-shaped members that are arranged at left and right ends of the respective upper and lower electrodes. The upper electrode is fixed to the upper end of the conductive connection members 946, and the lower electrode is fixed to the lower end of the conductive connection members 946. Therefore, the same potential is applied to the upper electrode and the lower electrode that constitute one electrode section.

A connection unit that connects the upper electrode array 903a and the lower electrode array 903b may be configured such that the relative positions of the upper electrode array 903a and the lower electrode array 903b can be adjusted. In that case, since an upper electrode position can be independently adjusted with respect to a lower electrode position, a vertical distance between the electrode arrays can be set with high accuracy with respect to the ion beam reference trajectory 918.

The lens electrode unit 902 includes a support member 948 that supports, on the first conductive container wall 914, the electrode sections that constitute the lens electrode array 903 in a state where the electrode sections are mounted in an appropriate place. The support member 948 is arranged between the lower electrode array 903b of the lens electrode array 903 and the first conductive container wall 914. The support member 948 is, for example, a rectangular flat plate and is made of, for example, a metal.

The support member 948 is disposed on the lower side of the lens electrode unit 902 and can thus be also referred to as a base plate. However, the arrangement of the support member 948 is not limited thereto. The support member 948 may be arranged between an upper wall or a side wall of the first conductive container wall 914 and the lens electrode array 903 and configured to support the lens electrode array 903 on the upper wall or the side wall of the first conductive container wall 914. The support member 948 may be divided into a plurality of members, each of which supports one or more electrode sections.

A plurality of insulating members 928 are provided between the support member 948 and the lens electrode array 903. At least one of the electrode sections constituting the lens electrode array 903 is mounted to the support member 948 via corresponding insulating members 928. Thereby, the electrode section is insulated from the support member 948.

For example, the intermediate electrode member 944 is mounted to the support member 948 via insulating members 928a. The insulating members 928a are provided at the left and right ends (and/or a center portion) of the intermediate electrode member 944. Similarly, the deceleration exit electrode section 938 is mounted to the support member 948 via insulating members 928b. The insulating members 928b are provided at the left and right ends (and/or a center portion) of the deceleration exit electrode section 938.

The beam parallelizing unit 900 includes vacuum feed-through wirings 952 for supplying electric power to the lens electrode unit 902 from the outside of the first vacuum container 906. The vacuum feed-through wirings 952 are connected to at least one of the electrode sections of the lens electrode array 903 through the first conductive container wall 914. Each of the intermediate electrode member 944 and the deceleration exit electrode section 938 includes a terminal device 954 that is connected to the vacuum feed-through wirings 952.

Therefore, a desired electric potential that can be different from the potential of the support member 948 can be applied to the intermediate electrode member 944 through the vacuum feed-through wirings 952. The same applies to the deceleration exit electrode section 938.

On the other hand, the acceleration entrance electrode section 932 is mounted to the support member 948 via conductive members 950. The conductive members 950 are provided at the left and right ends (and/or a center portion) of the acceleration entrance electrode section 932. Therefore, an electric potential that is the same as that of the first conductive container wall 914 is applied to the acceleration entrance electrode section 932. However, the acceleration entrance electrode section 932 may be also mounted to the support member 948 via insulating members 928. In this case, a desired electric potential that can be different from the potential of the support member 948 may be applied to the acceleration entrance electrode section 932 through an additional vacuum feed-through wiring 952.

The vacuum feed-through wirings 952 are provided at the upper wall of the first conductive container wall 914. However, this is non-limiting. The vacuum feed-through wirings 952 may be provided so as to supply electric power to the lens electrode unit 902 through the side wall or the lower wall of the first conductive container wall 914.

In a case where the lens electrode unit 902 is disposed on the downstream side (for example, just like the embodiment illustrated in FIG. 23A), the beam parallelizing unit 900 may include vacuum feed-through wirings 952 for supplying electric power to the lens electrode unit 902 from the outside of the second vacuum container 908. The vacuum feed-through wirings 952 may be connected to at least one of the electrode sections of the lens electrode array 903 through the second conductive container wall 916.

The lens electrode unit 902 includes an additional member that is disposed symmetrically with the support member 948 with respect to the ion beam reference trajectory 918. This additional member 956 has a shape that is substantially the same as that of the support member 948 and is made of a material that is substantially the same as that of the support member 948. Compared to a case where the additional member 956 is not provided, the additional member 956 reduces distortion in an electric field that is generated by the lens electrode array 903.

The support member 948 is disposed on the lower side of the lens electrode unit 902. Thus, the additional member 956 is disposed on the upper side of the lens electrode unit 902. The additional member 956 is arranged between the lens electrode array 903 and the upper wall of the first conductive container wall 914 and mounted to and supported by the upper electrode array 903a using insulating members 928 and conductive members 950. However, different from the support member 948, the additional member 956 is not mounted to the upper wall of the first conductive container wall 914. The additional member 956 and the upper wall of the first conductive container wall 914 face each other having a gap therebetween.

As illustrated in FIG. 28A and FIG. 28B, a vacant space 958 which is framed in by the intermediate electrode member 944 is formed. The vacant space 958 is provided between the acceleration exit electrode section 934 and the deceleration entrance electrode section 936, and an inner region of the lens electrode unit 902 communicates with an outer region of the lens electrode unit 902 through the vacant space 958. The inner region of the lens electrode unit 902 is an ion beam traveling area between the upper electrode array 903a and the lower electrode array 903b of the lens electrode array 903. The outer region is an area between the first conductive container wall 914 of the vacuum unit 904 and the lens electrode unit 902 (for example, the support member 948 or the additional member 956).

The vacant space 958 is helpful in the improvement of the vacuum conductance in the lens electrode array 903. The vacuum evacuation through the vacant space 958 can facilitate maintaining a desired high vacuum condition in the inner region of the lens electrode unit 902 where the ion beam travels.

The vacant space 958 is open in the vertical direction with respect to the ion beam reference trajectory 918. At the same time, the vacant space 958 is open widely over the inner region of the lens electrode unit 902 along the beam scanning direction (the vertical direction in FIG. 28A) that is perpendicular to the reference trajectory 918. By increasing the opening area in this manner, the vacuum conductance can be further improved.

With an increase of the vacant space 958, the electrode member that surrounds the vacant space 958 becomes thinner in the traveling direction of the beam. Ions traveling away from the original beam trajectory may collide against the electrode member. The adherence of the ions to the electrode member results in the pollution of the electrode member. Also, if an electrode material is sputtered into a beam transport space due to the impact of the collision of the ions, there is concern that the electrode material that has been sputtered reaches and pollutes the wafer. If the electrode member becomes thin, an area where the ions can collide is decreased. Thus, the problem of such pollution of the electrode surfaces and the wafer is reduced.

The lens electrode unit 902 includes a cover unit 960 that covers the vacant space 958 on the side that is away from the inner region of the lens electrode unit 902 in the vacant space 958. The cover unit 960 is configured to allow vacuum evacuation of the inner region to be performed through the vacant space 958. The cover unit 960 is, for example, an expanded metal or a metallic mesh-like member. The cover unit 960 constitutes a portion of the intermediate electrode member 944. By providing such a cover unit 960, influence on the electric fields in the vacant space 958 and the beam transport space that is caused by the electric potential of the first vacuum container 906 can be minimized without sacrificing the improvement of vacuum conductance by the vacant space 958. Similarly, a cover unit may be provided with another electrode. An opening for promoting vacuum evacuation may be also formed at a position corresponding to the vacant space 958 in the support member 948 and/or the additional member 956.

The lens electrode unit 902 is installed in the vacuum unit 904 such that the lens electrode unit 902 is movable between a use position at which a rear portion of the lens electrode unit 902 is surrounded by the insulating container wall 910 and a removal position at which the lens electrode unit 902 is entirely housed in the first vacuum container 906. The first vacuum container 906 includes a guide member 962 that guides the support member 948 between the use position and the removal position and a removable wall 964 that supports the guide member 962. The lens electrode unit 902 is configured such that the lens electrode unit 902 is removable from the first vacuum container 906 integrally with the guide member 962 and the removable wall 964 when the lens electrode unit 902 is located at the removal position.

The guide member 962 includes, for example, at least one (for example, two) rail that extends along a beam transport direction 912. The beam transport direction 912 is a direction from the left toward the right in FIG. 24. This rail is fixed to the removable wall 964. The support member 948 is configured such that the support member 948 is movable along the rail.

When the lens electrode unit 902 is removed from the vacuum unit 904 for maintenance or the like, the lens electrode unit 902 is moved from the use position to the removal position along the guide member 962. At this time, an opening 965 that is formed on the first vacuum container 906 may be opened, and a worker may manually draw the lens electrode unit 902 from the use position to the removal position using this opening 965. Alternatively, the lens electrode unit 902 may be configured such that the lens electrode unit 902 can be self-propelled between the use position and the removal position. FIG. 26 and FIG. 27 illustrate a state where the lens electrode unit 902 is removed from the first vacuum container 906 integrally with the guide member 962 and the removable wall 964.

The removable wall 964 is provided at the lower wall of the first conductive container wall 914. However, this is non-limiting. The removable wall 964 may be provided at the side wall or the upper wall of the first conductive container wall 914.

If the lens electrode unit 902 is disposed on the downstream side (for example, as in the embodiment illustrated in FIG. 23A), the lens electrode unit 902 may be installed in the vacuum unit 904 such that the lens electrode unit 902 is movable between a use position at which a front portion of the lens electrode unit 902 is surrounded by the insulating container wall 910 and a removal position at which the lens electrode unit 902 is entirely housed in the second vacuum container 908. In this case, the guide member 962 and the removable wall 964 may be provided exclusively in the second vacuum container 908, and the lens electrode unit 902 may be configured such that the lens electrode unit 902 is removable from the second vacuum container 908 integrally with the guide member 962 and the removable wall 964.

As illustrated in FIG. 25, the first vacuum container 906 includes a beam dump unit 966 on the ion beam entrance side. The beam dump unit 966 is disposed on one side or both sides of an ion beam reference trajectory in a direction that is parallel to the beam scanning direction. The beam dump unit 966 is, for example, a portion of the first conductive container wall 914 that corresponds to either or both sides of the first entrance opening 920.

The lens electrode unit 902 includes a beam monitor unit 968 for measuring the beam axis and/or the beam spread. The beam monitor unit 968 is arranged on the upstream side of the lens electrode unit 902.

The beam monitor unit 968 is disposed as separate current detectors that are symmetrical with each other in the vertical direction with respect to the ion beam. The beam monitor unit 968 is disposed on the most upstream side of the lens electrode array 903, that is, disposed on the upstream of the acceleration entrance electrode section 932. The upper beam monitor unit 968 is mounted to the additional member 956, and the lower beam monitor unit 968 is mounted to the support member 948. The respective members that are disposed on the upper side and the lower side are made of a material having conductivity, for example, graphite. The members are, for example, rectangular flat plates.

The members that are disposed on the upper side and the lower side are electrically insulated from surrounding constituents and are configured such that charges of ions that collide against the members can be detected as respective currents separately. By adjusting a beam with controlling beam parameters on the upstream side such that a current Iupper that is detected by an upper detector and a current Ilower that is detected by a lower detector become as small as possible and such that the current Iupper and the current Ilower become nearly equal, the beam axis and the beam shape (the beam spread) at the installation position of the beam monitor unit 968 can be properly adjusted. For example, whether the beam is located near the center in the vertical direction, whether the beam is sufficiently focused, and the like can be determined and adjusted.

In a typical configuration of a parallelizing lens, a plurality of lens electrode sections are insulatedly supported on surrounding structures by using insulating bushings each having a large opening and surrounding a corresponding lens electrode. The insulating bushings with the large openings increase the size of the apparatus. According to an embodiment of the present invention, as explained, an acceleration lens unit and a deceleration lens unit constitute a lens electrode unit 902 as a single assembly. Small insulating members 928 are employed for supporting a lens electrode unit 902 in an insulating manner in a vacuum unit 904. Therefore, in an embodiment of the present invention, it is not necessary to provide the plurality of insulating bushings with the large openings, and therefore an advantage can be achieved that a high voltage insulating structure can be made to be compact and hence a beam parallelizing unit and an ion implantation apparatus can be made to be compact as well.

Further, at least one of advantages listed in the following can be achieved according to an embodiment of the present invention.

1. Simple structure and low cost.
2. Reduction of the amount of materials, and reduction of the weight of the materials.
3. Ensuring of high degree of vacuum due to improvement of vacuum conductance.
4. Simple insulating structure for high voltage application and simple countermeasure structure against high voltage electric discharge.
5. Prevention of contamination and pollution caused due to a small ion beam irradiation area of an electrode surface.
6. Improvement of workability in assembly and disassembly of lens electrodes and electrode cover bodies.
7. Facilitation of adjustment of relative positions among electrodes.
8. Prevention of electric field leakage from lens electrodes and electric field distortion by electrode cover bodies.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
   a lens electrode unit that includes a plurality of electrode sections for parallelizing an ion beam; and
   a vacuum unit that houses the lens electrode unit in a vacuum environment,
   wherein the vacuum unit includes:
   a first vacuum container having a first conductive container wall;
   a second vacuum container having a second conductive container wall; and
   an insulating container wall that connects the first vacuum container to the second vacuum container such that the first vacuum container and the second vacuum container communicate with each other and the first conductive container wall is insulated from the second conductive container wall,
   wherein the ion implantation apparatus further comprises an insulating member that insulates at least one electrode section among the plurality of the electrode sections from at least one of the first conductive container wall and the second conductive container wall, and
   wherein the insulating member is housed in the vacuum environment together with the lens electrode unit.

2. The ion implantation apparatus according to claim 1, wherein a portion of the lens electrode unit is surrounded by the insulating container wall.

3. The ion implantation apparatus according to claim 1, wherein a rear portion of the lens electrode unit is surrounded by the insulating container wall, and a front portion of the lens electrode unit is surrounded by the first conductive container wall.

4. The ion implantation apparatus according to claim 1, wherein the first vacuum container is configured such that a terminal potential, which is a reference potential for the lens electrode unit, is applied to the first conductive container wall, and
   wherein the second vacuum container is configured such that an electric potential that is different from the terminal potential is applied to the second conductive container wall.

5. The ion implantation apparatus according to claim 4, wherein the electric potential that is different from the terminal potential is the same as an electric potential of a workpiece in the ion implantation apparatus.

6. The ion implantation apparatus according to claim 1, wherein the insulating member insulates at least one electrode section among the plurality of electrode sections from the first conductive container wall.

7. The ion implantation apparatus according to claim 1, further comprising:
   a vacuum feed-through wiring for supplying electric power to the lens electrode unit from outside of the first vacuum container or the second vacuum container, the vacuum feed-through wiring connected to at least one electrode section of the plurality of electrode sections through the first conductive container wall or the second conductive container wall.

8. The ion implantation apparatus according to claim 1, wherein each of the plurality of electrode sections is divided into an upper electrode and a lower electrode, and the upper electrode and the lower electrode are connected via a conductive member.

9. The ion implantation apparatus according to claim 8, wherein each of the upper electrode and the lower electrode is a rod-shaped body that is curved in a bow shape.

10. The ion implantation apparatus according to claim 9, wherein a cross-sectional shape of the rod-shaped body is a substantially rectangular shape.

11. The ion implantation apparatus according to claim 1, wherein the lens electrode unit is installed in the vacuum unit such that the lens electrode unit is movable between a use position at which a portion of the lens electrode unit is surrounded by the insulating container wall and a removal position at which the lens electrode unit is entirely housed in either one of the first vacuum container or the second vacuum container.

12. The ion implantation apparatus according to claim 11, wherein the lens electrode unit includes a support member that supports the plurality of electrode sections, and wherein the vacuum unit includes a guide member that guides the support member between the use position and the removal position.

13. The ion implantation apparatus according to claim 12, wherein either one of the first vacuum container or the second vacuum container includes a removable wall that supports the guide member; and
wherein the lens electrode unit is configured such that the lens electrode unit is removable integrally with the removable wall from either one of the first vacuum container or the second vacuum container when the lens electrode unit is at the removal position.

14. The ion implantation apparatus according to claim 12, wherein at least one of the plurality of electrode sections is mounted to the support member via the insulating member.

15. The ion implantation apparatus according to claim 12, wherein the lens electrode unit includes a member that is disposed symmetrically to the support member with respect to the ion beam.

16. The ion implantation apparatus according to claim 1, wherein the lens electrode unit includes: an acceleration lens unit that has a plurality of acceleration electrode sections that form an acceleration gap curved in a bow shape; and a deceleration lens unit that is arranged downstream of the acceleration lens unit and that has a plurality of deceleration electrode sections that form a deceleration gap curved in a bow shape.

17. The ion implantation apparatus according to claim 16, wherein an acceleration exit electrode section among the plurality of acceleration electrode sections and a deceleration entrance electrode section among the plurality of deceleration electrode sections are configured to have the same potential, and
wherein a vacant space is provided between the acceleration exit electrode section and the deceleration entrance electrode section, and an inner region of the lens electrode unit, which is a region where the ion beam travels, communicates with an outer region, which is between the vacuum unit and the lens electrode unit, through the vacant space.

18. The ion implantation apparatus according to claim 17, wherein the lens electrode unit includes a cover unit that covers the vacant space on aside that is away from the inner region in the vacant space.

19. The ion implantation apparatus according to claim 18, wherein the cover unit is configured to allow vacuum evacuation of the inner region through the vacant space.

20. The ion implantation apparatus according to claim 16, further comprising:
a power supply unit that operates the lens electrode unit under one of a plurality of energy settings,
wherein the plurality of energy settings include a first energy setting suitable for transport of a low energy ion beam and a second energy setting suitable for transport of a high energy ion beam, and
wherein the power supply unit is configured to generate an electric potential difference in at least the acceleration gap under the second energy setting, and generate an electric potential difference in at least the deceleration gap under the first energy setting.

21. The ion implantation apparatus according to claim 1, comprising:
a beam dump unit on an ion beam entrance side of the first vacuum container,
wherein the beam dump unit is disposed on one side or both sides of an ion beam reference trajectory in a direction that is parallel to a beam scanning direction.

22. The ion implantation apparatus according to claim 1, comprising:
a beam monitor unit that is arranged upstream of the lens electrode unit and that is used for measuring a beam axis and/or a beam spread.

* * * * *